US011581380B2

(12) United States Patent
Bok et al.

(10) Patent No.: US 11,581,380 B2
(45) Date of Patent: Feb. 14, 2023

(54) FOLDABLE DISPLAY DEVICE, ROLLABLE DISPLAY DEVICE, AND DISPLAY DEVICE

(71) Applicant: Samsung Display Co., Ltd., Yongin-si (KR)

(72) Inventors: Seunglyong Bok, Yongin-si (KR); Dongho Lee, Yongin-si (KR); Youngran Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 261 days.

(21) Appl. No.: 17/102,020

(22) Filed: Nov. 23, 2020

(65) Prior Publication Data
US 2021/0367020 A1    Nov. 25, 2021

(30) Foreign Application Priority Data

May 25, 2020 (KR) .......................... 10-2020-0062644

(51) Int. Cl.
*H01L 27/32* (2006.01)
*H01L 25/10* (2006.01)
*H01L 51/52* (2006.01)
*H01L 27/12* (2006.01)

(52) U.S. Cl.
CPC ........ *H01L 27/3262* (2013.01); *H01L 25/105* (2013.01); *H01L 27/3248* (2013.01); *H01L 27/3272* (2013.01); *H01L 51/5218* (2013.01); *H01L 51/5237* (2013.01); *H01L 27/1214* (2013.01); *H01L 2251/5338* (2013.01)

(58) Field of Classification Search
CPC ............. H01L 27/3262; H01L 27/3248; H01L 27/3272; H01L 27/1214; H01L 25/105; H01L 51/5218; H01L 51/5237; H01L 2251/5338
See application file for complete search history.

(56) References Cited

U.S. PATENT DOCUMENTS

| 6,454,414 | B1 | 9/2002 | Ting |
| 7,916,167 | B2 | 3/2011 | Miyagawa et al. |
| 10,423,193 | B2 | 9/2019 | Kim et al. |
| 10,470,538 | B2 | 11/2019 | Kim |
| 10,733,408 | B2 | 8/2020 | Bok |

(Continued)

FOREIGN PATENT DOCUMENTS

| CN | 108666348 A | 10/2018 |
| CN | 109872670 A | 6/2019 |

(Continued)

*Primary Examiner* — Anne M Hines
(74) *Attorney, Agent, or Firm* — Lewis Roca Rothgerber Christie LLP

(57) ABSTRACT

A foldable display device includes a display panel including a front surface and a rear surface opposite the front surface, the front surface including a first component area including a first transmissive portion, a second component area including a second transmissive portion, and a main display area at least partially surrounding the first component area and the second component area, wherein, in a state in which the foldable display device is folded about a first folding axis that crosses the main display area such that two areas of the front surface or two areas of the rear surface face each other, the first component area and the second component area overlap each other on a plane.

26 Claims, 66 Drawing Sheets

(56) References Cited

U.S. PATENT DOCUMENTS

| | | | |
|---|---|---|---|
| 10,733,931 | B2 | 8/2020 | Jung et al. |
| 2017/0230975 | A1 | 8/2017 | Tanaka |
| 2019/0081118 | A1 | 3/2019 | Oh et al. |
| 2019/0130822 | A1 | 5/2019 | Jung et al. |
| 2019/0349550 | A1 | 11/2019 | Bang et al. |
| 2020/0098318 | A1 | 3/2020 | Liu et al. |
| 2022/0107666 | A1* | 4/2022 | Kim .................... H04M 1/0216 |
| 2022/0187871 | A1* | 6/2022 | Yamazaki ................ G09G 5/00 |

FOREIGN PATENT DOCUMENTS

| | | |
|---|---|---|
| KR | 10-2015-0093090 A | 8/2015 |
| KR | 10-1624161 B1 | 5/2016 |
| KR | 10-2017-0113066 A | 10/2017 |
| KR | 10-2018-0033361 A | 4/2018 |
| KR | 10-2018-0130076 A | 12/2018 |
| KR | 10-2019-0130094 A | 11/2019 |

\* cited by examiner

FOLDABLE DISPLAY DEVICE, ROLLABLE DISPLAY DEVICE, AND DISPLAY DEVICE

CROSS-REFERENCE TO RELATED APPLICATION

This application claims priority to and the benefit of Korean Patent Application No. 10-2020-0062644, filed on May 25, 2020, in the Korean Intellectual Property Office (KIPO), the entire disclosure of which is incorporated by reference herein.

BACKGROUND

1. Field

One or more embodiments relate to a foldable display device, a rollable display device, and a display device, and more particularly, to a foldable display device, a rollable display device, and a display device, each of which having an expanded display area to display an image even in an area where a component, which is an electronic element, is arranged.

2. Description of Related Art

Recently, display devices have been used in an increasingly diverse range of applications. In addition, the thickness and weight of the display devices have decreased for certain applications as the range of uses for the display devices has increased.

As display devices are developed for various applications, there may be various methods for designing the shapes of display devices. In addition, as an area occupied by a display area of a display device increases, various functions that are combined or associated with the display device are also being added. To add various functions while increasing an area (e.g., a display area), research into a display device having a component area which performs various functions while displaying an image is in progress.

SUMMARY

Aspects of one or more example embodiments are directed towards a foldable display device, a rollable display device, and a display device, each of which having an expanded display area to display an image even in an area where a component, which is an electronic element, is placed.

Additional aspects will be set forth in portion in the description which follows and, in part, will be apparent from the description, or may be learned by practice of the presented embodiments of the disclosure.

According to one or more embodiments, a foldable display device includes a display panel including a front surface and a rear surface opposite to the front surface, the front surface including a first component area including a first transmissive portion, a second component area including a second transmissive portion, and a main display area at least partially surrounding the first component area and the second component area, wherein, in a state in which the foldable display device is folded about a first folding axis that crosses the main display area such that two areas of the front surface or two areas of the rear surface face each other, the first component area and the second component area overlap each other on a plane.

The display panel may include main sub-pixels arranged in the main display area, and first auxiliary sub-pixels and second auxiliary sub-pixels respectively arranged in the first component area and the second component area.

In the state in which the foldable display device is folded about the first folding axis that crosses the main display area such that two areas of the front surface or two areas of the rear surface face each other, the first auxiliary sub-pixels may overlap the second transmissive portion on a plane, and the second auxiliary sub-pixels may overlap the first transmissive portion on a plane.

The front surface may further include a third component area at least partially surrounded by the main display area, the third component area including a third transmissive portion, wherein, and in a state in which the foldable display device is folded about the first folding axis and a second folding axis that crosses the main display area, the first component area, the second component area, and the third component area may overlap one another on a plane.

The display panel may include main sub-pixels arranged in the main display area, and first auxiliary sub-pixels, second auxiliary sub-pixels, and third auxiliary sub-pixels respectively arranged in the first component area, the second component area, and the third component area, wherein, in the state in which the foldable display device is folded about the first folding axis and the second folding axis, the first auxiliary sub-pixels may overlap the second transmissive portion on a plane, the second auxiliary sub-pixels may overlap the third transmissive portion on a plane, and the third auxiliary sub-pixels may overlap the first transmissive portion on a plane.

The display panel may include main sub-pixels arranged in the main display area, and first auxiliary sub-pixels, second auxiliary sub-pixels, and third auxiliary sub-pixels respectively arranged in the first component area, the second component area, and the third component area, wherein, in the state in which the foldable display device is folded about the first folding axis and the second folding axis, one of the first auxiliary sub-pixels, the second auxiliary sub-pixels, and the third auxiliary sub-pixels may overlap another one of the first auxiliary sub-pixels, the second auxiliary sub-pixels, and the third auxiliary sub-pixels on a plane.

The display panel may further include a lower metal layer, wherein the lower metal layer may include a first lower hole that defines the first transmissive portion, a second lower hole that defines the second transmissive portion, and a third lower hole that defines the third transmissive portion, and wherein one of the first lower hole, the second lower hole, and the third lower hole may be different in size from another one of the first lower hole, the second lower hole, and the third lower hole.

The foldable display device may be folded about one of the first folding axis and the second folding axis such that two areas of the front surface face each other, and may be folded about the other one of the first folding axis and the second folding axis such that two areas of the rear surface face each other.

A main display element implementing one of the main sub-pixels may include a first pixel electrode, wherein an auxiliary display element implementing one of the second auxiliary sub-pixels may include a transparent pixel electrode, wherein the first pixel electrode may be greater in thickness than the transparent pixel electrode, and wherein the first pixel electrode may include a reflective layer.

The foldable display device may further include a dummy pixel circuit connected to an auxiliary display element to implement one of the second auxiliary sub-pixels, the dummy pixel circuit including a dummy thin-film transistor, and a transparent wiring line connecting the auxiliary display element to the dummy thin-film transistor, wherein the dummy thin-film transistor may be spaced from the second component area.

The display panel may include a substrate and a display layer arranged on a first surface of the substrate, and wherein the foldable display device may further include a component arranged on a second surface opposite to the first surface of the substrate.

The substrate may include a through hole overlapping the first component area.

The display panel may further include a panel protection member arranged on the second surface of the substrate, and wherein the foldable display device may further include a lower package arranged under the panel protection member, wherein the component may be attached to the lower package.

The component may be attached to the display panel.

According to one or more embodiments, a foldable display device includes a display panel including a component area including a first transmissive portion, a main display area at least partially surrounding the component area, and a transparent display area in which a second transmissive portion is arranged, the transparent display area being connected to the main display area, wherein, in a state in which the foldable display device is folded, the transparent display area overlaps the component area and the main display area on a plane.

The display panel may include first auxiliary sub-pixels arranged in the component area, and transparent auxiliary sub-pixels arranged in the transparent display area, wherein the first auxiliary sub-pixels in the component area may include a first pixel arrangement structure, wherein the transparent auxiliary sub-pixels in the transparent display area may have a second pixel arrangement structure, and wherein the first pixel arrangement structure may be different from the second pixel arrangement structure.

In the state in which the foldable display device is folded, the first auxiliary sub-pixels may overlap the second transmissive portion on a plane, and the transparent auxiliary sub-pixels may overlap the first transmissive portion on a plane.

According to one or more embodiments, a rollable display device includes a display panel including a component area including a transmissive portion and a main display area at least partially surrounding the component area, a roller to roll the display panel, and a component overlapping the component area, wherein a position where the component overlaps the component area on a plane changes in accordance with unrolling the display panel.

The rollable display device may further include a module portion under the display panel, the module portion supporting the display panel, wherein the component may be arranged in the module portion.

The rollable display device may further include a housing portion accommodating the roller, and an interval adjuster between the module portion and the housing portion, the interval adjuster being configured to adjust an interval between the module portion and the housing portion.

The component area may extend in a first direction in which the display panel is to be unrolled and a second direction perpendicular to the first direction, and wherein the component area in the first direction may be greater in length than the component area in the second direction.

According to one or more embodiments, a display device includes a first display panel including a first component area including a first transmissive portion and a first main display area at least partially surrounding the first component area, a second display panel arranged on a rear surface of the first display panel and being movable relative to the first display pane, the second display panel including a second component area including a second transmissive portion, a component overlapping the second component area, a first state in which the first component area and the second component area overlap each other on a plane, and a second state in which the first component area and the second component area are spaced from each other on a plane.

The first display panel may include first auxiliary sub-pixels arranged in the first component area, and wherein the second display panel may include second auxiliary sub-pixels arranged in the second component area.

In the first state, the first auxiliary sub-pixels may overlap the second transmissive portion on a plane, and the second auxiliary sub-pixels may overlap the first transmissive portion on a plane.

In the first state, the first auxiliary sub-pixels may overlap the second auxiliary sub-pixels on a plane.

The first display panel may include a first lower metal layer including a first lower hole defining the first transmissive portion, wherein the second display panel may include a second lower metal layer including a second lower hole defining the second transmissive portion, wherein the first lower hole may be less in size than the second lower hole.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
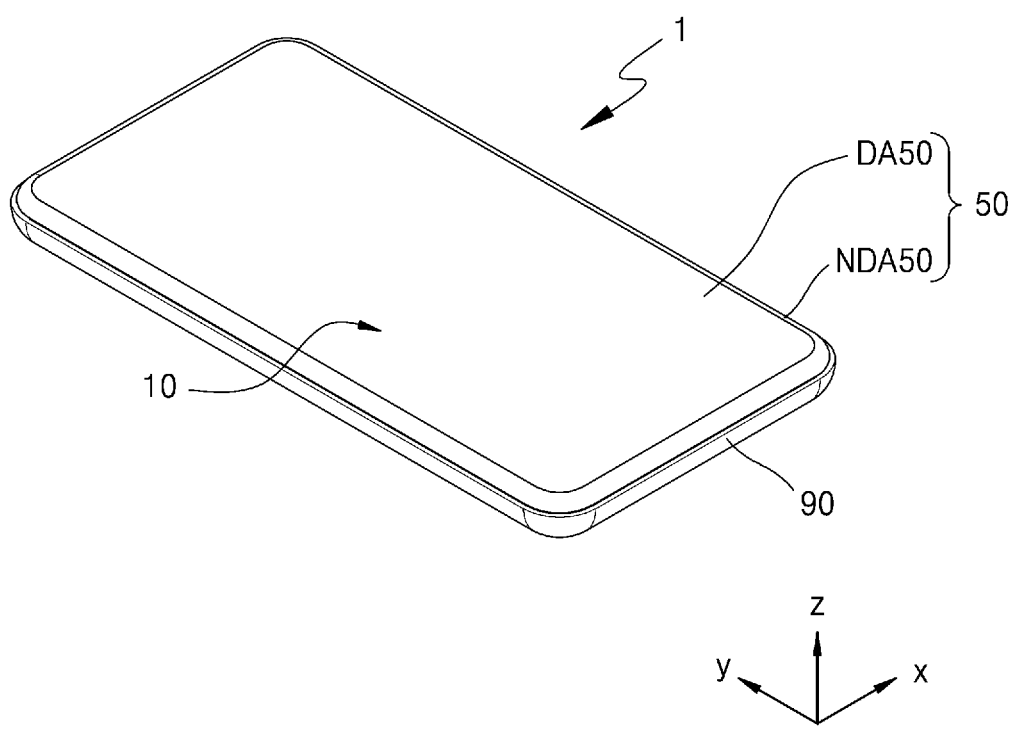
FIG. 1 is a perspective view illustrating a display device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

Further, the use of "may" when describing embodiments of the present disclosure refers to "one or more embodiments of the present disclosure".

Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

As the present disclosure allows for various changes and numerous embodiments, particular embodiments will be illustrated in the drawings and described in more detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The example embodiments will be described below in more detail with reference to the accompanying drawings. Those components that are the same or are in correspondence are rendered the same reference numeral regardless of the figure number, and redundant explanations are omitted.

It will be understood that when a layer, region, or component is referred to as being "formed on," another layer, region, or component, it may be directly or indirectly formed on the other layer, region, or component. That is, for example, intervening layers, regions, or components may be present. Sizes of components in the drawings may be exaggerated for convenience of explanation. In other words, because sizes and thicknesses of components in the drawings are arbitrarily illustrated for convenience of explanation, the following embodiments are not limited thereto.

The x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another. As used herein, components overlapping one another "on a plane" denotes that the components at least partially overlap one another in the z direction.

Display devices display video or still images and may be used as display screens of various products such as televisions, laptops, monitors, billboards, and Internet of Things (IoT), as well as portable electronic devices such as mobile phones, smart phones, tablet personal computers (PCs), mobile communication terminals, electronic notebooks, e-books, portable multimedia players (PMPs), navigation systems, and ultra mobile PCs (UMPCs). In addition, a display device according to an embodiment may be used in a wearable device such as a smart watch, a watch phone, a glasses type display, or a head mounted display (HMD). In addition, the display device according to an embodiment may be used as a dashboard of a vehicle, a center information display (CID) arranged on a center fascia or dashboard of a vehicle, a room mirror display replacing a side mirror of a vehicle, entertainment for a back seat of a vehicle, and a display placed on the back of a front seat of a vehicle.

Figure 2:
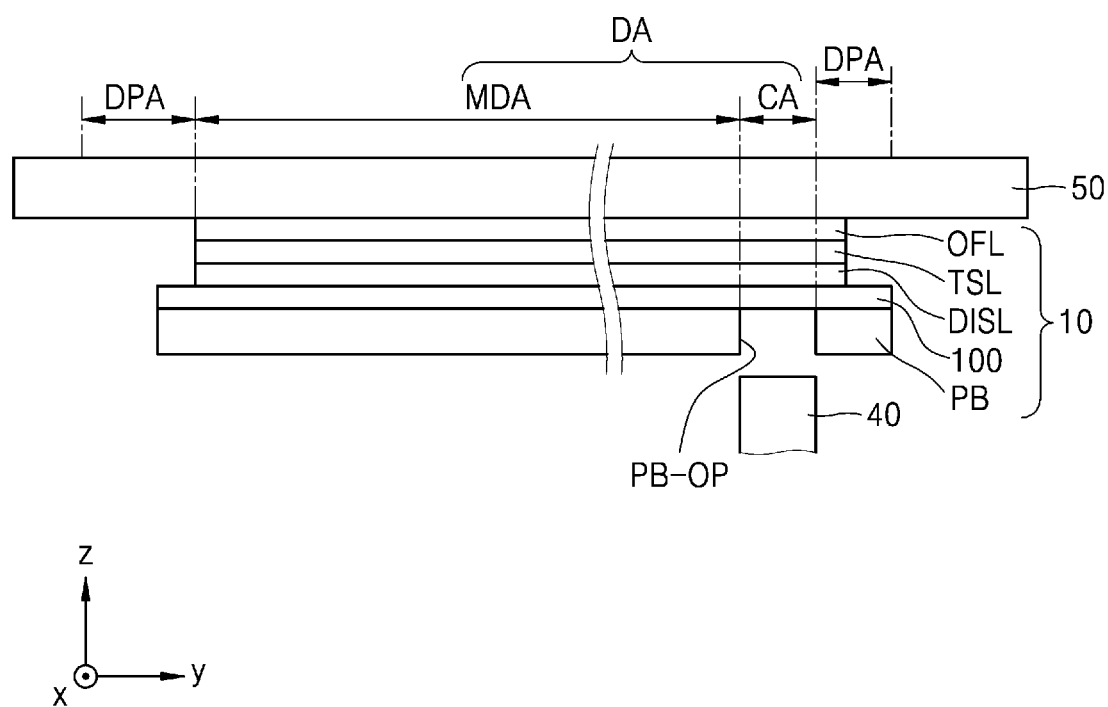
FIG. 2 is a schematic cross-sectional view illustrating a portion of a display device according to an embodiment.
Figure 3:
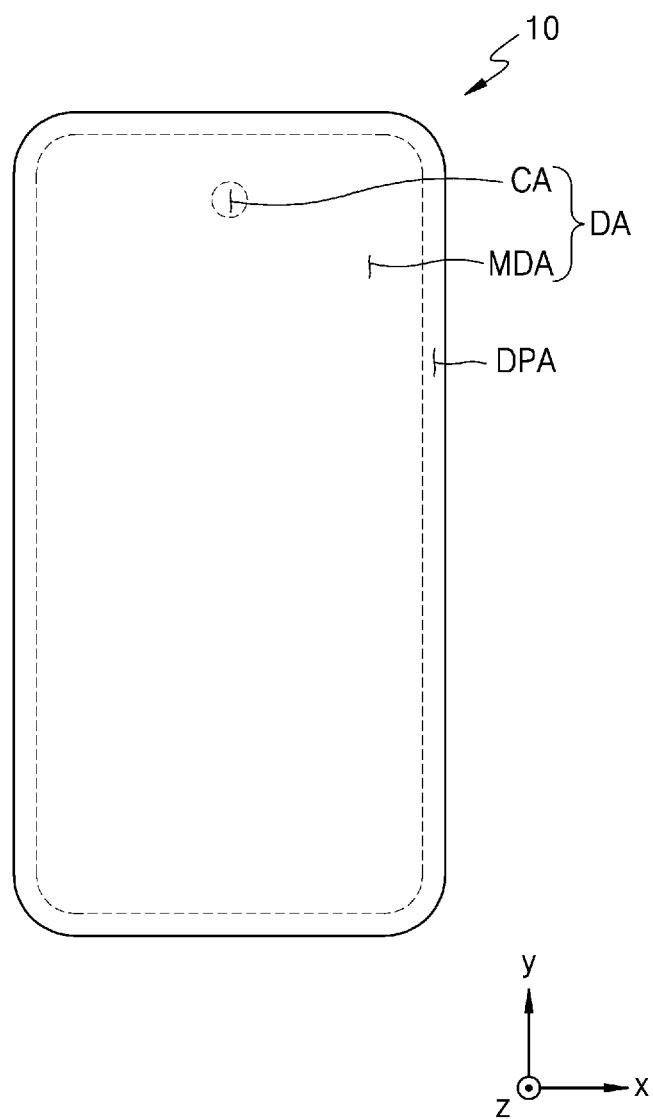
FIG. 3 is a schematic plan view illustrating a display panel according to an embodiment.

FIG. 1 is a perspective view illustrating a display device 1 according to an embodiment. FIG. 2 is a schematic cross-sectional view illustrating a portion of a display device according to an embodiment. FIG. 3 is a schematic plan view illustrating a display panel 10 according to an embodiment. As shown in FIG. 1, for convenience of description, the display device 1 according to the embodiment may be used as a smart phone. However, the present disclosure is not limited thereto, and in other embodiments, the display device 1 may be used as any suitable device.

Referring to FIGS. 1 and 2, the display device 1 may include a cover window 50, a display panel 10, a component 40, and a lower cover 90.

The display device 1 may have a rectangular shape on a plane or in a plan view. For example, the display device 1 may have a rectangular plane shape having short sides in a first direction (e.g., an x direction or a −x direction) and long sides in a second direction (e.g., a y direction) perpendicular or normal to the first direction, as shown in FIG. 1. Corners where the short sides in the first direction (e.g., the x direction) meet the long sides in the second direction (e.g., the y direction) may be round to have a certain curvature or be formed at a right angle. The planar shape of the display device 1 is not limited to a rectangle. For example, the planar shape of the display device may be any suitable shape such as an oval shape, an irregular shape, or another polygonal shape.

The cover window 50 may be arranged on the display panel 10 to cover the upper surface of the display panel 10. Thus, the cover window 50 may protect the upper surface of the display panel 10.

The cover window 50 may include a transmissive cover portion DA50 corresponding to the display panel 10 and a light-blocking cover portion NDA50 corresponding to an area other than the display panel 10. The light-blocking cover portion NDA50 may include an opaque material that blocks light. The light-blocking cover portion NDA50 may include a pattern that may be displayed to a user when an image is not displayed.

In an embodiment, the cover window 50 may be a flexible window. The cover window 50 may protect the display panel 10 while bending (e.g., easily bending) according to an external force without generating cracks or the like. The cover window 50 may include glass, sapphire, or plastic. The cover window 50 may include, for example, ultra thin glass (UTG) or colorless polyimide (CPI). In an embodiment, the cover window 50 may have a structure in which a flexible polymer layer is arranged on one surface of a glass substrate, or may be composed of only a polymer layer.

The display panel 10 may be arranged under the cover window 50. The display panel 10 may overlap the transmissive cover portion DA50 of the cover window 50.

The lower cover 90 may form a lower surface exterior of the display device 1. The lower cover 90 may include plastic, metal, or both plastic and metal.

Referring to FIGS. 2 and 3, the display panel 10 may include a main display area MDA and a component area CA. Both the main display area MDA and the component area CA are areas where an image is displayed, and the component area CA may be an area where a component 40 such as a sensor or camera that uses visible light, infrared rays, sound, or the like is arranged. In an embodiment, the component area CA may be an area having a higher light transmittance and/or acoustic transmittance than the main display area MDA. In an embodiment, when light is transmitted through the component area CA, the light transmittance may be 25% or more, 30% or more, 50% or more, 75% or more, 80% or more, 85% or more, or 90% or more.

The display panel 10 may be a light-emitting display panel including a light-emitting element. For example, the display panel 10 may be an organic light-emitting display panel using an organic light-emitting diode including an organic emission layer, a micro light-emitting diode display panel using a micro light-emitting diode (micro LED), a quantum dot light-emitting display panel using a quantum dot light-emitting diode including a quantum dot emission layer, or an inorganic light-emitting display panel using an inorganic light-emitting element including an inorganic semiconductor.

The display panel 10 may be a rigid display panel that is rigid and may not be easily bent, or be a flexible display panel that is flexible and may be easily bent, folded, or rolled. For example, the display panel 10 may be a foldable display panel that may be folded and unfolded, a curved display panel with a curved display surface, a bended display panel with a bent area other than a display surface, a rollable display panel that may be rolled and unrolled, or a stretchable display panel that may be stretched.

In an embodiment, the display panel 10 may be a transparent display panel that is implemented to be transparent and allows an object or background arranged on or at a side of the lower surface of the display panel 10 to be viewed from the upper surface (e.g., the display area DA) of the display panel 10. Alternatively, at least a portion of the display panel 10 may be a transparent display panel. For example, a portion of the display panel 10 may be a transparent display panel, and the remaining portion of the display panel 10 may not be a transparent display panel. Alternatively, the display panel 10 may be a reflective display panel capable of reflecting light from an object or a background on or at a side of the upper surface of the display panel 10.

The display panel 10 may include a substrate 100, a display layer DISL, a touch screen layer TSL, an optical functional layer OFL, and a panel protection member PB.

The substrate 100 may include an insulating material such as glass, quartz, or polymer resin. The substrate 100 may be a rigid substrate, or a flexible substrate that is bendable, foldable, or rollable. For example, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layer structure including a layer including the above-mentioned polymer resin and an inorganic layer. For example, the substrate 100 may include two layers including the above-mentioned polymer resin and an inorganic barrier layer therebetween.

The display layer DISL may be arranged on the substrate 100. The display layer DISL may include pixels and may be a layer displaying an image. The display layer DISL may include a circuit layer including thin-film transistors, a display element layer in which display elements are arranged, and a sealing member for sealing the display element layer.

The display layer DISL may be divided into a display area DA and a peripheral area DPA. The display area DA may be an area in which pixels are arranged to display an image. The peripheral area DPA may be an area that is arranged outside the display area DA and does not display an image. The peripheral area DPA may be arranged to surround or at least partially surround the display area DA. The peripheral area DPA may be an area from the outside of the display area DA to the edge of the display panel 10. In the display area DA, not only pixels, but also pixel circuits driving the pixels and scan wiring lines, data wiring lines, and power wiring lines connected to the pixel circuits may be arranged. A scan driver for applying a scan signal to the scan wiring lines, and fan-out wiring lines connecting the data wiring lines to a display driver may be arranged in the peripheral area DPA.

The touch screen layer TSL may be arranged on the display layer DISL. The touch screen layer TSL may include touch electrodes and may be a layer for detecting whether a user touches a portion of the cover window 50 in the display area DA or whether the user is not touching the portion of the cover window 50 in the display area DA.

The touch screen layer TSL may be directly formed on the sealing member of the display layer DISL. Alternatively, the touch screen layer TSL may be separately formed and then coupled onto the sealing member of the display layer DISL through an adhesive layer such as an optically clear adhesive (OCA).

The optical functional layer OFL may be arranged on the touch screen layer TSL. The optical functional layer OFL may include an anti-reflection layer. The anti-reflection layer may reduce the reflectance of light (e.g., external light) incident on the anti-reflection layer from outside the display device 1.

In some embodiments, the anti-reflection layer may include a polarizing film. The polarizing film may include a phase delay film such as a linear polarizing plate and a quarter-wave ($\lambda/4$) plate. The phase delay film may be arranged on the touch screen layer TSL, and the linear polarizing plate may be arranged on the phase delay film.

In some embodiments, the anti-reflection layer may include a filter layer including a black matrix and color filters. The color filters may be arranged by considering the color of light emitted from each of the pixels of the display device 1. For example, the filter layer may include a red, green, or blue color filter corresponding to a pixel for emitting red, green, or blue light respectively.

In some embodiments, the anti-reflection layer may include an offset interference structure. The offset interference structure may include a first reflective layer and a second reflective layer, which are arranged on different layers. First reflected light and second reflected light respectively reflected by the first reflective layer and the second reflective layer may interfere with each other, and thus external light reflectance may be reduced.

The cover window 50 may be arranged on the optical functional layer OFL. The cover window 50 may be attached on the optical functional layer OFL by a transparent adhesive member such as an OCA film.

The panel protection member PB may be arranged under the substrate 100. The panel protection member PB may be attached to the lower surface of the substrate 100 through an adhesive member. The adhesive member may be a pressure sensitive adhesive (PSA). The panel protection member PB may include at least one of a light-absorbing layer for absorbing light incident from the outside, a cushion layer for absorbing shock from the outside, or a heat dissipation layer for efficiently dissipating heat of the display panel 10.

In an embodiment, the panel protection member PB may have an opening PB_OP corresponding to the component area CA (area where the component 40 is arranged). The opening PB_OP is provided in the panel protection member PB to improve the light transmittance of the component area CA.

The area of the component area CA may be larger than an area where the component 40 is arranged. Accordingly, the area of the opening PB_OP provided in the panel protection member PB may not match the area of the component area CA. The component 40 may be arranged to overlap (e.g., overlap in the z-direction) the opening PB_OP. In an embodiment, the component 40 may be arranged to be inserted into the opening PB_OP.

The display area DA of the display panel 10 may include the component area CA (e.g., component area CA under which the component 40 is arranged) and the main display area MDA. In an embodiment, the component area CA may be arranged inside the display area DA and may be surrounded or at least partially surrounded by the main display area MDA. Also, the component area CA may have a circular shape, or a plurality of component areas CA may be provided. In an embodiment, the component area CA may be arranged in various suitable shapes. For example, the component area CA may have a polygonal shape such as a triangle or a quadrangle, or may have a circular, semicircular, or semi-elliptical shape.

Although FIG. 3 illustrates that the component area CA is arranged in the center of an upper portion of the display area DA, the component area CA may be variously arranged in the display area DA in a suitable manner. For example, the component area CA may be arranged in the center of the display area DA. Alternatively, the component area CA may be spaced from the center of the display area DA in the first direction (e.g., the x direction or the −x direction) and/or the second direction (e.g., the y direction or the −y direction). In another embodiment, the component area CA may also be arranged as a bar or notch-type. In other words, the component area CA may be a bar or a notch shape area.

The component 40 overlapping the component area CA of the display panel 10 may be an electronic element using light or sound. For example, the electronic element may be a sensor that measures a distance, such as a proximity sensor, a sensor that recognizes a portion (e.g., fingerprint, iris, face, etc.) of a user's body, a small lamp that outputs light, or an image sensor (e.g., a camera) that captures images. An electronic element using light may use light of various wavelength bands, such as visible light, infrared light, and ultraviolet light. An electronic element using sound may use ultrasound or sound in other frequency bands.

In some embodiments, the component 40 may include sub-components such as a light-emitting portion and a light-receiving portion. The light-emitting portion and the light-receiving portion may be in an integrated structure (i.e., integral with each other). Alternatively, a light-emitting portion and a light-receiving portion, which are physically separated from each other (i.e., spaced from each other) and are paired, may form one component 40.

FIGS. 4A-4E are schematic cross-sectional views illustrating a portion of a display device 1 according to an embodiment.

Referring to FIGS. 4A-4E, the display device 1 may include a display panel 10 and a component 40 overlapping (e.g., overlapping in the z-direction) the display panel 10. The display panel 10 may include a component area CA, which is an area overlapping the component 40, and a main display area MDA in which a main image is displayed.

The display panel 10 may include a substrate 100, a display layer DISL, a touch screen layer TSL, and an optical functional layer OFL, which are on the substrate 100, and a panel protection member PB arranged under the substrate 100 (e.g., the panel protection member PB may be on a lower surface of the substrate 100). The display layer DISL may include a circuit layer PCL including thin-film transistors TFT and TFT', a display element layer EDL including light-emitting elements ED and ED' as display elements, and a sealing member ENCM such as a thin-film encapsulation layer TFEL or a sealing substrate ENS. An insulating layer IL' may be arranged between the substrate 100 and the display layer DISL, and an insulating layer IL may be arranged in the display layer DISL.

As described above, the substrate 100 may include an insulating material such as glass, quartz, or polymer resin. The substrate 100 may be a rigid substrate, or a flexible substrate that is bendable, foldable, or rollable.

A main thin-film transistor TFT and a main light-emitting element ED connected thereto may be arranged in the main display area MDA of the display panel 10 to implement a main sub-pixel Pm, and an auxiliary thin-film transistor TFT' and an auxiliary light-emitting element ED' connected thereto may be arranged in the component area CA to implement an auxiliary sub-pixel Pa.

Also, a transmissive portion TA in which a display element is not arranged may be arranged in the component area CA as shown in FIGS. 4A-4E. The transmissive portion TA may be an area in which light and/or a signal is transmitted from or towards the component 40. For example, the light and/or the signal may be emitted from the component 40 arranged corresponding to the component area CA and/or the light and/or the signal may be incident on the component 40. The transmissive portion TA may be an area in which light transmittance is high because no display element is arranged therein.

A lower metal layer BML may be arranged in the component area CA. The lower metal layer BML may be arranged to correspond to a lower portion of the auxiliary thin-film transistor TFT'. For example, the lower metal layer BML may be arranged between the auxiliary thin-film transistor TFT' and the substrate 100. In some embodiments, the lower metal layer BML may overlap (e.g., overlap in the z-direction or the thickness direction) the lower portion of the auxiliary thin-film transistor TFT'. The lower metal layer BML may block or substantially block external light from reaching the auxiliary thin-film transistor TFT'. In some embodiments, a constant voltage or a signal may be applied to the lower metal layer BML, thereby preventing or reducing damage to a pixel circuit due to electrostatic discharge. One lower metal layer BML having a transmission hole corresponding to the transmissive portion TA may be located in the component area CA as shown in FIGS. 4A-4E. However, the present disclose is not limited thereto. For example, a plurality of lower metal layers BML may be arranged in the component area CA, and in some cases, different voltages may be applied to the plurality of lower metal layers BML.

Figure 4A:
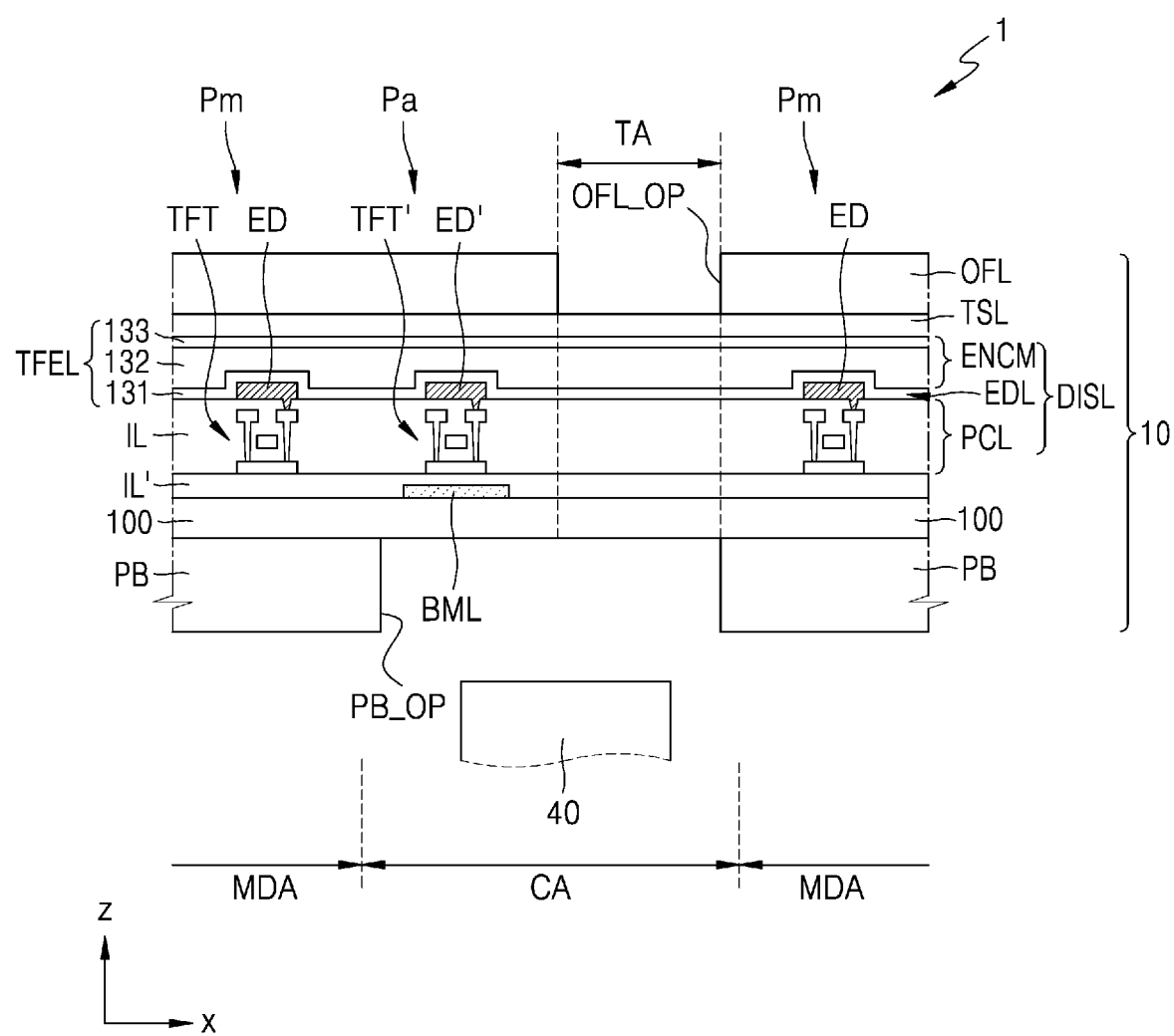
FIGS. 4A-4E are schematic cross-sectional views illustrating a portion of a display device according to an embodiment.

The display element layer EDL may be covered with the thin-film encapsulation layer TFEL, or may be covered with the sealing substrate ENS. In some embodiments, the thin-film encapsulation layer TFEL may include at least one inorganic encapsulation layer and at least one organic encapsulation layer, as shown in FIG. 4A. In an embodiment, the thin-film encapsulation layer TFEL may include a first inorganic encapsulation layer 131, a second inorganic encapsulation layer 133, and an organic encapsulation layer 132 therebetween.

Figure 4B:
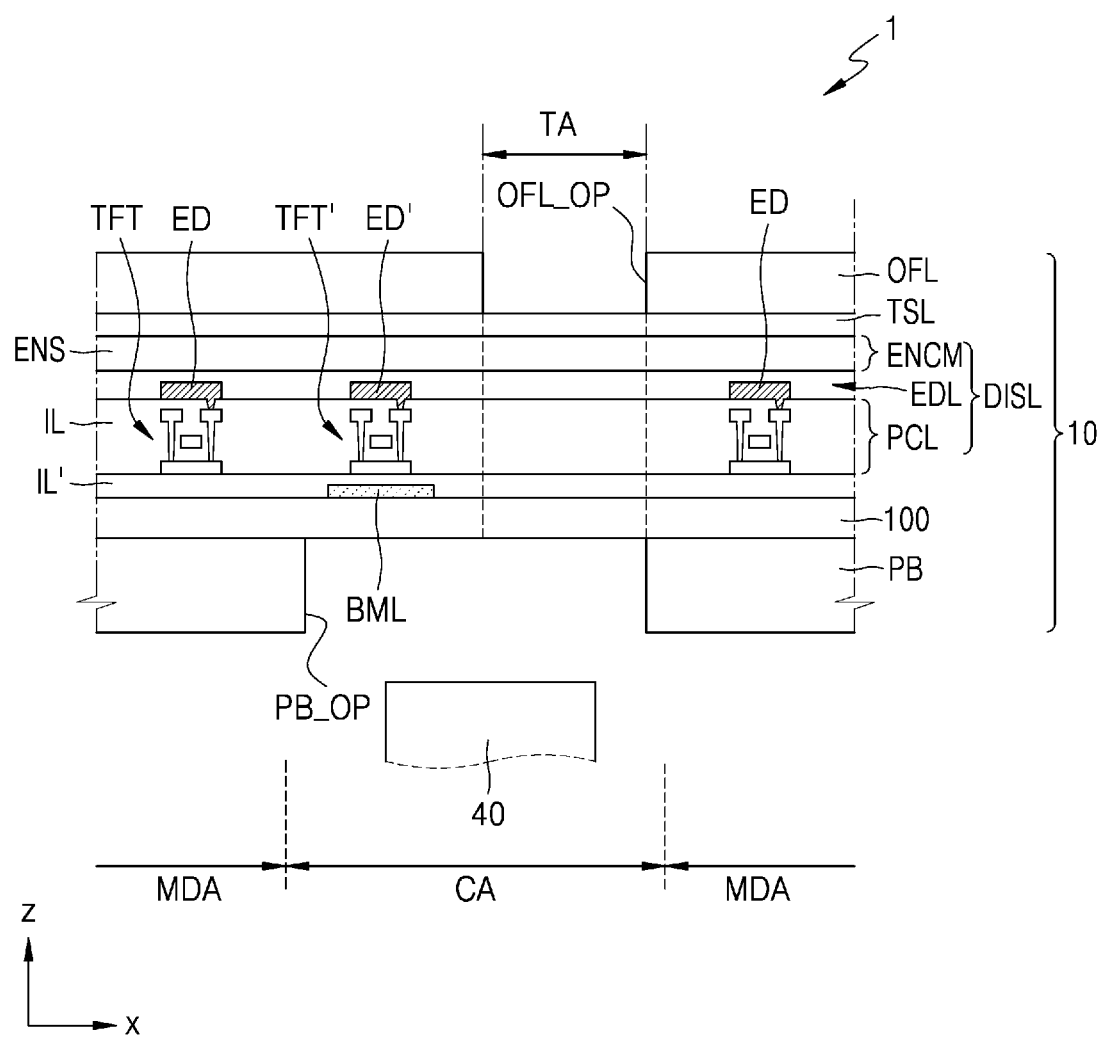

In some embodiments, the sealing substrate ENS may be arranged to face the substrate 100 with the display element layer EDL therebetween, as shown in FIG. 4B. A gap may be between the sealing substrate ENS and the display element layer EDL. The sealing substrate ENS may include glass. A sealant including a frit or the like may be arranged between the substrate 100 and the sealing substrate ENS, and the sealant may be arranged in the peripheral area DPA described above. The sealant arranged in the peripheral area DPA may prevent or substantially prevent moisture from penetrating through the side surface of the display area DA while surrounding or at least partially surrounding the display area DA.

The touch screen layer TSL may acquire coordinate information according to an external input such as, for example, a touch event. The touch screen layer TSL may include a touch electrode and touch wiring lines connected to the touch electrode. The touch screen layer TSL may sense external inputs by using a self-capacitance method or a mutual capacitance method.

The touch screen layer TSL may be formed on the thin-film encapsulation layer TFEL. Alternatively, the touch screen layer TSL may be separately formed on a touch substrate, and then combined onto the thin-film encapsulation layer TFEL through an adhesive layer such as an OCA. As an embodiment, as shown in FIGS. 4A-4E, the touch screen layer TSL may be directly formed on the thin-film encapsulation layer TFEL, and in this case, the adhesive layer may not be between the touch screen layer TLS and the thin-film encapsulation layer TFEL.

The optical functional layer OFL may include an anti-reflection layer. The anti-reflection layer may reduce the reflectance of light (e.g., external light) incident on the display device 1 from the outside (i.e., outside the display device 1).

In some embodiments, the optical functional layer OFL may be a polarizing film. The optical functional layer OFL may include an opening OFL_OP corresponding to the transmissive portion TA. Accordingly, the light transmittance of the transmissive portion TA may be improved (e.g., significantly improved). The opening OFL_OP may be filled with a transparent material such as optically clear resin (OCR).

Figure 4C:
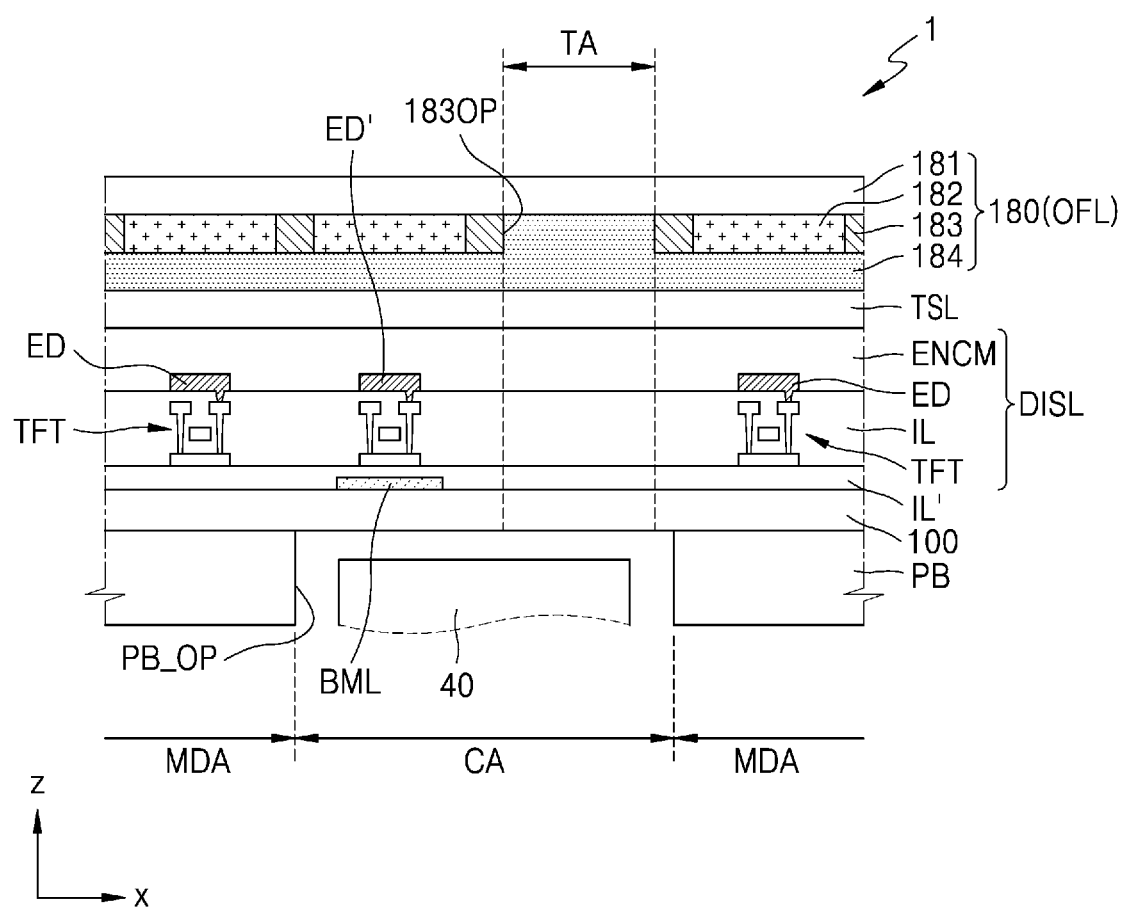

In some embodiments, the optical functional layer OFL may include a filter plate 180 including a black matrix and color filters, as shown in FIG. 4C. The filter plate 180 may include a base layer 181, color filters 182 on the base layer 181, a black matrix 183, and an overcoat layer 184.

The color filters 182 may be arranged by considering the color of light emitted from each of the pixels of the display panel 10. For example, each of the color filters 182 may have a red, green, or blue color, depending on the color of light emitted from the light-emitting elements ED and ED'. The color filter 182 and the black matrix 183 may not be present in the transmissive portion TA. For example, a layer including the color filter 182 and the black matrix 183 may include a hole 1830P corresponding to the transmissive portion TA. The hole 1830P may be at least partially filled with a portion of the overcoat layer 184. The overcoat layer 184 may include an organic material such as a resin, and the organic material may be transparent.

Figure 4D:
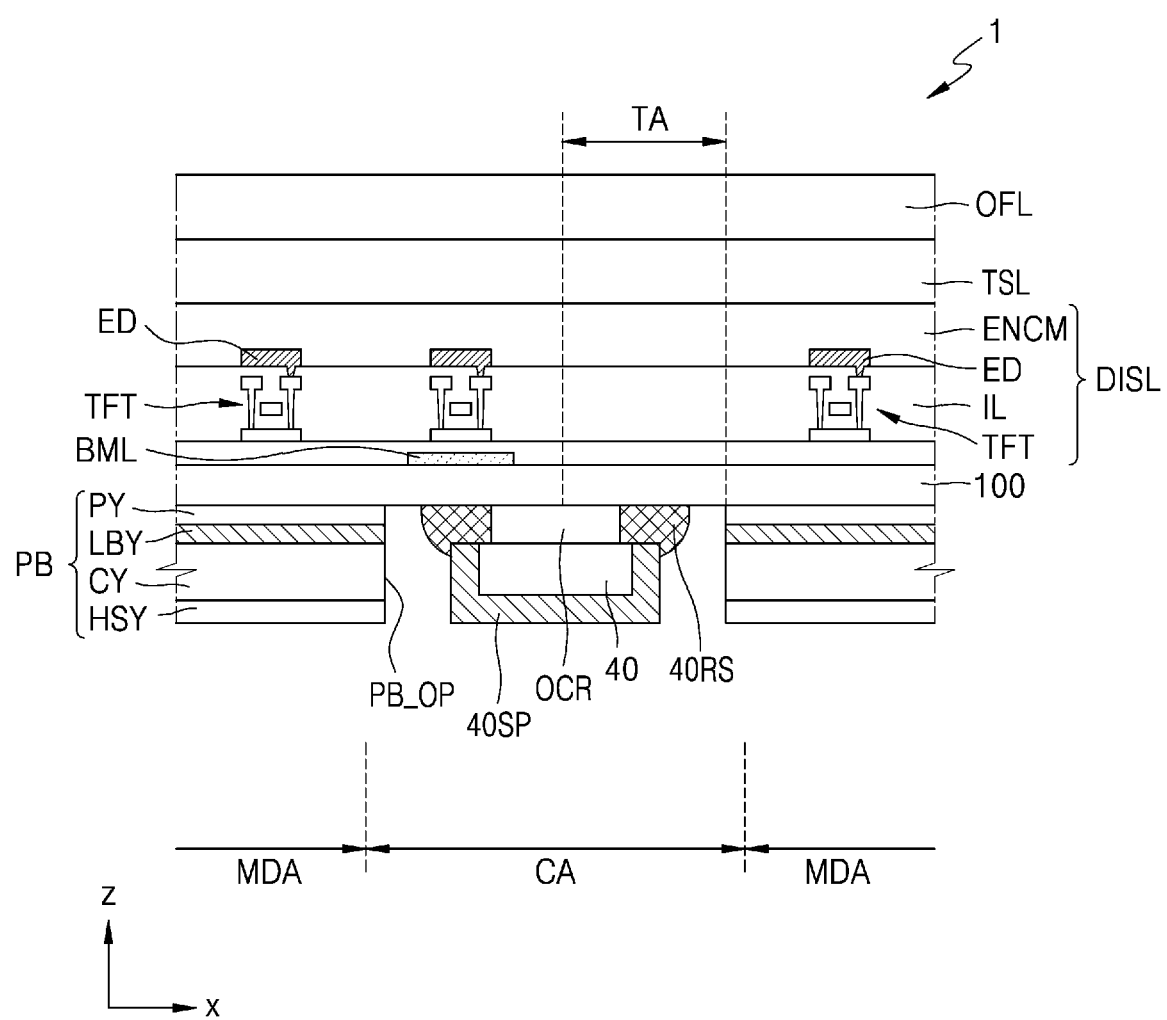

As shown in FIG. 4D, the component 40 may be attached to a lower portion of the display panel 10. In addition, the panel protection member PB may include a protective layer PY, a light-blocking layer LBY, a cushion layer CY, and a heat dissipation layer HSY. The protective layer PY may be attached to the lower surface of the substrate 100 and protect the substrate 100 from the outside. For example, the protective layer PY may absorb a physical impact from the outside or block or substantially block foreign substances or moisture from penetrating through the display layer DISL. The protective layer PY may be coated on the lower surface of the substrate 100 or attached, in a film form, to the lower surface of the substrate 100.

In an embodiment, the protective layer PY may include a material that blocks or substantially blocks ultraviolet rays (UV). For example, the protective layer PY may include a base resin, a UV absorber, and inorganic particles. The UV absorber and the inorganic particles may be dispersed in the base resin. The base resin may be an acrylate-based resin, for example, urethane acrylate. However, the embodiment is not limited thereto, and a base resin that is optically transparent and capable of dispersing a UV absorber and inorganic particles may be used in the protective layer PY without limitation.

For example, the UV absorber may include at least one of a benzotriazol-based compound, a benzophenone-based compound, a salicylic acid-based compound, a salicylate-based compound, a cyanoacrylate-based compound, a cinnamate-based compound, an oxanilide-based compound, a polystyrene-based compound, an azomethine-based compound, or a triazine-based compound.

The light-blocking layer LBY may be arranged on the lower surface of the protective layer PY, and the cushion layer CY may be arranged on the lower surface of the light-blocking layer LBY. The light-blocking layer LBY may be a double-sided adhesive arranged between the protective layer PY and the cushion layer CY. Furthermore, the light-blocking layer LBY may absorb light transmitted from the outside. For example, the light-blocking layer LBY may be provided as a black layer to absorb external light. However, the disclosure is not limited thereto, and the light-blocking layer LBY may include various suitable materials capable of absorbing external light.

The cushion layer CY may be attached to the lower surface of the light-blocking layer LBY to protect the display panel 10 from the outside. The cushion layer CY may include a material having elasticity. For example, the cushion layer CY may include foam including polyurethane, polyethylene, polycarbonate, polypropylene, or polyolefin. However, the abovementioned materials are examples, and the cushion layer CY may include a material having excellent compressive stress and excellent absorption of shock and vibration.

The heat dissipation layer HSY may be arranged under the cushion layer CY. The heat dissipation layer HSY may include a first heat dissipation layer including a metal thin film such as copper, nickel, ferrite, and silver that may shield electromagnetic waves and have excellent heat conductivity, and a second heat dissipation layer including graphite, carbon nanotubes, or the like.

The positions of the protective layer PY, the light-blocking layer LBY, the cushion layer CY, and the heat dissipation layer HSY, which constitute the panel protection member PB, may be variously modified in a suitable manner.

In some embodiments, a metal plate may be further arranged under the panel protection member PB. The metal plate may include a high modulus material. For example, the metal plate may include at least one selected from the group consisting of Invar, Nobinite, Stainless, and an alloy thereof. When the display panel 10 is a foldable display panel, a metal plate may be arranged under the foldable display panel. In this case, because the metal plate may include a high modulus material, the metal plate may not be deformed even though the operation of folding the display panel 10 is repeated.

As described above, the panel protection member PB may have an opening PB_OP corresponding to the component area CA, and the component 40 may be arranged in the opening PB_OP. In some embodiments, the protective layer PY may not include an opening corresponding to the component area CA and be continuously arranged. For example, in some embodiments, the opening PB_OP may not extend through the protective layer PY of the panel protection member PB.

The component 40 may be mounted on a package 40SP, and the package 40SP may be attached to the lower surface of the substrate 100 by an adhesive member 40RS. The package 40SP may include a control circuit connected (e.g., electrically connected) to the component 40.

An OCR may be filled between the component 40 and the lower surface of the substrate 100. The OCR may have optical transparency to minimize or reduce loss of light incident on the component 40.

The adhesive member 40RS fixes the package 40SP to the lower surface of the substrate 100. The adhesive member 40RS may include a resin. That is, after the resin is arranged to contact the package 40SP and the lower surface of the substrate 100, curing by UV may be performed. The adhesive member 40RS may include a light-absorbing material.

Figure 4E:
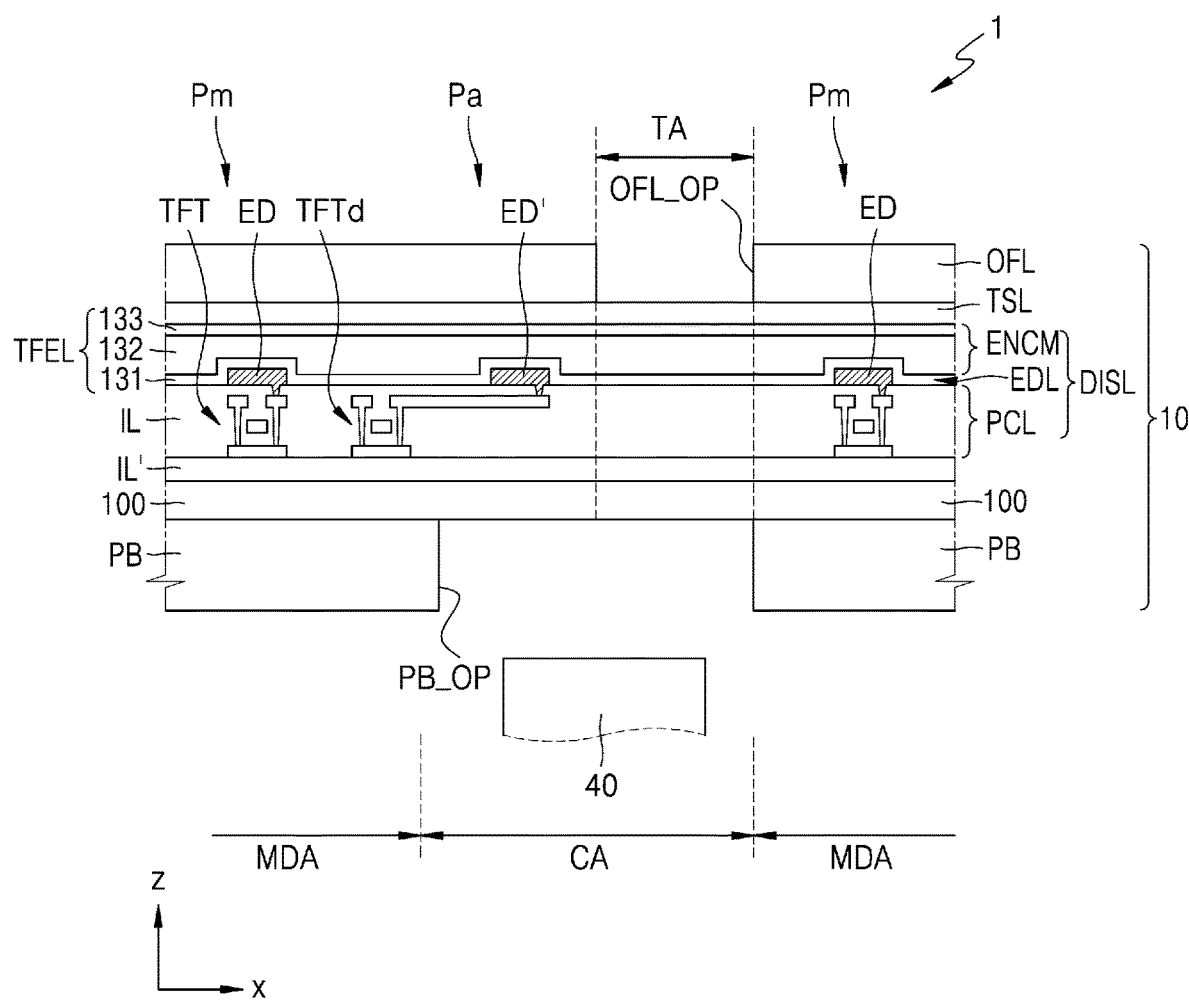

As shown in FIG. 4E, the circuit layer PCL may include a dummy thin-film transistor TFTd. The dummy thin-film transistor TFTd may be spaced from the component area CA and may be connected to the auxiliary light-emitting element ED'. In this case, the dummy thin-film transistor TFTd and the auxiliary light-emitting element ED' may be connected to each other through a transparent wiring line. The transparent wiring line may include a transparent conductive material. For example, the transparent wiring line may include at least one of indium tin oxide (ITO), indium zinc oxide (IZO), zinc oxide (ZnO), indium oxide ($In_2O_3$), indium gallium oxide (IGO), or aluminum zinc oxide (AZO). Therefore, the transmittance of the component area CA may be further improved. In addition, when a pixel electrode of the auxiliary light-emitting element ED' does not include a reflective layer, the auxiliary light-emitting element ED' may be transparent and may emit light from both sides thereof. Thus, the auxiliary light-emitting element ED' may emit light to the top and/or bottom of the display device 1.

Figure 5:
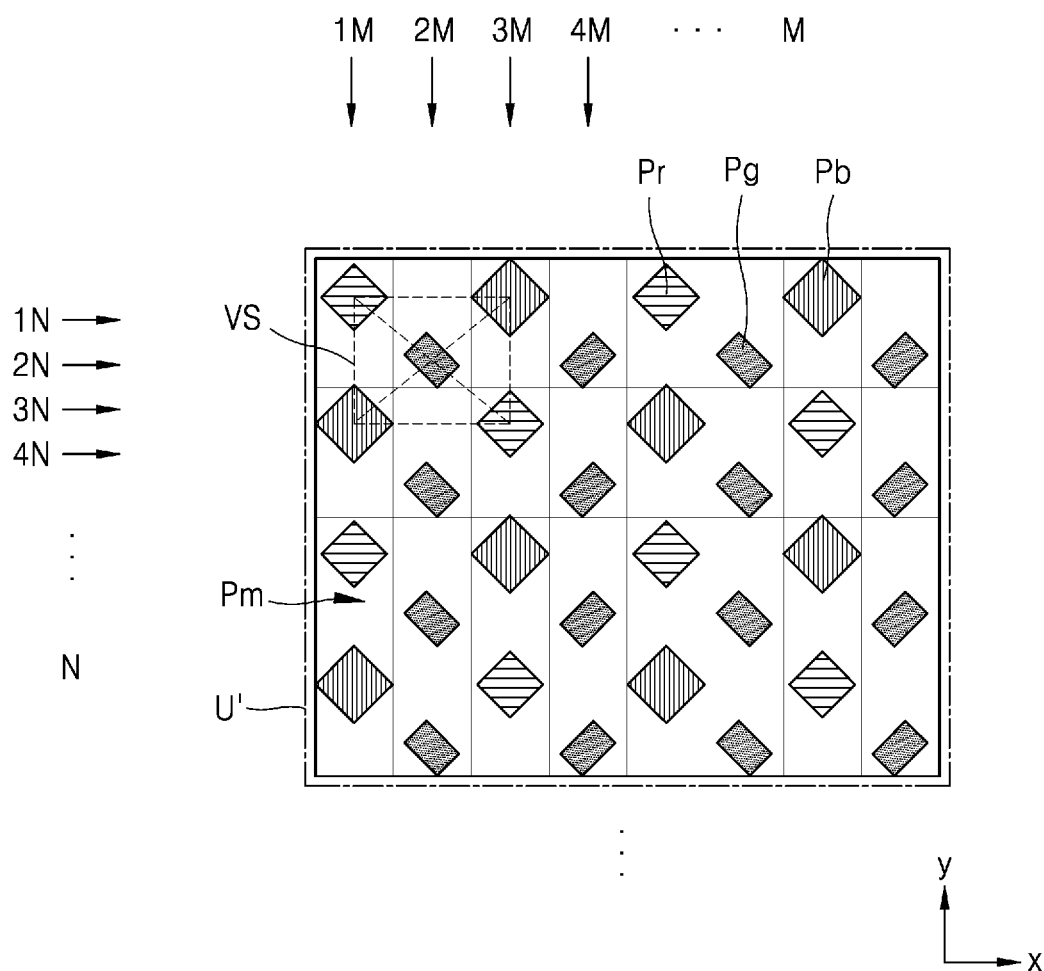
FIG. 5 is a schematic layout diagram illustrating a pixel arrangement structure in a main display area according to an embodiment.

FIG. 5 is a schematic layout diagram illustrating a pixel arrangement structure in a main display area MDA according to an embodiment.

A plurality of main sub-pixels Pm may be arranged in the main display area MDA. In this specification, the sub-pixel refers to a light-emitting area as a minimum unit for realizing an image. The pixel arrangement structure may be described based on the light-emitting area of each sub-pixel. When an organic light-emitting diode is used as a display element, the light-emitting area may be defined by an opening of a pixel-defining layer, which may be described in more detail below.

As shown in FIG. 5, the main sub-pixels Pm arranged in the main display area MDA may be arranged in a pentile structure (i.e., a Pentile® structure where PENTILE® is a registered trademark of Samsung Display Co., Ltd., Republic of Korea). A red sub-pixel Pr, a green sub-pixel Pg, and a blue sub-pixel Pb may implement or provide red light, green light, and blue light, respectively.

In some embodiments, a plurality of red sub-pixels Pr and a plurality of blue sub-pixels Pb are alternately arranged in a first row 1N, a plurality of green sub-pixels Pg are spaced from each other in a second row 2N adjacent to the first row 1N, a plurality of blue sub-pixels Pb and a plurality of red sub-pixels Pr are alternately arranged in a third row 3N adjacent to the second row 2N, and a plurality of green sub-pixels Pg are spaced from each other in a fourth row 4N adjacent to the third row 3N as shown in FIG. 5. This arrangement of pixels is repeated up to an Nth row (where N denotes a natural number). In this case, the blue sub-pixels Pb and the red sub-pixels Pr may be larger than the green sub-pixels Pg.

The plurality of red sub-pixels Pr and the plurality of blue sub-pixels Pb arranged in the first row 1N and the plurality of green sub-pixels Pg arranged in the second row 2N are staggered. In other words, the plurality of red sub-pixels Pr and the plurality of blue sub-pixels Pb arranged in the first row 1N may be offset from (i.e., not share a column with) the plurality of green sub-pixels Pg arranged in the second row 2N. Therefore, a plurality of red sub-pixels Pr and a plurality of blue sub-pixels Pb are alternately arranged in a first column 1M, a plurality of green sub-pixels Pg are spaced from each other in a second column 2M adjacent to the first column 1M, a plurality of blue sub-pixels Pb and a plurality of red sub-pixels Pr are alternately arranged in a third column 3M adjacent to the second column 2M, and a plurality of green sub-pixels Pg are spaced from each other in a fourth column 4M adjacent to the third column 3M. This arrangement of pixels is repeated up to an Mth column (where M denotes a natural number).

In other words, the red sub-pixel Pr is arranged at each of the first and third vertices facing each other from among the vertices of a virtual quadrangle VS having the center point of the green sub-pixel Pg as the center point of the virtual quadrangle VS, and the blue sub-pixel Pb is arranged at each of the second and fourth vertices, which are the remaining vertices. The green sub-pixel Pg may be at a center point between the red sub-pixels Pr arranged at each of the first and the third vertices, and be at a center point between the blue sub-pixels Pb arranged at each of the second and fourth vertices. In some embodiments, the virtual quadrangle VS may be variously modified in a suitable manner. For example, the virtual quadrangle VS may be a rectangle, a rhombus, and a square.

Such a pixel arrangement structure is called a pentile matrix structure (i.e., a Pentile® matrix structure) or a pentile structure, and in this case, a high resolution may be realized with a small number of pixels by using a rendering driving scheme that shares adjacent pixels to represent colors.

Although FIG. 5 illustrates an example in which a plurality of main sub-pixels Pm are arranged in a pentile matrix structure, the disclosure is not limited thereto. For example, the plurality of main sub-pixels Pm may be arranged in various suitable shapes such as a stripe structure, a mosaic arrangement structure, and a delta arrangement structure.

FIGS. 6A-6D are schematic layout diagrams illustrating a pixel arrangement structure in a component area CA according to various embodiments.

Figure 6A:
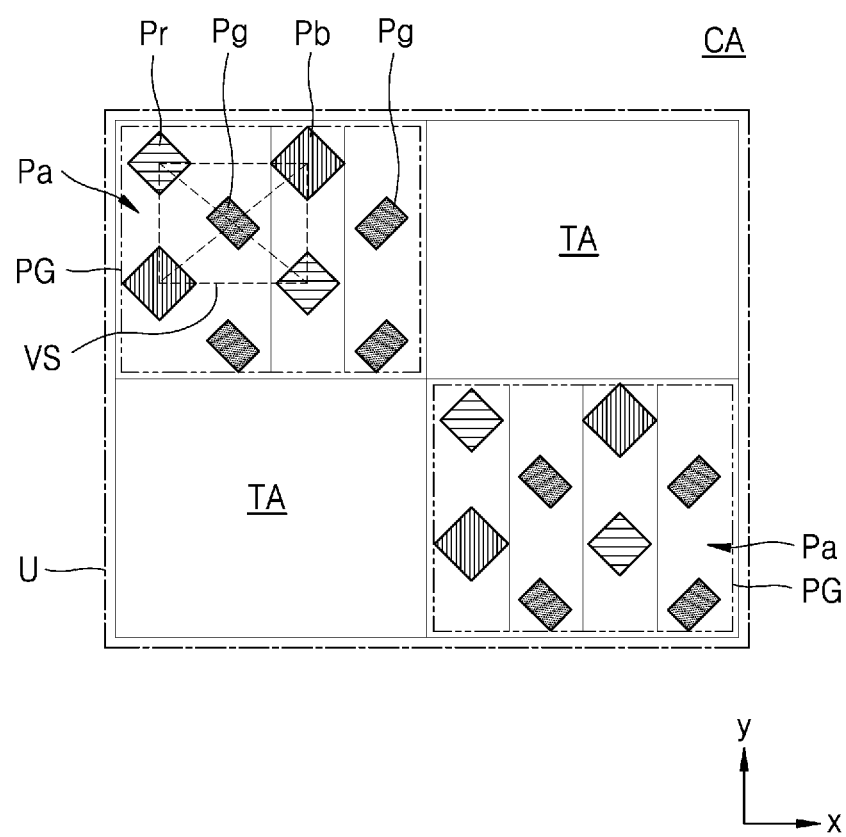
FIGS. 6A-6D are schematic layout diagrams illustrating a pixel arrangement structure in a component area according to various embodiments.

Referring to FIG. 6A, a plurality of auxiliary sub-pixels Pa may be arranged in the component area CA. Each of the auxiliary sub-pixels Pa may emit one of red light, green light, blue light, and white light.

The component area CA may have a pixel group PG including at least one auxiliary sub-pixel Pa, and a transmissive portion TA. The pixel group PG and the transmissive portion TA may be alternately arranged in the x direction and the y direction, and may be arranged, for example, in a lattice shape. In this case, the component area CA may have a plurality of pixel groups PG and a plurality of transmissive portions TA.

The pixel group PG may be defined as a collection of sub-pixels in which a plurality of auxiliary sub-pixels Pa are bundled together in a preset unit. For example, as shown in FIG. 6A, eight auxiliary sub-pixels Pa arranged in a pentile structure may be included in one pixel group PG. That is, one pixel group PG may include two red sub-pixels Pr, four green sub-pixels Pg, and two blue sub-pixels Pb.

In the component area CA, a basic unit U in which a certain number of pixel groups PG and a certain number of transmissive portions TA are bundled together may be repeatedly arranged in the x direction and the y direction. In FIG. 6A, the basic unit U may have a shape in which two pixel groups PG and two transmissive portions TA arranged therearound are bundled together in a quadrangular shape. The basic unit U is obtained by partitioning the component area CA into repetitive shapes (repeatable units) and does not refer to disconnection (e.g., disconnection between, for example, basic units U) of the configuration of the component area CA.

In the main display area MDA, a corresponding unit U' having an area equal to the area of the basic unit U may be set. In this case, the number of main sub-pixels Pm in the corresponding unit U' may be greater than the number of auxiliary sub-pixels Pa in the basic unit U. That is, the number of auxiliary sub-pixels Pa in the basic unit U may be 16 and the number of main sub-pixels Pm in the corresponding unit U' may be 32. The number of auxiliary sub-pixels Pa and the number of main sub-pixels Pm arranged per equal area may be provided in a ratio of 1:2.

The arrangement structure of the auxiliary sub-pixels Pa as shown in FIG. 6A is a pentile structure, and the pixel arrangement structure of a component area CA having a resolution that is half that of the main display area MDA is referred to as a ½ pentile structure. The number or arrangement of auxiliary sub-pixels Pa in the pixel group PG may be modified according to the resolution of the component area CA.

Figure 6B:
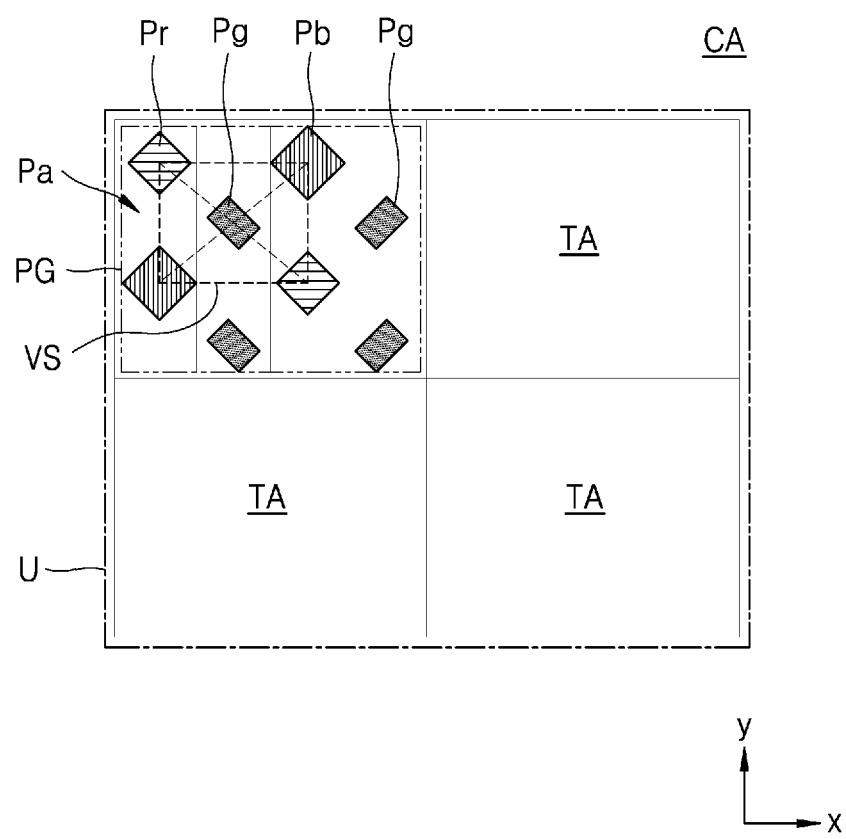

Referring to FIG. 6B, the arrangement structure of the auxiliary sub-pixels Pa may be a pentile structure, and the pixel arrangement structure of the component area CA may have a resolution that is one fourth that of the main display area MDA, which may be referred to as a ¼ pentile structure. In the illustrated embodiment, eight auxiliary sub-pixels Pa are arranged in the pixel group PG in a pentile structure, but only one pixel group PG may be included in the basic unit U. The remaining area of the basic unit U may be provided as a transmissive portion TA. Accordingly, the number of auxiliary sub-pixels Pa and the number of main sub-pixels Pm arranged per equal area may be provided in a ratio of 1:4.

Figure 6C:
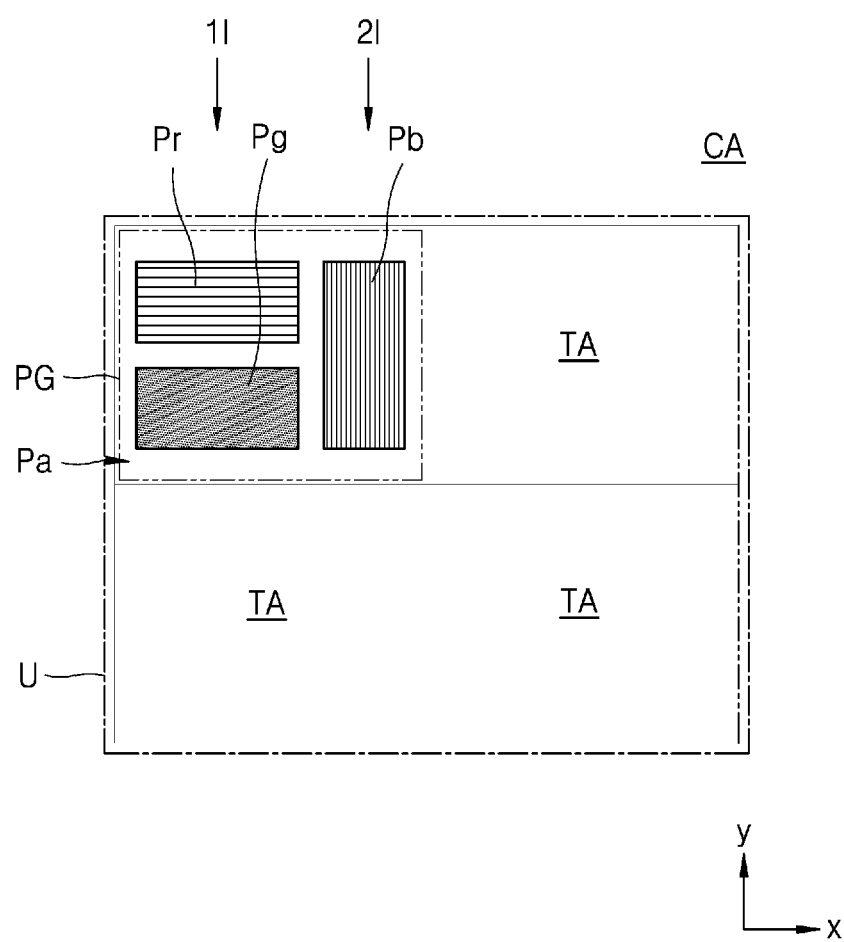

Referring to FIG. 6C, the pixel arrangement structure of the component area CA may be provided as an S-stripe structure. In the illustrated embodiment, one pixel group PG may include three auxiliary sub-pixels Pa, that is, a red sub-pixel Pr, a green sub-pixel Pg, and a blue sub-pixel Pb.

In the illustrated embodiment, the red sub-pixel Pr and the green sub-pixel Pg may be alternately arranged in a first column 1I, and the blue sub-pixel Pb may be arranged in a second column 2I adjacent to the first column 1I. In this case, each of the red sub-pixel Pr and the green sub-pixel Pg may have a rectangular shape having a long side in the x direction and a short side in the y direction, and the blue sub-pixel Pb may have a rectangular shape having a long side in the y direction and a short side in the x direction. The length of the blue sub-pixel Pb in the y direction may be equal to or greater than the sum of the length of the red sub-pixel Pr in the y direction and the length of the green sub-pixel Pg in the y direction. Accordingly, the size of the blue sub-pixel Pb may be greater than those of the red sub-pixel Pr and the green sub-pixel Pg. However, the present disclosure is not limited thereto, and in other embodiments, the areas of the blue sub-pixel Pb, the red sub-pixel Pr, and the green sub-pixel Pg may be variously modified in a suitable manner.

In the illustrated embodiment, the area occupied by one pixel group PG in the basic unit U may be about ¼ of that of the basic unit U. FIG. 6C illustrates that only one pixel group PG is included in the basic unit U. However, in another embodiment, two or more pixel groups PG may be included in the basic unit U. Also, the areas of the auxiliary sub-pixels Pa in the pixel group PG may be variously modified in a suitable manner.

Figure 6D:
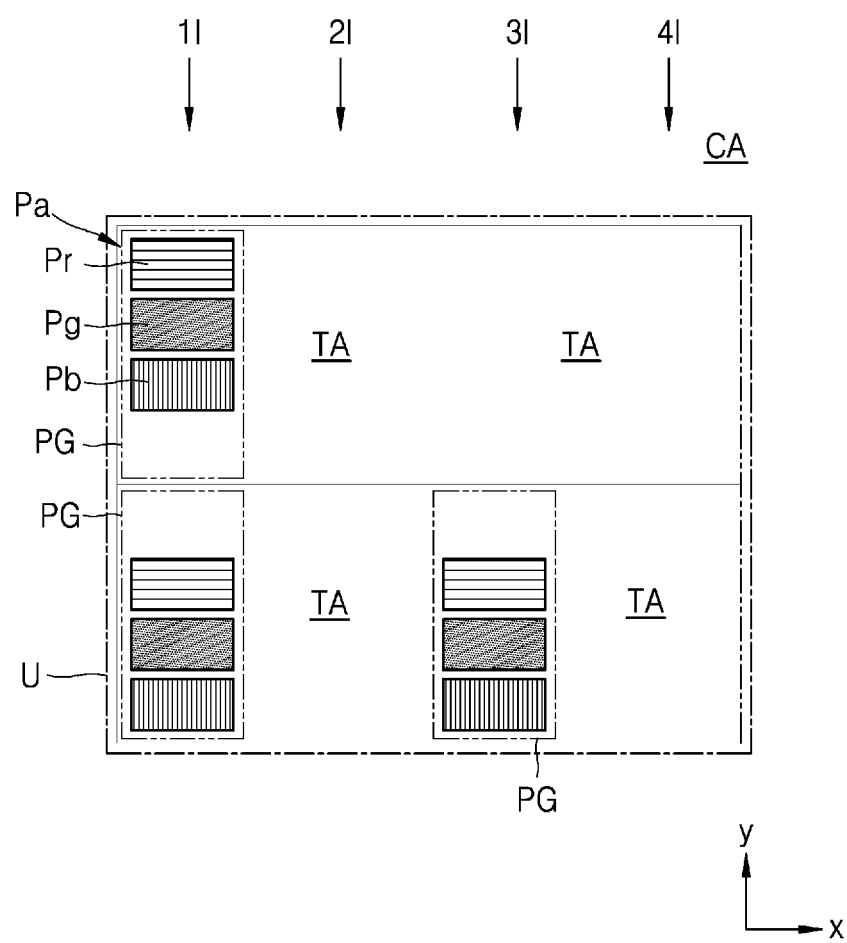

Referring to FIG. 6D, the pixel arrangement structure of the component area CA may be provided as a stripe structure. That is, one pixel group PG may include three auxiliary sub-pixels, that is, a red sub-pixel Pr, a green sub-pixel Pg, and a blue sub-pixel Pb. Furthermore, the red sub-pixel Pr, the green sub-pixel Pg, and the blue sub-pixel Pb may be arranged in a line in the y direction. In this case, the red sub-pixel Pr, the green sub-pixel Pg, and the blue sub-pixel Pb may each have a long side in the x direction and a short side in the y direction.

Alternatively, unlike in FIG. 6D, the red sub-pixel Pr, the green sub-pixel Pg, and the blue sub-pixel Pb may be arranged in a line in the x direction. In this case, the red sub-pixel Pr, the green sub-pixel Pg, and the blue sub-pixel Pb may each have a long side in the y direction and a short side in the x direction.

In the illustrated embodiment, two pixel groups PG may be arranged in a line in a first column 1I, and a transmissive portion TA may be arranged in a second column 2I adjacent to the first column 1I. In addition, a transmissive portion TA and one pixel group PG may be arranged in a third column 3I adjacent to the second column 2I, and a transmissive portion TA may be arranged in a fourth column 4I adjacent to the third column 3I. That is, the pixel groups PG may be arranged on the upper left, lower left, and lower right sides of the basic unit U. In other words, the pixel groups PG may be arranged in the upper left quadrant, lower left quadrant, and lower right quadrant, but not the upper right quadrant from among the quadrants of the basic unit U.

In some embodiments, the component area CA may include a first pixel group and a second pixel group, which have different pixel arrangements. For example, the pixel arrangement structures described with reference to FIGS. 6A and 6D may be applied to the first pixel group and the second pixel group. For example, auxiliary sub-pixels of the first pixel group may be arranged in a pentile structure, and auxiliary sub-pixels of the second pixel group may be arranged in a stripe structure.

FIGS. 7A-7D are schematic plan views illustrating the shapes of a lower metal layer BML that may be arranged in the component area CA.

Referring to FIGS. 7A-7D, the lower metal layer BML may be arranged to correspond to the component area CA and may have a lower hole BMLH. The shapes and sizes of the lower metal layer BML and the lower hole BMLH may be variously provided in a suitable manner.

Figure 7A:
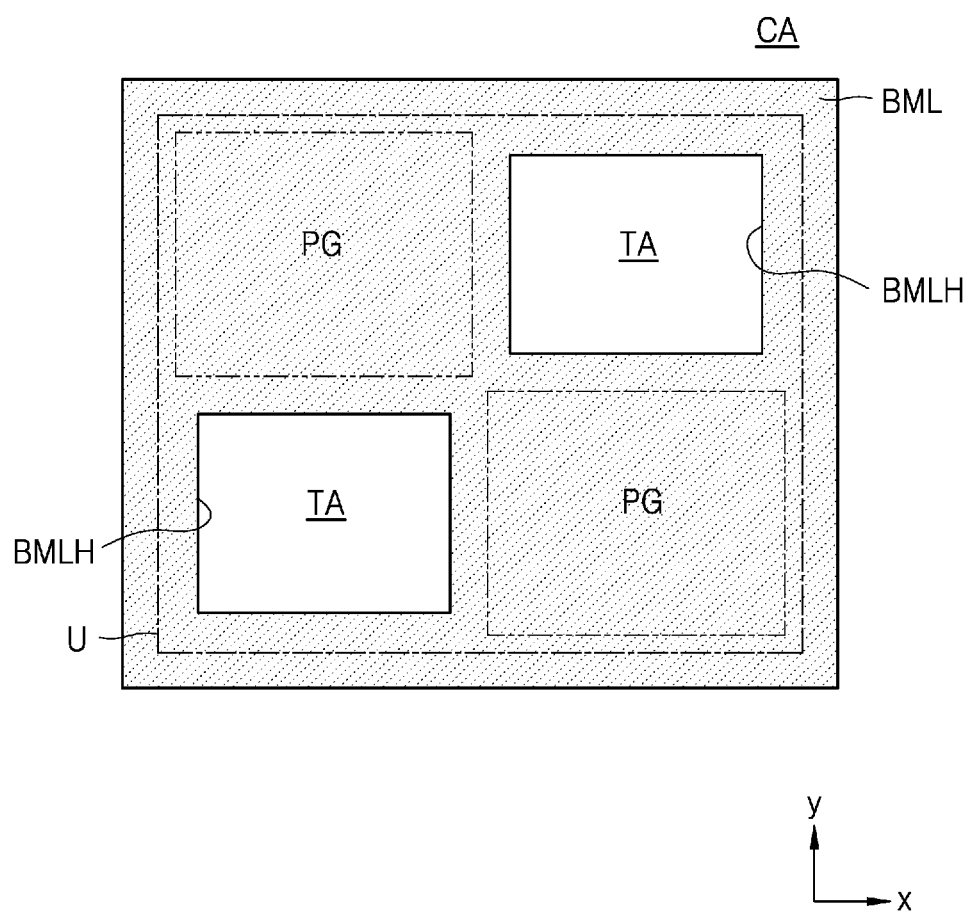
FIGS. 7A-7D are schematic plan views illustrating the shapes of a lower metal layer that may be arranged in a component area.

Referring to FIG. 7A, the lower hole BMLH may have a quadrangular shape and may be spaced from a pixel group PG. In the illustrated embodiment, the lower hole BMLH may not overlap the pixel group PG in a plan view. That is, the lower hole BMLH may be provided not to correspond to the pixel group PG. In this case, the shape and size of a transmissive portion TA may be defined by the shape and size of the lower hole BMLH. On a plane or in a plan view, two lower holes BMLH may be provided for each basic unit U and may be alternately arranged with the pixel group PG.

Figure 7B:
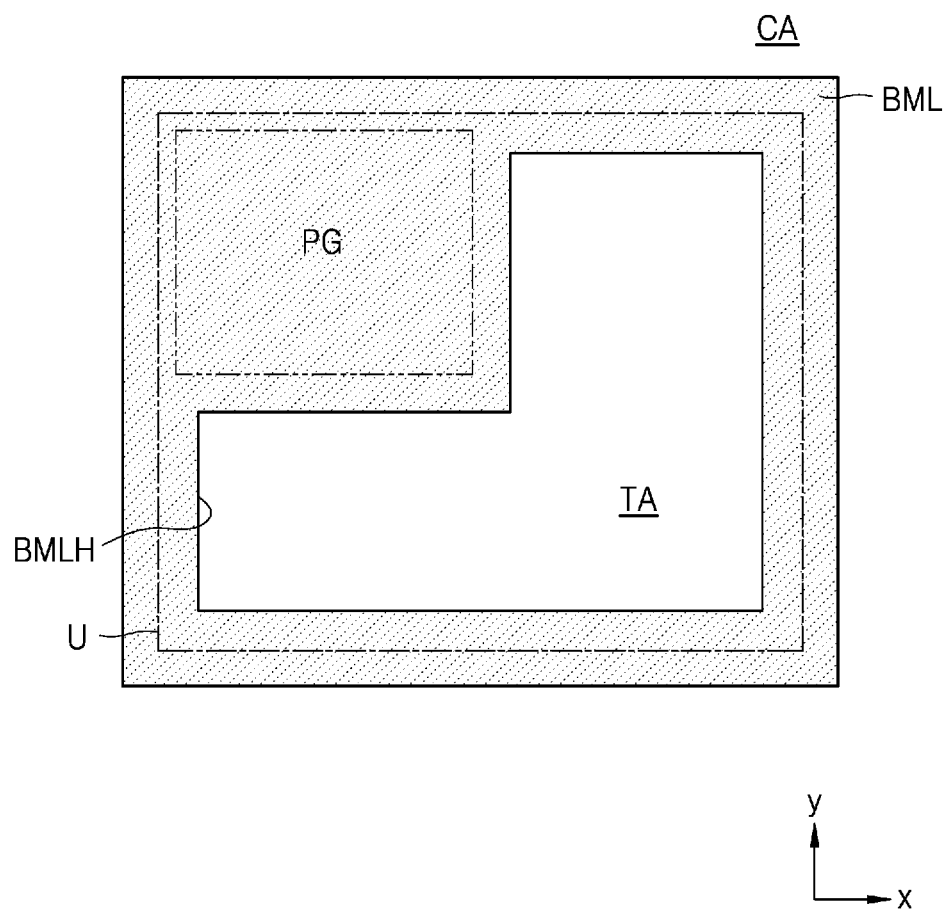

Referring to FIG. 7B, the basic unit U may include one pixel group PG, and the lower hole BMLH may be spaced from the pixel group PG on a plane (e.g., on a x-y plane) or in a plan view. In the illustrated embodiment, the lower hole BMLH may not overlap the pixel group PG in a plan view. That is, the lower hole BMLH may be provided not to correspond to the one pixel group PG. The lower hole BMLH may be arranged in an area excluding the area in which the pixel group PG is arranged in the basic unit U.

Figure 7C:
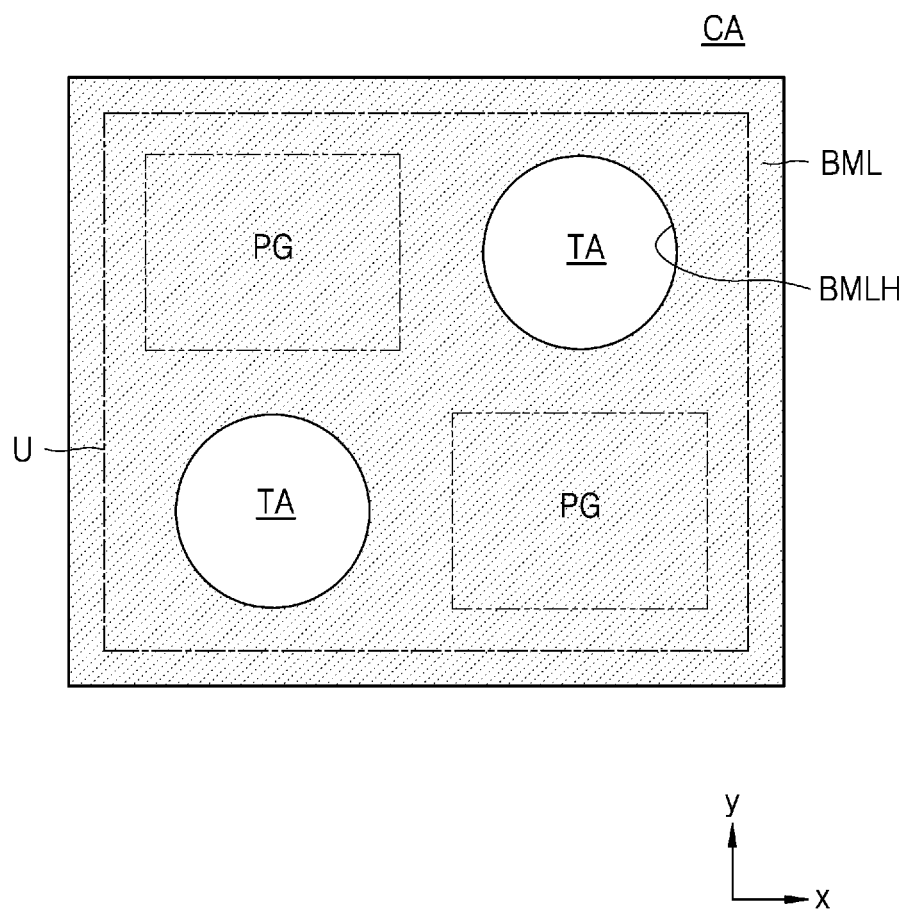
Figure 7D:
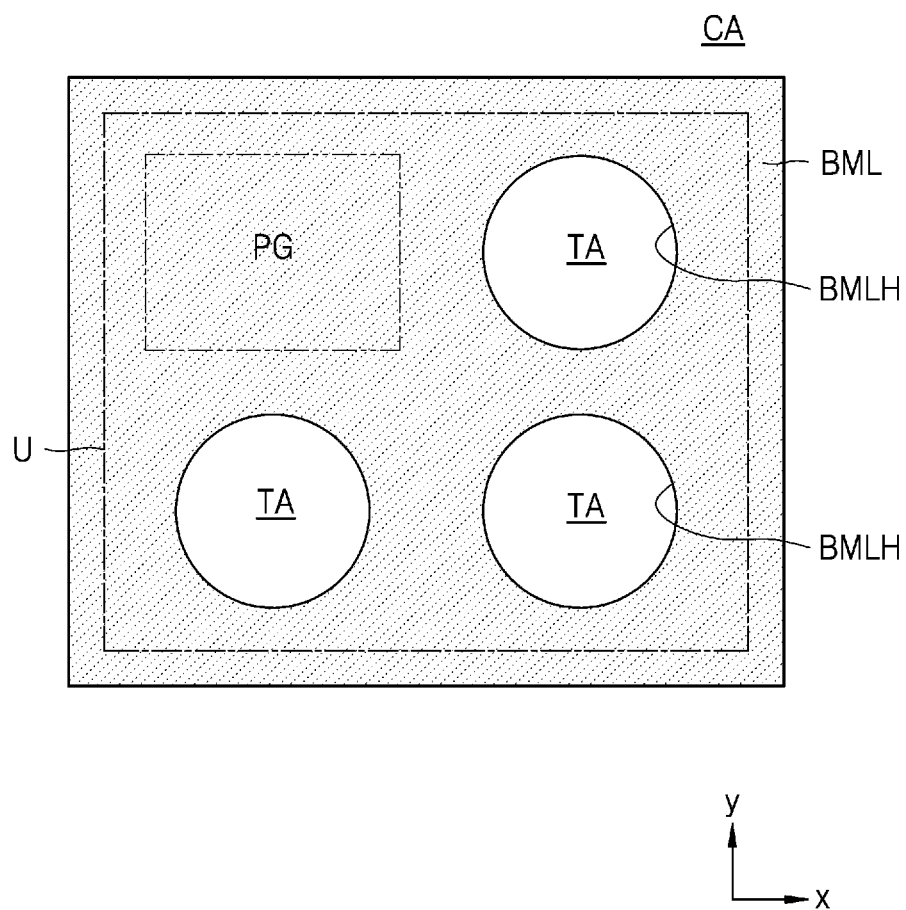

Referring to FIGS. 7C and 7D, the lower hole BMLH may have a circular shape. When the transmissive portion TA has a shape similar to a circular shape, diffraction characteristics of light may be improved. Therefore, when a component arranged under the component area CA is a camera, it is advisable that the transmissive portion TA has a shape similar to a circular shape. The lower hole BMLH may have an octagonal or other polygonal shape (e.g., a polygonal shape with more sides than an octagonal shape) similar to a circular shape, or an elliptical shape. One lower hole BMLH or a plurality of lower holes BMLH may be provided between pixel groups PG. For example, as shown in FIG. 7C, when the basic unit U includes two pixel groups PG, two lower holes BMLH may be provided so as not to correspond to the two pixel groups PG. As another example, as shown in FIG. 7D, when the basic unit U includes one pixel group PG, three lower holes BMLH may be provided so as not to correspond to the one pixel group PG.

In some embodiments, when the auxiliary sub-pixel is implemented as a transparent auxiliary light-emitting element, a lower metal layer may not be arranged such that the transparent auxiliary light-emitting element emits light from both sides thereof.

Figure 8:
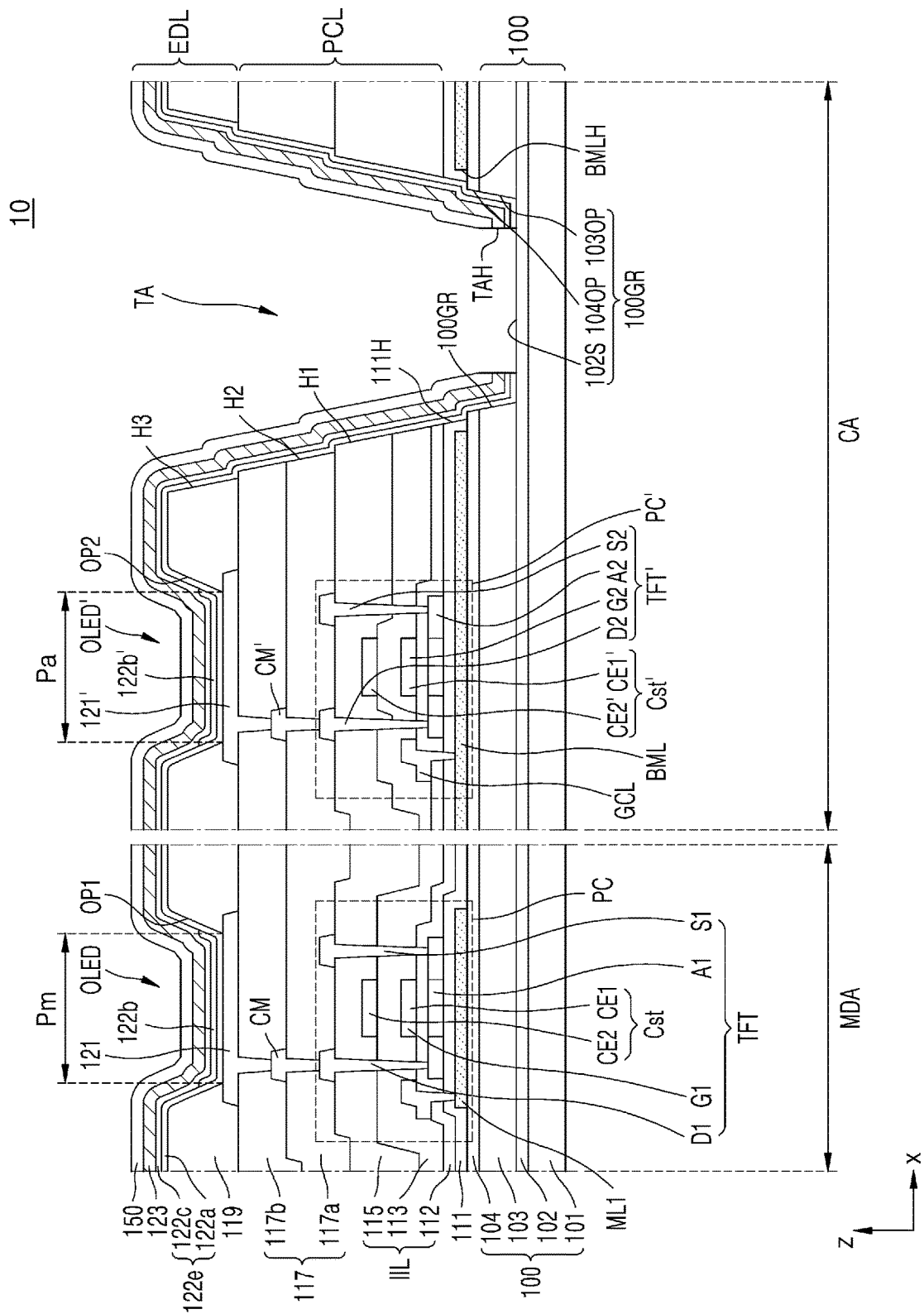
FIG. 8 is a schematic cross-sectional view illustrating a portion of a display panel according to an embodiment.

FIG. 8 is a schematic cross-sectional view illustrating a portion of a display panel 10 according to an embodiment. FIG. 8 illustrates a portion of a main display area MDA and a portion of a component area CA.

Referring to FIG. 8, the display panel 10 may include the main display area MDA and the component area CA. A main sub-pixel Pm may be arranged in the main display area MDA, and an auxiliary sub-pixel Pa and a transmissive portion TA may be arranged in the component area CA. A main pixel circuit PC, which includes a main thin-film transistor TFT and a main storage capacitor Cst, and a main organic light-emitting diode OLED, which is a display element connected to the main pixel circuit PC, may be arranged in the main display area MDA. An auxiliary pixel circuit PC', which includes auxiliary thin-film transistor TFT' and an auxiliary storage capacitor Cst', and an auxiliary organic light-emitting diode OLED', which is a display element connected to the auxiliary pixel circuit PC', may be arranged in the component area CA.

In the illustrated embodiment, an organic light-emitting diode is used as a display element, but in another embodiment, an inorganic light-emitting element or a quantum dot light-emitting diode may be used as the display element.

Hereinafter, a structure in which components in the display panel 10 are stacked may be described in more detail below. The display panel 10 may have a structure in which a substrate 100, a buffer layer 111, a circuit layer PCL, and a display element layer EDL are stacked.

As described above, the substrate 100 may include an insulating material such as glass, quartz, or polymer resin. The substrate 100 may be a rigid substrate, or a flexible substrate that is bendable, foldable, or rollable.

In an embodiment, the substrate 100 may include a first base layer 101, a first inorganic barrier layer 102, a second base layer 103 and a second inorganic barrier layer 104, which are sequentially stacked. The first base layer 101 and the second base layer 103 may each include a polymer resin as described above. Each of the first inorganic barrier layer 102 and the second inorganic barrier layer 104 is a barrier layer that prevents or substantially prevents the penetration of impurities from outside, and may include an inorganic material, such as silicon oxide ($SiO_2$), silicon nitride ($SiN_x$), or silicon oxynitride (SiON), and have a single layer structure or a multi-layer structure.

In the illustrated embodiment, the substrate 100 may have a groove 100GR corresponding to the transmissive portion TA. The groove 100GR may refer to a region in which a portion of the substrate 100 is removed in a downward direction (−z direction) and a portion of the substrate 100 below the removed portion remains. For example, the first base layer 101 and the first inorganic barrier layer 102 may be continuous over the transmissive portion TA. In other words, a portion of the first base layer 101 and the first inorganic barrier layer 102 may not be removed to form an opening corresponding to the transmissive portion TA. In addition, the second base layer 103 and the second inorganic barrier layer 104 may respectively have an opening 103OP and an opening 104OP corresponding to the transmissive portion TA. By this shape, the substrate 100 may have the groove 100GR. That is, the groove 100GR of the substrate 100 may be formed by the opening 104OP of the second inorganic barrier layer 104, the opening 103OP of the second base layer 103, and an exposed upper surface 102S of the first inorganic barrier layer 102.

The groove 100GR of the substrate 100 may have various forms. For example, a portion of the upper surface (in the +z direction) of the first inorganic barrier layer 102 may also be removed, whereas the lower surface (in the −z direction) of the second base layer 103 may not be removed and remain. By the groove 100GR of the substrate 100, the thickness of the substrate 100 in the transmissive portion TA is reduced, and thus, light transmittance in the transmissive portion TA may be increased (e.g., significantly increased).

The buffer layer 111 may be positioned on the substrate 100 to reduce or block penetration of foreign substances, moisture, or external air from the bottom of the substrate 100 and provide a flat surface on the substrate 100. The buffer layer 111 may include an inorganic material such as an oxide or a nitride, an organic material, or an organic-inorganic composite, and may have a single layer or multi-layer structure including an inorganic material and an organic material. Between the substrate 100 and the buffer layer 111, a barrier layer for blocking the penetration of external air may be further included. In some embodiments, the buffer layer 111 may include $SiO_2$ or $SiN_x$. In some embodiments, the buffer layer 111 may include a first buffer layer and a second buffer layer, which are stacked with each other.

Furthermore, in the illustrated embodiment, the buffer layer 111 may also include a buffer hole 111H corresponding to the transmissive portion TA.

In some embodiments, in the component area CA, a lower metal layer BML may be arranged between the first buffer layer and the second buffer layer. In another embodiment, the lower metal layer BML may be arranged between the substrate 100 and the buffer layer 111 (e.g., the first buffer layer of the buffer layer 111). In an embodiment, the lower metal layer BML may be arranged under the auxiliary pixel circuit PC'. The lower metal layer BML may prevent or substantially prevent the characteristics of the auxiliary thin-film transistor TFT' from being deteriorated by light emitted from a component or the like. In addition, the lower metal layer BML may prevent or substantially prevent light emitted from a component or the like or directed to the component from diffracting through a narrow gap between wiring lines connected to the auxiliary pixel circuit PC'. The lower metal layer BML may not be present in the transmissive portion TA.

In an embodiment, the lower metal layer BML of the component area CA may be provided to correspond to the entire component area CA. In this case, the lower metal layer BML may have a lower hole BMLH overlapping the transmissive portion TA. In some embodiments, the shape and size of the transmissive portion TA may be defined by the shape and size of the lower hole BMLH.

The lower metal layer BML may be connected to a wiring line GCL arranged on another layer through a contact hole. The lower metal layer BML may receive a constant voltage or a signal from the wiring line GCL. For example, the lower metal layer BML may receive a driving voltage or a scan signal. The lower metal layer (BML) may significantly reduce the probability of the occurrence of electrostatic discharge as the constant voltage or the signal is received. The lower metal layer BML may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The lower metal layer BML may include a single layer or multiple layers including the aforementioned materials.

In an embodiment, the display panel 10 may include a first metal layer ML1 arranged in the main display area MDA. The first metal layer ML1 may be arranged between the substrate 100 and the main pixel circuit PC to correspond to the main thin-film transistor TFT of the main display area MDA. In an embodiment, the first metal layer ML1 may be arranged to correspond to a portion of the main display area MDA. Alternatively, the first metal layer ML1 may be arranged to correspond to the entire main display area MDA. Alternatively, the first metal layer ML1 may be formed integrally with the lower metal layer BML of the component area CA. A constant voltage or a signal may be applied to the first metal layer ML1, thereby preventing or reducing damage to the main pixel circuit PC due to electrostatic discharge. In some embodiments, the first metal layer ML1 may be omitted.

The first metal layer ML1 may include Al, Pt, Pd, Ag, Mg, Au, Ni, Nd, Ir, Cr, Ca, Mo, Ti, W, and/or Cu. The first metal layer ML1 may include a single layer or multiple layers including the aforementioned materials.

The circuit layer PCL may be arranged on the buffer layer 111 and may include the main and auxiliary pixel circuits PC and PC', a first gate insulating layer 112, a second gate insulating layer 113, an interlayer insulating layer 115, and a planarization layer 117. The main pixel circuit PC may include a main thin-film transistor TFT and a main storage capacitor Cst, and the auxiliary pixel circuit PC' may include an auxiliary thin-film transistor TFT' and an auxiliary storage capacitor Cst'.

The main thin-film transistor TFT and the auxiliary thin-film transistor TFT' may be arranged on the buffer layer 111. The main thin-film transistor TFT may include a first semiconductor layer A1, a first gate electrode G1, a first source electrode S1, and a first drain electrode D1, and the auxiliary thin-film transistor TFT' may include a second semiconductor layer A2, a second gate electrode G2, a second source electrode S2, and a second drain electrode D2. The main thin-film transistor TFT may be connected to the main organic light-emitting diode OLED to drive the main organic light-emitting diode OLED. The auxiliary thin-film transistor TFT' may be connected to the auxiliary organic light-emitting diode OLED' to drive the auxiliary organic light-emitting diode OLED'.

The first semiconductor layer A1 may overlap the first metal layer ML1 with the buffer layer 111 therebetween. In some embodiments, the first semiconductor layer A1 may overlap the first metal layer ML1 with the second buffer layer of the buffer layer 111 therebetween. In an embodiment, the width of the first semiconductor layer A1 may be less than the width of the first metal layer ML1, and thus, when projected or viewed in a direction perpendicular to the substrate 100 (i.e., a plan view), the first semiconductor layer A1 may overlap the first metal layer ML1 as a whole. In an embodiment, the first metal layer ML1 may be arranged to correspond to a portion of the main display area MDA. Alternatively, the first metal layer ML1 may be arranged to correspond to the entire main display area MDA. Alternatively, the first metal layer ML1 may be formed integrally with the lower metal layer BML of the component area CA. A constant voltage or a signal may be applied to the first metal layer ML1, thereby preventing or reducing damage to the main pixel circuit PC due to electrostatic discharge.

The second semiconductor layer A2 may overlap the lower metal layer BML with the buffer layer 111 therebetween. In some embodiments, the second semiconductor layer A2 may overlap the lower metal layer BML with the second buffer layer 111$b$ therebetween. In an embodiment, the width of the second semiconductor layer A2 may be less than the width of the lower metal layer BML, and thus, when projected or viewed in a direction perpendicular to the substrate 100 (i.e., a plan view), the second semiconductor layer A2 may overlap the lower metal layer BML as a whole.

The first semiconductor layer A1 and the second semiconductor layer A2 may be arranged on the buffer layer 111 and may each include polysilicon. In another embodiment, the first semiconductor layer A1 and the second semiconductor layer A2 may each include amorphous silicon. In another embodiment, the first semiconductor layer A1 and the second semiconductor layer A2 may each include an oxide of at least one material selected from indium (In), gallium (Ga), stannium (Sn), zirconium (Zr), vanadium (V), hafnium (Hf), cadmium (Cd), germanium (Ge), chromium (Cr), titanium (Ti), and zinc (Zn). The first semiconductor layer A1 and the second semiconductor layer A2 may each include a channel region, and a source region and a drain region doped with impurities.

The first gate insulating layer 112 may cover the first semiconductor layer A1 and the second semiconductor layer A2. The first gate insulating layer 112 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may include a single layer or multiple layers including the aforementioned inorganic insulating material.

The first gate electrode G1 and the second gate electrode G2 may be arranged on the first gate insulating layer 112 to overlap the first semiconductor layer A1 and the second semiconductor layer A2, respectively. Each of the first gate electrode G1 and the second gate electrode G2 may include Mo, Al, Cu, Ti, or the like and may include a single layer or multiple layers. For example, the first gate electrode G1 and the second gate electrode G2 may each include a single layer including Mo.

The second gate insulating layer 113 may cover the first gate electrode G1 and the second gate electrode G2. The second gate insulating layer 113 may include an inorganic insulating material, such as $SiO_2$, $SiN_x$, SiON, $Al_2O_3$, $TiO_2$, $Ta_2O_5$, $HfO_2$, or $ZnO_2$. The second gate insulating layer 113 may include a single layer or multiple layers including the aforementioned inorganic insulating material.

A first upper electrode CE2 of the main storage capacitor Cst and a second upper electrode CE2' of the auxiliary storage capacitor Cst' may be arranged on the second gate insulating layer 113.

In the main display area MDA, the first upper electrode CE2 may overlap the first gate electrode G1 thereunder. The first gate electrode G1 and the first upper electrode CE2 overlapping each other with the second gate insulating layer 113 therebetween may form the main storage capacitor Cst. The first gate electrode G1 may be the first lower electrode CE1 of the main storage capacitor Cst.

In the component area CA, the second upper electrode CE2' may overlap the second gate electrode G2 thereunder. The second gate electrode G2 and the second upper electrode CE2' overlapping each other with the second gate insulating layer 113 therebetween may form the auxiliary storage capacitor Cst'. The first gate electrode G1 may be the second lower electrode CE1' of the auxiliary storage capacitor Cst'.

Each of the first upper electrode CE2 and the second upper electrode CE2' may include Al, Pt, Pd, Ag, Mg, Au, Ni, Nd, Ir, Cr, Li, Ca, Mo, Ti, W, and/or Cu and may include a single layer or multiple layers including the aforementioned materials.

The interlayer insulating layer 115 may be arranged to cover the first upper electrode CE2 and the second upper electrode CE2'. The interlayer insulating layer 115 may include $SiO_2$, $SiN_x$, SiON, $Al_2O_3$, $TiO_2$, $Ta_2O_5$, $HfO_2$, or $ZnO_2$. The interlayer insulating layer 115 may include a single layer or multiple layers including the aforementioned inorganic insulating materials.

When the first gate insulating layer 112, the second gate insulating layer 113, and the interlayer insulating layer 115 are collectively referred to as an inorganic insulating layer IIL, the inorganic insulating layer IIL may have a first hole H1 corresponding to the transmissive portion TA. The first hole H1 may expose a portion of the upper surface of the buffer layer 111 or the substrate 100. The first hole H1 may be formed by overlapping an opening of the first gate insulating layer 112, an opening of the second gate insulating layer 113, and an opening of the interlayer insulating layer 115, which are formed to correspond to the transmissive portion TA. The openings may be separately formed through separate processes, or may be simultaneously (e.g., concurrently) formed through the same process. When the openings are formed through separate processes, the inner surface of the first hole H1 may not be smooth and may have stair-shaped steps.

In other embodiments, the inorganic insulating layer IIL may have a groove rather than the first hole H1 exposing the buffer layer 111. Alternatively, the inorganic insulating layer IIL may not have the first hole H1 or a groove, which corresponds to the transmissive portion TA. The inorganic insulating layer IIL includes an inorganic insulating material having generally excellent light transmittance and thus has sufficient transmittance even though it does not have a hole or groove corresponding to the transmissive portion TA, and thus, the component 40 (e.g., see FIG. 2) may transmit and/or receive a sufficient amount of light.

The source electrodes S1 and S2 and the drain electrodes D1 and D2 are arranged on the interlayer insulating layer 115. The source electrodes S1 and S2 and the drain electrodes D1 and D2 may each include a conductive material including Mo, Al, Cu, Ti, or the like and may each include a single layer or multiple layers including the conductive material. For example, the source electrodes S1 and S2 and the drain electrodes D1 and D2 may each have a multi-layer structure of Ti/Al/Ti.

The planarization layer 117 may be arranged to cover the source electrodes S1 and S2 and the drain electrodes D1 and D2. The planarization layer 117 may have a flat upper surface such that a first pixel electrode 121 and a second pixel electrode 121', which are arranged on the planarization layer 117, are formed flat.

The planarization layer 117 may include an organic material or an inorganic material and may have a single layer structure or a multi-layer structure. The planarization layer 117 may include a commercial polymer such as benzocyclobutene (BCB), polyimide, hexamethyldisiloxane (HMDSO), polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The planarization layer 117 may include an inorganic insulating material such as $SiO_2$, $SiN_x$, SiON, $Al_2O_3$, $TiO_2$, $Ta_2O_5$, $HfO_2$, or $ZnO_2$. When forming the planarization layer 117, chemical mechanical polishing may be performed on the upper surface of a layer to provide a flat upper surface after the layer is formed.

The planarization layer 117 may have a second hole H2 corresponding to the transmissive portion TA. The second hole H2 may overlap the first hole H1. FIG. 8 illustrates that the second hole H2 is larger than the first hole H1. However, the present disclosure is not limited thereto. For example, in another embodiment, the planarization layer 117 may cover or overlap the edge of the first hole H1 of the inorganic insulating layer IIL, and thus, the area of the second hole H2 may be less than the area of the first hole H1.

In an embodiment, the planarization layer 117 may include a first planarization layer 117a and a second planarization layer 117b. Accordingly, a conductive pattern such as a wiring line may be formed between the first planarization layer 117a and the second planarization layer 117b, thereby being advantageous for high integration.

The first planarization layer 117a may be arranged to cover the main and auxiliary pixel circuits PC and PC'. The second planarization layer 117b may be arranged on the first planarization layer 117a and may have a flat upper surface such that the first and second pixel electrodes 121 and 121' are formed flat. Each of the first planarization layer 117a and the second planarization layer 117b may include an organic material or an inorganic material and may have a single layer structure or a multi-layer structure.

Connection electrodes, that is, a main connection electrode CM and an auxiliary connection electrode CM', may be arranged between the first planarization layer 117a and the second planarization layer 117b. Each of the main connection electrode CM and the auxiliary connection electrode CM' may include a conductive material including Mo, Al, Cu, Ti, or the like and may include a single layer or multiple layers including the abovementioned materials. For example, each of the main connection electrode CM and the auxiliary connection electrode CM' may have a multi-layer structure of Ti/Al/Ti.

The first planarization layer 117a may have a via hole exposing one of the first source electrode S1 and the first drain electrode D1 of the main thin-film transistor TFT, and the main connection electrode CM may contact the first source electrode S1 or the first drain electrode D1 through the via hole and be connected (e.g., electrically connected) to the main thin-film transistor TFT. In addition, the first planarization layer 117a may have a via hole exposing one of the second source electrode S2 and the second drain electrode D2 of the auxiliary thin-film transistor TFT', and the auxiliary connection electrode CM' may contact the second source electrode S2 or the second drain electrode D2 through the via hole and be connected (e.g., electrically connected) to the auxiliary thin-film transistor TFT'.

Organic light-emitting diodes, that is, the main organic light-emitting diode OLED and the auxiliary organic light-emitting diode OLED', are arranged on the second planarization layer 117b. The first and second pixel electrodes 121 and 121' of the main and auxiliary organic light-emitting diodes OLED and OLED' may be respectively connected to the main and auxiliary pixel circuits PC and PC' through the main and auxiliary connection electrodes CM and CM' arranged on the planarization layer 117.

The first pixel electrode 121 and the second pixel electrode 121' may each include a conductive oxide such as ITO, IZO, ZnO, In$_2$O$_3$, IGO, or AZO. The first pixel electrode 121 and the second pixel electrode 121' may each include a reflective layer including Ag, Mg, Al, Pt, Pd, Au, Ni, Nd, Ir, Cr, or a compound thereof. For example, the first pixel electrode 121 and the second pixel electrode 121' may each have a structure including layers including ITO, IZO, ZnO, or In$_2$O$_3$ above or below the reflective layer. In this case, the first pixel electrode 121 and the second pixel electrode 121' may each have a stacked structure of ITO/Ag/ITO.

A pixel-defining layer 119 may cover the edges of the first pixel electrode 121 and the second pixel electrode 121' on the planarization layer 117 and may have a first opening OP1 and a second opening OP2 respectively exposing a central portion of the first pixel electrode 121 and a central portion of the second pixel electrode 121'. The first opening OP1 and the second opening OP2 define the sizes and shapes of light-emitting regions of the main and auxiliary organic light-emitting diodes OLED and OLED', that is, the sizes and shapes of the main and auxiliary sub-pixels Pm and Pa, respectively.

The pixel-defining layer 119 may increase the distance between the edges of the first and second pixel electrodes 121 and 121' and an opposite electrode 123 above the first and second pixel electrodes 121 and 121', thereby preventing or reducing the occurrence of arcs at the edges of the first and second pixel electrodes 121 and 121'. The pixel-defining layer 119 may include an organic insulating material such as polyimide, polyamide, acrylic resin, BCB, HMDSO, or phenol resin and may be formed by spin coating or the like.

The pixel-defining layer 119 may have a third hole H3 located in the transmissive portion TA. The third hole H3 may overlap the first hole H1 and the second hole H2. The light transmittance in the transmissive portion TA may be improved by the first hole H1, the second hole H2, and the third hole H3. A portion of the opposite electrode 123, which may be described in more detail below, may be arranged on the inner surfaces of the first hole H1, the second hole H2, and the third hole H3.

A first emission layer 122b and a second emission layer 122b' formed to respectively correspond to the first pixel electrode 121 and the second pixel electrode 121' may be respectively arranged inside the first opening OP1 and the second opening OP2 of the pixel-defining layer 119. Each of the first emission layer 122b and the second emission layer 122b' may include a high molecular weight material or a low molecular weight material and may emit red, green, blue, or white light.

An organic functional layer 122e may be arranged above and/or below the first emission layer 122b and the second emission layer 122b'. The organic functional layer 122e may include a first functional layer 122a and/or a second functional layer 122c. In some embodiments, the first functional layer 122a or the second functional layer 122c may be omitted.

The first functional layer 122a may be arranged under the first emission layer 122b and the second emission layer 122b'. The first functional layer 122a may include a single layer or multiple layers including an organic material. The first functional layer 122a may be a hole transport layer (HTL) having a single layer structure. Alternatively, the first functional layer 122a may include a hole injection layer (HIL) and an HTL. The first functional layer 122a may be integrally formed to correspond to the main organic light-emitting diode OLED and the auxiliary organic light-emitting diode OLED' respectively included in the main display area MDA and the component area CA.

The second functional layer 122c may be arranged on the first emission layer 122b and the second emission layer 122b'. The second functional layer 122c may include a single layer or multiple layers including an organic material. The second functional layer 122c may include an electron transport layer (ETL) and/or an electron injection layer (EIL). The second functional layer 122c may be integrally formed to correspond to the main organic light-emitting diode OLED and the auxiliary organic light-emitting diode OLED' respectively included in the main display area MDA and the component area CA.

The opposite electrode 123 is arranged on the second functional layer 122c. The opposite electrode 123 may include a conductive material having a low work function. For example, the opposite electrode 123 may include a (semi) transparent layer including Ag, Mg, Al, Pt, Pd, Au, Ni, Nd, Ir, Cr, Li, Ca, or an alloy thereof. Alternatively, the opposite electrode 123 may further include a layer including ITO, IZO, ZnO, or In$_2$O$_3$ on the (semi) transparent layer including the aforementioned material. The opposite electrode 123 may be integrally formed to correspond to the main organic light-emitting diode OLED and the auxiliary organic light-emitting diode OLED' respectively included in the main display area MDA and the component area CA.

Layers from the first pixel electrode 121 to the opposite electrode 123, which are formed in the main display area MDA, may form the main organic light-emitting diode OLED. Layers from the second pixel electrode 121' to the opposite electrode 123, which are formed in the component area CA, may form the auxiliary organic light-emitting diode OLED'.

An upper layer 150 including an organic material may be formed on the opposite electrode 123. The upper layer 150 may be a layer provided to protect the opposite electrode 123 and increase light extraction efficiency. The upper layer 150 may include an organic material having a higher refractive index than the opposite electrode 123. Alternatively, the upper layer 150 may be provided by stacking layers having different refractive indices. For example, the upper layer 150 may be provided by sequentially stacking a high refractive index layer, a low refractive index layer, and a high refractive index layer. In this case, the refractive index of the high refractive index layer may be about 1.7 or more, and the refractive index of the low refractive index layer may be about 1.3 or less.

The upper layer 150 may additionally include LiF. Alternatively, the upper layer 150 may additionally include an inorganic insulating material such as silicon oxide $SiO_2$ or silicon nitride SiNx.

The first functional layer 122a, the second functional layer 122c, the opposite electrode 123, and the upper layer 150 may include a transmission hole TAH corresponding to the transmissive portion TA. That is, the first functional layer 122a, the second functional layer 122c, the opposite electrode 123, and the upper layer 150 may respectively have openings corresponding to the transmissive portion TA. The areas of the openings may be substantially the same. For example, the area of an opening of the opposite electrode 123 may be substantially the same as the area of the transmission hole TAH.

That the transmission hole TAH corresponds to the transmissive portion TA refers to the transmission hole TAH overlapping the transmissive portion TA. In this case, the area of the transmission hole TAH may be less than the area of the first hole H1 formed in the inorganic insulating layer IIL. The area of the transmission hole TAH may be defined as the area of an opening having the smallest area from among openings constituting the transmission hole TAH. The area of the first hole H1 may also be defined as the area of an opening having the smallest area from among openings constituting the first hole H1.

Due to the transmission hole TAH, a portion of the opposite electrode 123 does not exist in the transmissive portion TA (i.e., the opposite electrode 123 is not arranged in the transmissive portion TA), and thus, the light transmittance in the transmissive portion TA may be increased (e.g., significantly increased). The opposite electrode 123 having the transmission hole TAH may be formed in various suitable ways. In an embodiment, the opposite electrode 123 having the transmission hole TAH may be formed by forming a layer, with a material for forming the opposite electrode 123, on the front surface of the substrate 100, and then removing a portion of the opposite electrode 123 corresponding to the transmissive portion TA through laser lift-off. In another embodiment, the opposite electrode 123 having the transmission hole TAH may be formed through a metal self patterning (MSP) method. In another embodiment, the opposite electrode 123 having the transmission hole TAH may be formed by a method of depositing the opposite electrode 123 by using a fine metal mask (FMM).

In some embodiments, in order to increase the light transmittance of the transmissive portion TA, a groove is formed in the substrate 100 or the buffer hole 111H, the first hole H1, the second hole H2, and the third hole H3, each corresponding to the transmissive portion TA, are respectively formed in the buffer layer 111, the inorganic insulating layer IIL, the planarization layer 117, and the pixel-defining layer 119 has been described above as an example. However, the disclosure is not limited thereto.

For example, because each of the substrate 100, the buffer layer 111, the inorganic insulating layer IIL, the planarization layer 117, and the pixel-defining layer 119 of the display panel 10 may include a material having a high light transmittance, the buffer hole 111H, the first hole H1, the second hole H2, and/or the third hole H3 may not be provided depending on the type of the component 40 (e.g., see FIG. 2) arranged under the component area CA.

Figure 9:
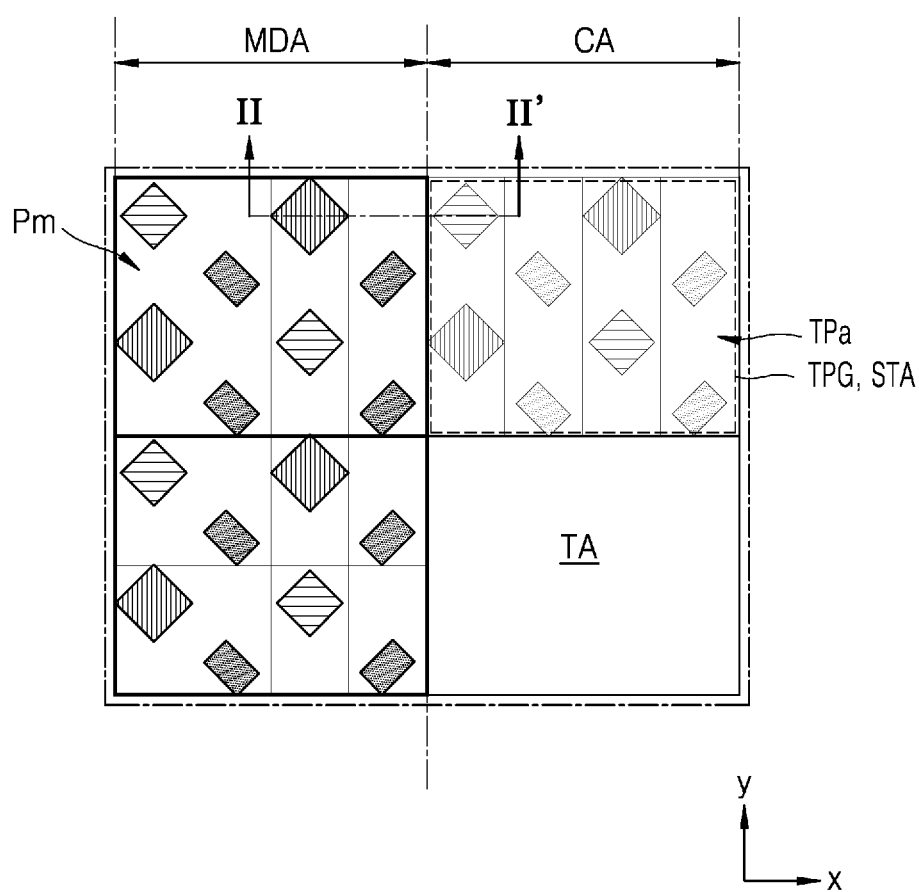
FIG. 9 is a schematic layout diagram illustrating a pixel arrangement structure in a main display area and a component area according to an embodiment.

FIG. 9 is a schematic layout diagram illustrating a pixel arrangement structure in a main display area MDA and a component area CA according to an embodiment.

Referring to FIG. 9, a transparent auxiliary sub-pixel TPa may be arranged in the component area CA. The transparent auxiliary sub-pixel TPa may be implemented by a display element having a different transmittance from a main sub-pixel Pm arranged in the main display area MDA. For example, a pixel electrode of a display element that implements the transparent auxiliary sub-pixel TPa may be provided as a transparent electrode, and a pixel electrode of a display element that implements the main sub-pixel Pm of the main display area MDA may include a reflective layer. Accordingly, an area in which a transparent pixel group TPG including transparent auxiliary sub-pixels TPa is arranged may be a semi-transmission area STA through which light partially transmits. That is, the semi-transmission area STA may be defined as an area having a higher light transmittance than the main display area MDA and a lower light transmittance compared to the transmissive portion TA in which an auxiliary sub-pixel is not arranged. As the transparent pixel group TPG is arranged in the component area CA, it is possible to increase the resolution while securing or increasing the light transmittance of the component area CA.

FIG. 9 illustrates that the transmissive portion TA is arranged in the component area CA, but when a semi-transmission area STA is arranged, only the semi-transmission area STA may be arranged in the component area CA.

The shape and pixel arrangement structure of the transparent auxiliary sub-pixels TPa arranged in the semi-transmission area STA may be variously modified in a suitable manner. For example, the transparent auxiliary sub-pixels TPa may be arranged in a pentile structure as shown in FIG. 9. Alternatively, the transparent auxiliary sub-pixels TPa may be arranged in a stripe structure.

Figure 10:
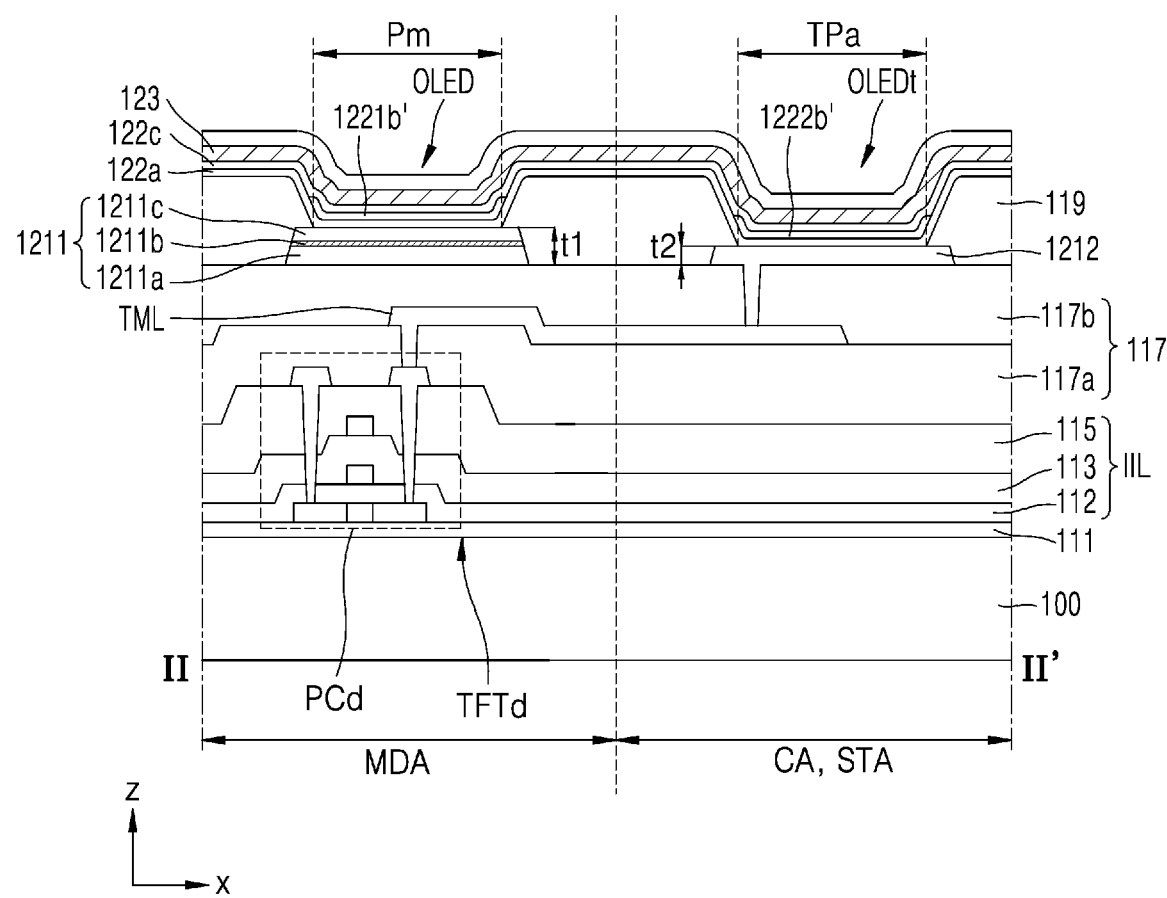
FIG. 10 is a cross-sectional view illustrating a main display area and a component area according to an embodiment.

FIG. 10 is a cross-sectional view illustrating a main display area MDA and a component area CA according to an embodiment. FIG. 10 is a schematic cross-sectional view of a display panel taken along the line II-II' of FIG. 9. In FIG. 10, the same reference numerals as those in FIG. 8 denote the same members, and thus, repeated descriptions thereof may be omitted.

Referring to FIG. 10, a main sub-pixel Pm may be arranged in a main display area MDA, and a transparent auxiliary sub-pixel TPa may be arranged in a component area CA. The main sub-pixel Pm may correspond to a main organic light-emitting diode OLED, and the transparent auxiliary sub-pixel TPa may correspond to a light emitting-region of a transparent organic light-emitting diode OLEDt. The transparent organic light-emitting diode OLEDt denotes an organic light-emitting diode in which a pixel electrode is provided as a transparent electrode.

The main organic light-emitting diode OLED may be provided by sequentially stacking a first pixel electrode 1211, a first functional layer 122a, a first emission layer 1221b', a second functional layer 122c, and an opposite electrode 123. The transparent organic light-emitting diode OLEDt may be provided by sequentially stacking a transparent pixel electrode 1212, the first functional layer 122a, a second emission layer 1222b', the second functional layer 122c, and the opposite electrode 123.

The first pixel electrode 1211 of the main organic light-emitting diode OLED may include a reflective layer 1211b. As the reflective layer 1211b is included in the first pixel electrode 1211, light generated in the first emission layer 1221b' may be reflected by the reflective layer 1211b and emitted in an upper direction (+z direction) of a substrate 100. That is, the emission light efficiency in the upper direction of the substrate 100 may be increased. In some embodiments, the first pixel electrode 1211 may be provided by sequentially stacking a first transparent electrode layer 1211a, a reflective layer 1211b, and a second transparent electrode layer 1211c.

The first transparent electrode layer 1211a and the second transparent electrode layer 1211c may each include a transparent conductive oxide such as ITO, IZO, ZnO, $In_2O_3$, IGO, or AZO.

The reflective layer 1211b may include Ag, Mg, Al, Pt, Pd, Au, Ni, Nd, Ir, Cr, or a compound thereof.

The transparent pixel electrode 1212 of the transparent organic light-emitting diode OLEDt may not include a reflective layer and may include a transparent conductive material. The transparent pixel electrode 1212 may include a transparent conductive oxide such as ITO, IZO, ZnO, $In_2O_3$, IGO, or AZO.

Because the transparent pixel electrode 1212 does not include a reflective layer and includes a transparent conductive material, external light may be at least partially transmitted through the transparent pixel electrode 1212. That is, light and/or a signal emitted from the component 40 (e.g., see FIG. 2) or light and/or a signal incident on the component 40 may pass through the transparent organic light-emitting diode OLEDt. An area in which the transparent organic light-emitting diode OLEDt is arranged is referred to as a semi-transmission area STA. The semi-transmission area STA may be an area in which a display element capable of transmitting light is arranged and a light transmittance is less than that of the transmissive portion TA.

Because the transparent pixel electrode 1212 of the transparent organic light-emitting diode OLEDt does not include a reflective layer, light generated in the second emission layer 1222b' may be emitted towards the upper and lower sides of the substrate 100. Accordingly, the light emission rate of the transparent organic light-emitting diode OLEDt in the upward direction of the substrate 100 may be less than the light emission rate of the main organic light-emitting diode OLED in the upward direction of the substrate 100. That is, the luminance of the main sub-pixel Pm may be greater than that of the transparent auxiliary sub-pixel TPa under the same conditions.

The transparent pixel electrode 1212 may be formed at the same time (e.g., concurrently or simultaneously) when the first transparent electrode layer 1211a of the first pixel electrode 1211 is formed. Alternatively, a portion of the transparent pixel electrode 1212 may be formed when the first transparent electrode layer 1211a of the first pixel electrode 1211 is formed, and the remaining portion of the transparent pixel electrode 1212 may be formed when the second transparent electrode layer 1211c of the first pixel electrode 1211 is formed. Accordingly, a thickness t2 of the transparent pixel electrode 1212 may be less than a thickness t1 of the first pixel electrode 1211.

The first emission layer 1221b' of the main organic light-emitting diode OLED may emit light of the same color as the second emission layer 1222b' of the transparent organic light-emitting diode OLEDt. Alternatively, the first emission layer 1221b' of the main organic light-emitting diode OLED may emit light of a different color from the second emission layer 1222b' of the transparent organic light-emitting diode OLEDt.

In some embodiments, the main organic light-emitting diode OLED may be driven by a first pixel circuit. Furthermore, in an embodiment, the transparent organic light-emitting diode OLEDt may be driven by a dummy pixel circuit PCd. The dummy pixel circuit PCd may include a dummy thin-film transistor TFTd, and the dummy thin-film transistor TFTd may be spaced from the component area CA. In some embodiments, the dummy thin-film transistor TFTd may be arranged in the main display area MDA. Alternatively, the dummy thin-film transistor TFTd may be arranged in the peripheral area DPA of FIG. 2.

In an embodiment, the dummy thin-film transistor TFTd may be connected to the transparent organic light-emitting diode OLEDt through a transparent wiring line TML. In some embodiments, the transparent wiring line TML includes a transparent conductive material and refers to a wiring line having a relatively high light transmittance. In an embodiment, the transparent wiring line TML may extend from the main display area MDA to the component area CA. In some embodiments, the transparent wiring line TML may be arranged to minimize or reduce overlap with the transparent organic light-emitting diode OLEDt.

In an embodiment, the transparent wiring line TML may be arranged between the first planarization layer 117a and the second planarization layer 117b in the thickness direction (e.g., the z-direction). However, the disclosure is not limited thereto and the transparent wiring line TML may be arranged between the inorganic insulating layer IIL and the planarization layer 117 in the thickness direction (e.g., the z-direction).

The transparent wiring line TML may include a transparent conductive material. The transparent wiring line TML may include a transparent conductive oxide such as ITO, IZO, ZnO, $In_2O_3$, IGO, or AZO. Therefore, light generated in the second emission layer 1222b' of the transparent organic light-emitting diode OLEDt may pass through the transparent wiring line TML and be emitted towards the lower side of the substrate 100.

As described above, embodiments in which a display area is expanded to display an image even in an area where a component, which is an electronic element, is arranged may be applied to various display devices. For example, the embodiments may be applied to a foldable display device, a rollable display device, and/or the like. That is, the embodiments described with reference to FIGS. 1-10 may be applied to a foldable display device and/or a rollable display device. Hereinafter, embodiments of the foldable display device, the rollable display device, and the display device may be described in more detail with reference to the drawings.

Figure 11A:
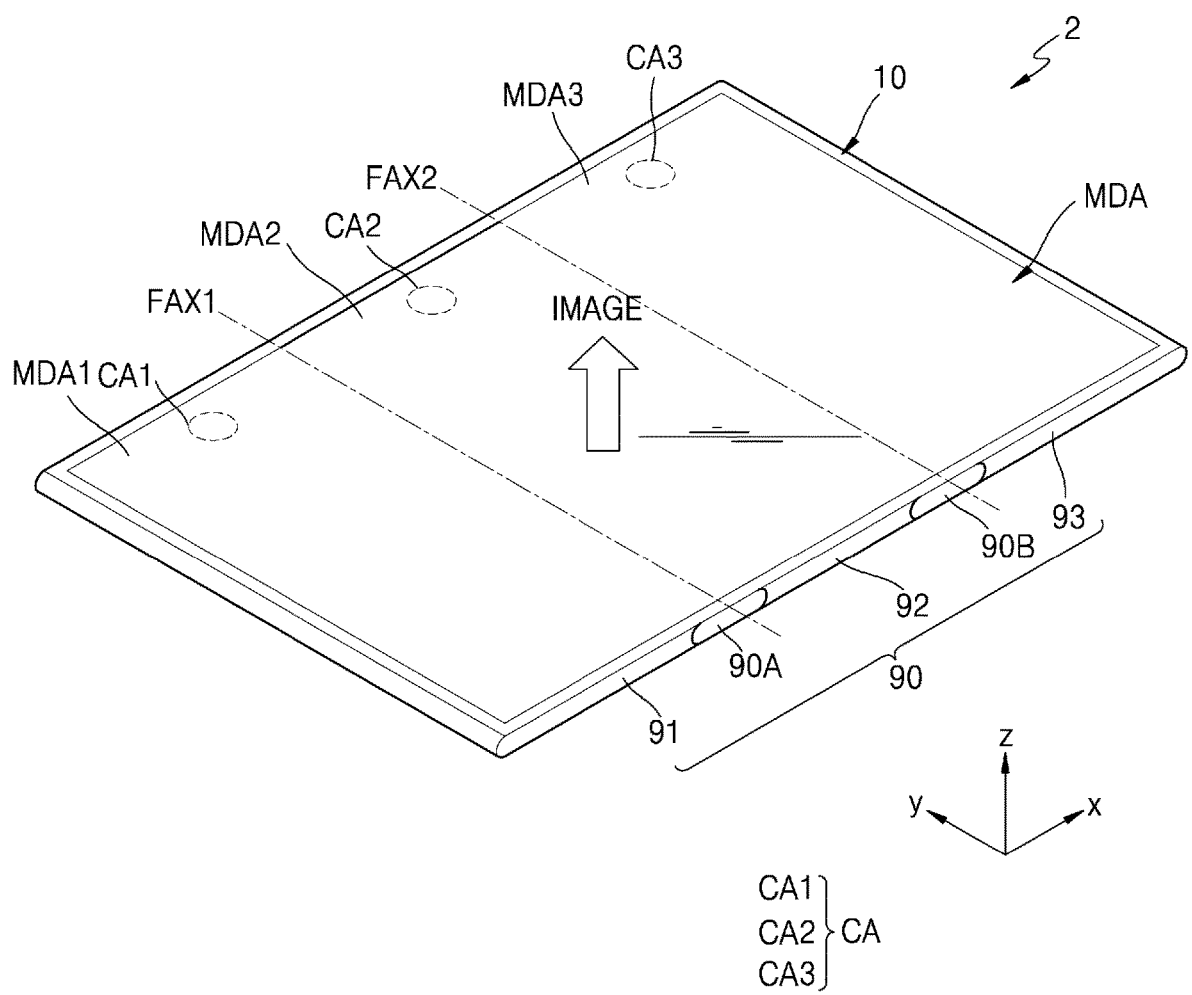
FIGS. 11A and 11B are schematic perspective views illustrating a foldable display device according to an embodiment.
Figure 11B:
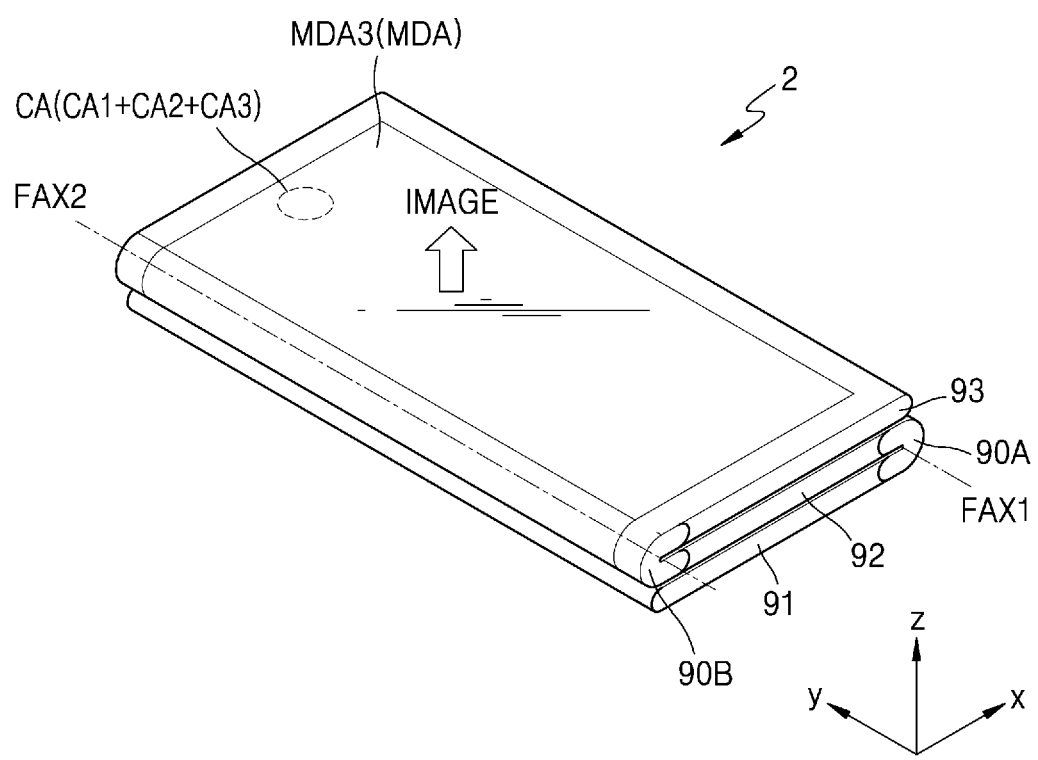
Figure 11C:
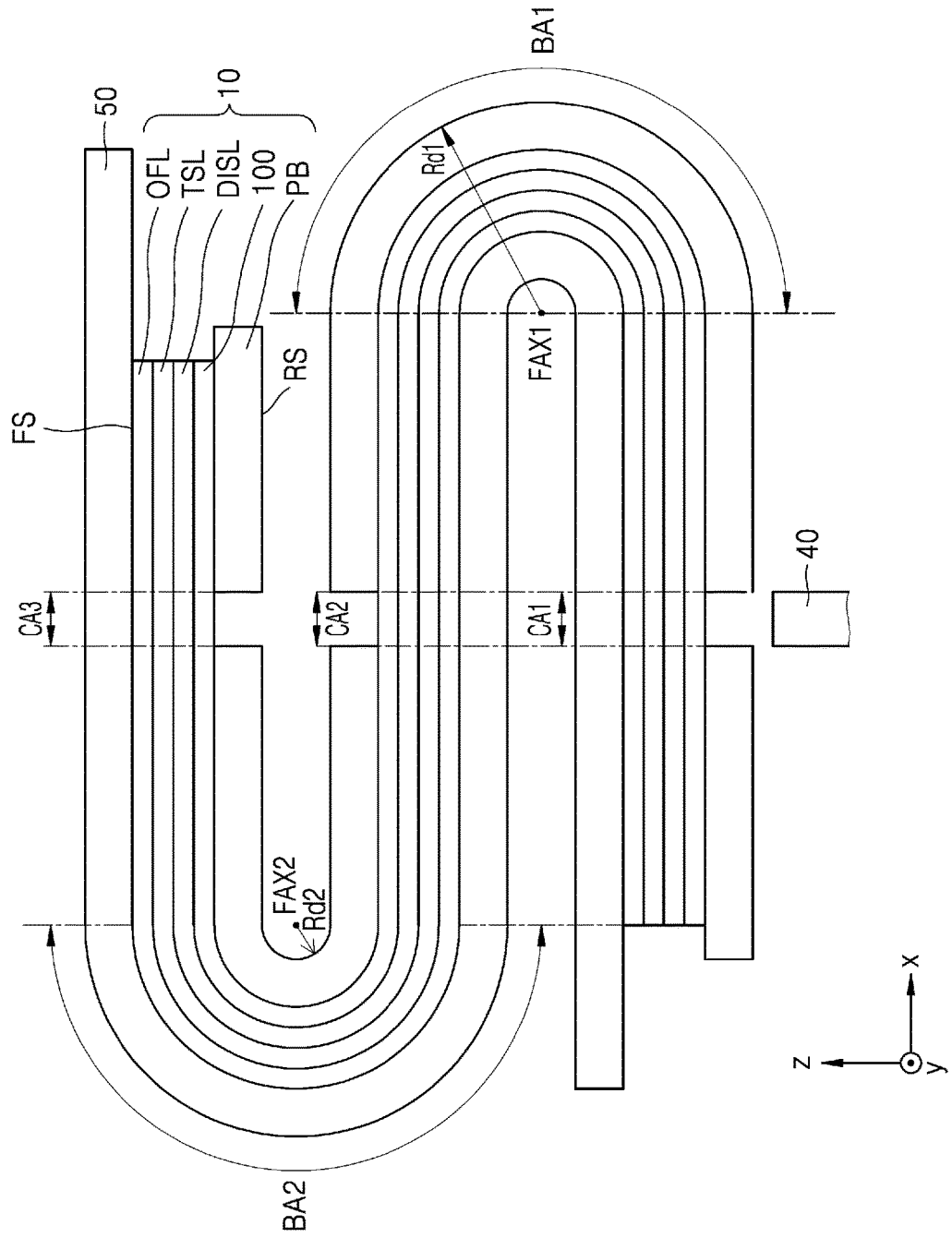
FIG. 11C is a schematic cross-sectional view illustrating a portion of a foldable display device according to an embodiment.

FIGS. 11A and 11B are schematic perspective views illustrating a foldable display device 2 according to an embodiment. FIG. 11C is a schematic cross-sectional view illustrating a portion of a foldable display device according to an embodiment. FIG. 11A is a perspective view showing a state in which the foldable display device 2 is unfolded, and FIG. 11B is a perspective view showing a state in which the foldable display device 2 is folded. FIG. 11C is a cross-sectional view showing a state in which a foldable display device is folded.

Referring to FIG. 11A, the foldable display device 2 may include a display panel 10 and a lower cover 90. The lower cover 90 may include a first portion 91, a second portion 92, and a third portion 93, which support the display panel 10. The lower cover 90 may be folded around or about a first folding axis FAX1 between the first portion 91 and the second portion 92. In addition, the lower cover 90 may be folded around or about a second folding axis FAX2 between the second portion 92 and the third portion 93. In an embodiment, a first hinge portion 90A may be included between the first portion 91 and the second portion 92, and a second hinge portion 90B may be included between the second portion 92 and the third portion 93. Accordingly, the lower cover 90 may be folded around or about a first folding axis FAX1 at the first hinge portion 90A, and the lower cover 90 may be folded around or about a second folding axis FAX2 at the second hinge portion 90B.

The display panel 10 may include a main display area MDA and a component area CA. The main display area MDA may at least partially surround the component area CA. In some embodiments, the main display area MDA may encircle the component area CA. In an embodiment, the component area CA may include a first component area CA1, a second component area CA2, and a third component area CA3. In the illustrated embodiment, the first component area CA1, the second component area CA2, and the third component area CA3 may be spaced from each other.

The main display area MDA and the component area CA may display images. In this case, the display panel 10 may be folded around or about the first folding axis FAX1 and the second folding axis FAX2, which cross the main display area MDA. Hereinafter, for convenience of description, areas arranged at respective sides of the first folding axis FAX1 in the main display area MDA are referred to as a first main display area MDA1 and a second main display area MDA2 as shown in FIG. 11A. Areas arranged at respective sides of the second folding axis FAX2 in the main display area MDA are referred to as the second main display area MDA2 and a third main display area MDA3 as shown in FIG. 11A.

In this case, the first component area CA1 and the second component area CA2 may be symmetrically arranged based on or about the first folding axis FAX1, and the second component area CA2 and the third component area CA3 may be symmetrically arranged based on or about the second folding axis FAX2.

In an embodiment, the first main display area MDA1 and the second main display area MDA2 may be folded to face each other based on the first folding axis FAX1. That is, the first portion 91 and the second portion 92 may be folded so as not to face each other (e.g., face away from each other) based on the first folding axis FAX1. However, the present disclosure is not limited thereto. For example, in another embodiment, the first main display area MDA1 and the second main display area MDA2 may be folded so as not to face each other (e.g., face away from each other) based on the first folding axis FAX1. That is, the first portion 91 and the second portion 92 may be folded to face each other based on the first folding axis FAX1.

In an embodiment, the second main display area MDA2 and the third main display area MDA3 may be folded to face each other based on the second folding axis FAX2. That is, the second portion 92 and the third portion 93 may be folded so as not to face each other (e.g., face away from each other) based on the second folding axis FAX2. However, the present disclosure is not limited thereto. For example, in another embodiment, the second main display area MDA2 and the third main display area MDA3 may be folded so as not to face each other (e.g., face away from each other) based on the second folding axis FAX2. That is, the second portion 92 and the third portion 93 may be folded to face each other based on the second folding axis FAX2.

Hereinafter, a case where, as shown in FIGS. 11B and 11C, the first main display area MDA1 and the second main display area MDA2 are folded to face each other based on the first folding axis FAX1 and the second portion 92 and the third portion 93 are folded to face each other based on the second folding axis FAX2 may be described in more detail below.

In the illustrated embodiment, the display panel 10 may have a front surface FS and a rear surface RS opposite to the front surface FS. The front surface FS of the display panel 10, which is a surface displaying an image, may face or be attached to a cover window 50. That is, the front surface FS of the display panel 10 may be a surface having the first component area CA1, the second component area CA2, the third component area CA3, and the main display area MDA. In other words, the first component area CA1, the second component area CA2, the third component area CA3, and the main display area MDA may be defined on the front surface FS of the display panel 10. The rear surface RS of the display panel 10 may be a lower surface of the panel protection member PB.

The foldable display device 2 may be folded such that two areas of the front surface FS of the display panel 10 face each other with respect to one of the first folding axis FAX1 and the second folding axis FAX2. In addition, the foldable display device 2 may be folded such that two areas of the rear surface RS of the display panel 10 face each other with respect to the other one of the first folding axis FAX1 and the second folding axis FAX2. For example, the display panel 10 may be arranged such that two areas of the front surface FS of the display panel 10 face each other with respect to the first folding axis FAX1, and the display panel 10 may be arranged such that two areas of the rear surface RS of the display panel 10 face each other with respect to the second folding axis FAX2.

In an embodiment, the display panel 10 may include a first bending area BA1 and a second bending area BA2. The first bending area BA1 is an area of the display panel 10, which is bent based on the first folding axis FAX1, and the second bending area BA2 is an area of the display panel 10, which is bent based on the second folding axis FAX2. In an embodiment, the curvature of the first bending area BA1 may be different from the curvature of the second bending area BA2. That is, the radius of curvature Rd1 of the first bending area BA1 may be different from the radius of curvature Rd2 of the second bending area BA2. In this case, the radius of curvature Rd1 of the first bending area BA1 denotes the distance from the first folding axis FAX1 to the rear surface RS of the display panel 10. The radius of curvature Rd2 of the second bending area BA2 denotes the distance from the second folding axis FAX2 to the rear surface RS of the display panel 10.

In an embodiment, the radius of curvature Rd1 of the first bending area BA1 may be greater than the radius of curvature Rd2 of the second bending area BA2. In another embodiment, the radius of curvature Rd1 of the first bending area BA1 may be less than the radius of curvature Rd2 of the second bending area BA2.

In the illustrated embodiment, in a state in which the foldable display device 2 is folded around or about the first folding axis FAX1 and the second folding axis FAX2, the first component area CA1, the second component area CA2, and the third component area CA3 may overlap one another on a plane. In this case, that the first component area CA1, the second component area CA2, and the third component area CA3 overlap one another on a plane denotes that the first component area CA1, the second component area CA2, and the third component area CA3 at least partially overlap one another in the z direction. In other words, the first component area CA1, the second component area CA2, and the third component area CA3 may overlap one another in a plan view when the foldable display device 2 is folded around or about the first folding axis FAX1 and the second folding axis FAX2. Although FIG. 11C illustrates that the first component area CA1, the second component area CA2, and the third component area CA3 completely overlap one another in the z direction, the disclosure is not limited thereto. For example, the first component area CA1, the second component area CA2, and the third component area CA3 may only partially overlap one another in the z direction. In addition, the sizes and shapes of the first component area CA1, the second component area CA2, and the third component area CA3 may be variously changed in a suitable manner.

The component 40 may be arranged under the display panel 10. In this case, the component 40 may overlap the first component area CA1 or the third component area CA3 while the display panel 10 is unfolded. FIG. 11C illustrates that the component 40 overlaps the first component area CA1. In another embodiment, the component 40 may overlap the third component area CA3 while the display panel 10 is unfolded. Hereinafter, a case where the component 40 overlaps the first component area CA1 may be described in more detail below.

In the illustrated embodiment, the embodiment described with reference to FIG. 8 may be applied to portions of the display panel 10 corresponding to the second component area CA2 and the third component area CA3.

In the illustrated embodiment, in a state in which the foldable display device 2 is folded around or about the first folding axis FAX1 and the second folding axis FAX2, the first component area CA1, the second component area CA2, and the third component area CA3 may overlap one another on a plane. In other words, the first component area CA1, the second component area CA2, and the third component area CA3 may overlap one another in a plan view when the foldable display device 2 is folded around or about the first folding axis FAX1 and the second folding axis FAX2. Therefore, even when the foldable display device 2 is folded, overlapping component areas may maintain high light transmittance and/or acoustic transmittance.

Figure 12A:
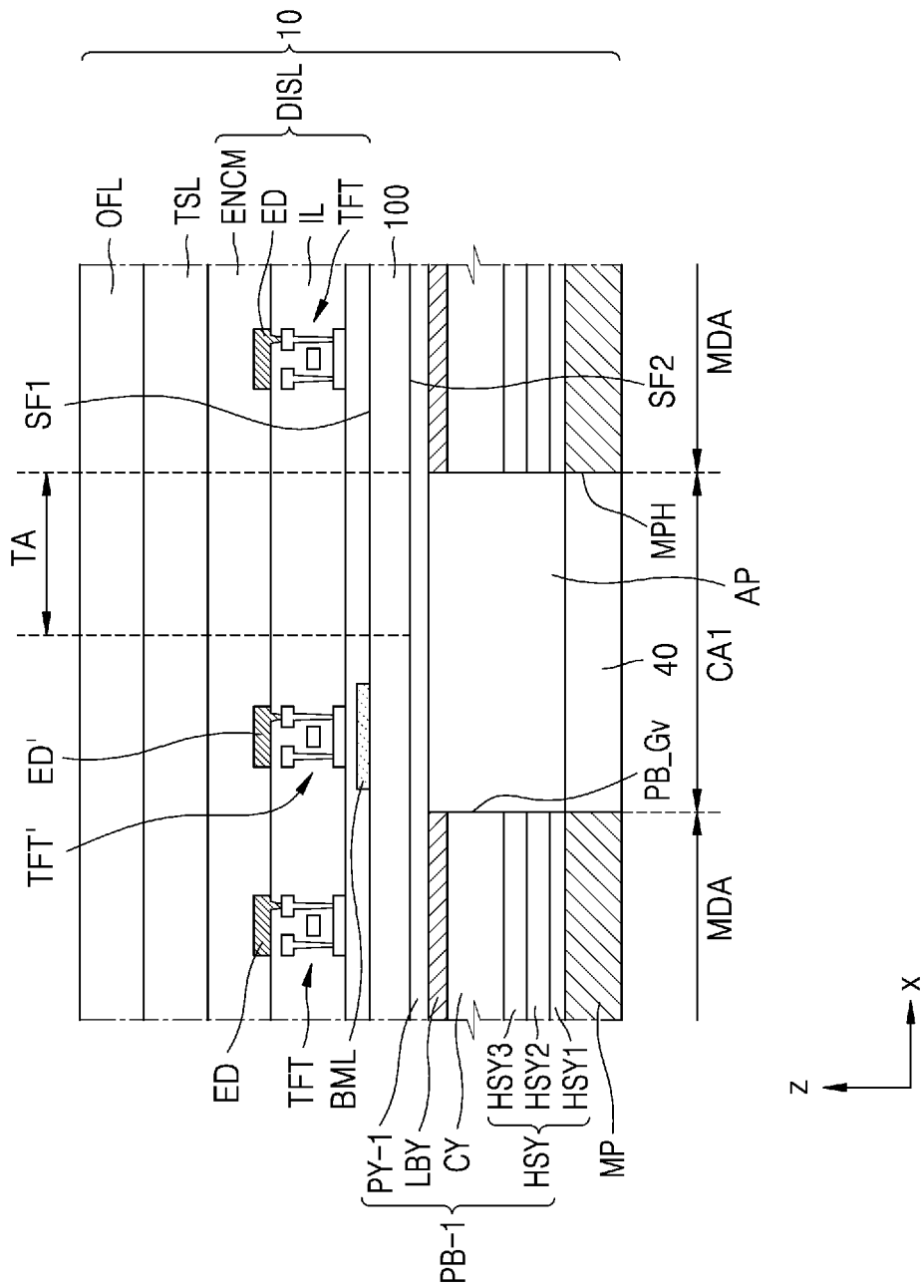
FIGS. 12A and 12B are schematic cross-sectional views illustrating a portion of a foldable display device according to an embodiment.
Figure 12B:
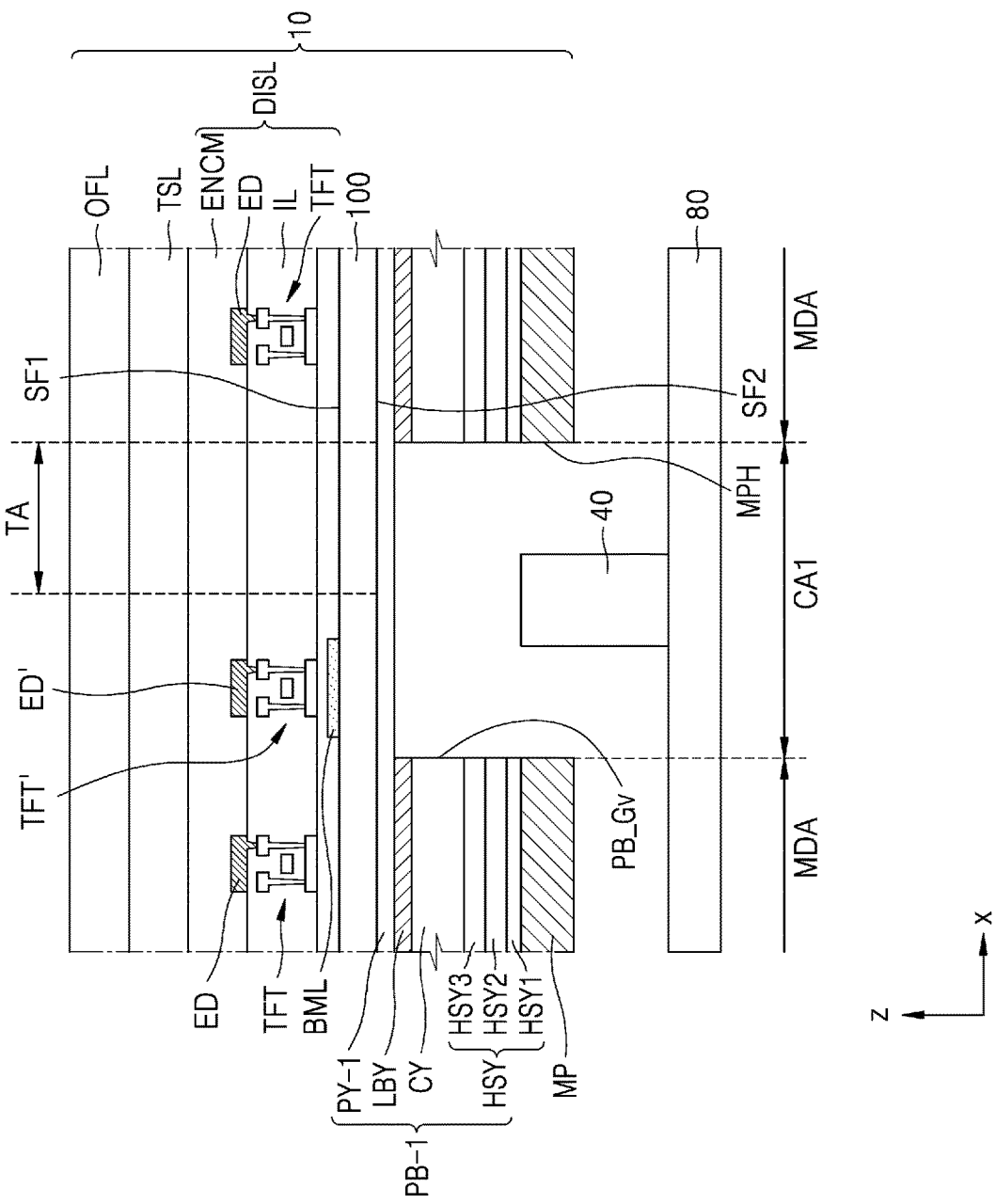

FIGS. 12A and 12B are schematic cross-sectional views illustrating a portion of a foldable display device according to an embodiment. In FIGS. 12A and 12B, the same reference numerals as those in FIGS. 4A-4E denote the same members, and thus, repeated descriptions thereof may be omitted.

Referring to FIGS. 12A and 12B, the foldable display device may include a display panel 10 and a component 40 overlapping the display panel 10. The display panel 10 may include a first component area CA1 that is an area overlapping the component 40, and a main display area MDA where a main image is displayed. The display panel 10 may include a substrate 100, and a display layer DISL, a touch screen layer TSL, and an optical functional layer OFL, which are arranged (e.g., arranged sequentially) on a first surface SF1 of the substrate 100. In addition, a panel protection member PB-1 may be arranged on a second surface SF2 opposite to the first surface SF1 of the substrate 100. In this case, it may be said that the component 40 is arranged on the second surface SF2 of the substrate 100.

In the illustrated embodiment, the panel protection member PB-1 may include a protective layer PY-1, a light-blocking layer LBY, a cushion layer CY, and a heat dissipation layer HSY. The protective layer PY-1 may be attached to the lower surface of the substrate 100 and protect the substrate 100 from the outside. For example, the protective layer PY-1 may absorb a physical impact from the outside or block or substantially block foreign substances or moisture from penetrating into the display layer DISL. The protective layer PY-1 may be coated on the lower surface of the substrate 100 or attached, in a film form, to the lower surface of the substrate 100.

In the illustrated embodiment, the protective layer PY-1 may be continuously arranged in the main display area MDA and the first component area CA1. In a case where the component 40 is a camera, when the protective layer PY-1 has an opening corresponding to the first component area CA1, diffraction of light incident on the component 40 or diffraction of light emitted from the component 40 may occur. However, in the illustrated embodiment, because the protective layer PY-1 is continuously arranged in the main display area MDA and the first component area CA1, a lower retardation may be provided compared to a case where the protective layer PY-1 has an opening corresponding to the first component area CA1.

In the illustrated embodiment, the heat dissipation layer HSY may include a first heat dissipation layer HSY1, a second heat dissipation layer HSY2, and a third heat dissipation layer HSY3, which are sequentially stacked. The first heat dissipation layer HSY1 may include a metal thin film such as copper, nickel, ferrite, and/or silver, which is capable of shielding electromagnetic waves and has excellent thermal conductivity. The first heat dissipation layer HSY1 may be a double-sided adhesive arranged between a metal plate MP to be described in more detail below and the second heat dissipation layer HSY2. The second heat dissipation layer HSY2 may include graphite, carbon nanotubes, and/or the like. The third heat dissipation layer HSY3 may include polyimide. The third heat dissipation layer HSY3 may be a double-sided adhesive arranged between the second heat dissipation layer HSY2 and the cushion layer CY.

In the illustrated embodiment, the panel protection member PB-1 may include a protection member groove PB_Gv corresponding to the first component area CA1. That is, the protection member groove PB_Gv may be formed of or defined by an opening of the light-blocking layer LBY, an opening of the cushion layer CY, an opening of the heat dissipation layer HSY, and a lower surface of the protective layer PY-1.

In the illustrated embodiment, the metal plate MP may be further arranged under the panel protection member PB-1. The metal plate MP may include a high modulus material. For example, the metal plate MP may include at least one selected from the group consisting of Invar, Nobinite, Stainless, and an alloy thereof. Because the metal plate MP may include a high modulus material, the metal plate MP may not be deformed even though the operation of folding the display panel 10 is repeated.

In the illustrated embodiment, the metal plate MP may have a plate through hole MPH corresponding to the protection member groove PB_Gv. That is, the metal plate MP may have a plate through hole MPH corresponding to the component 40. In this case, in an embodiment, the component 40 may be arranged through or in the plate through hole MPH.

Referring to FIG. 12A, the component 40 may be attached to the display panel 10. In an embodiment, the component 40 may be attached to the metal plate MP. Alternatively, the component 40 may be attached to the display panel 10 by an adhesive member AP filling the protection member groove PB_Gv.

Referring to FIG. 12B, the component 40 may be attached to a lower package 80 arranged under the panel protection member PB-1. In this case, the component 40 may be spaced from the display panel 10. In an embodiment, the component 40 may be arranged to pass through the plate through hole MPH.

Figure 13:
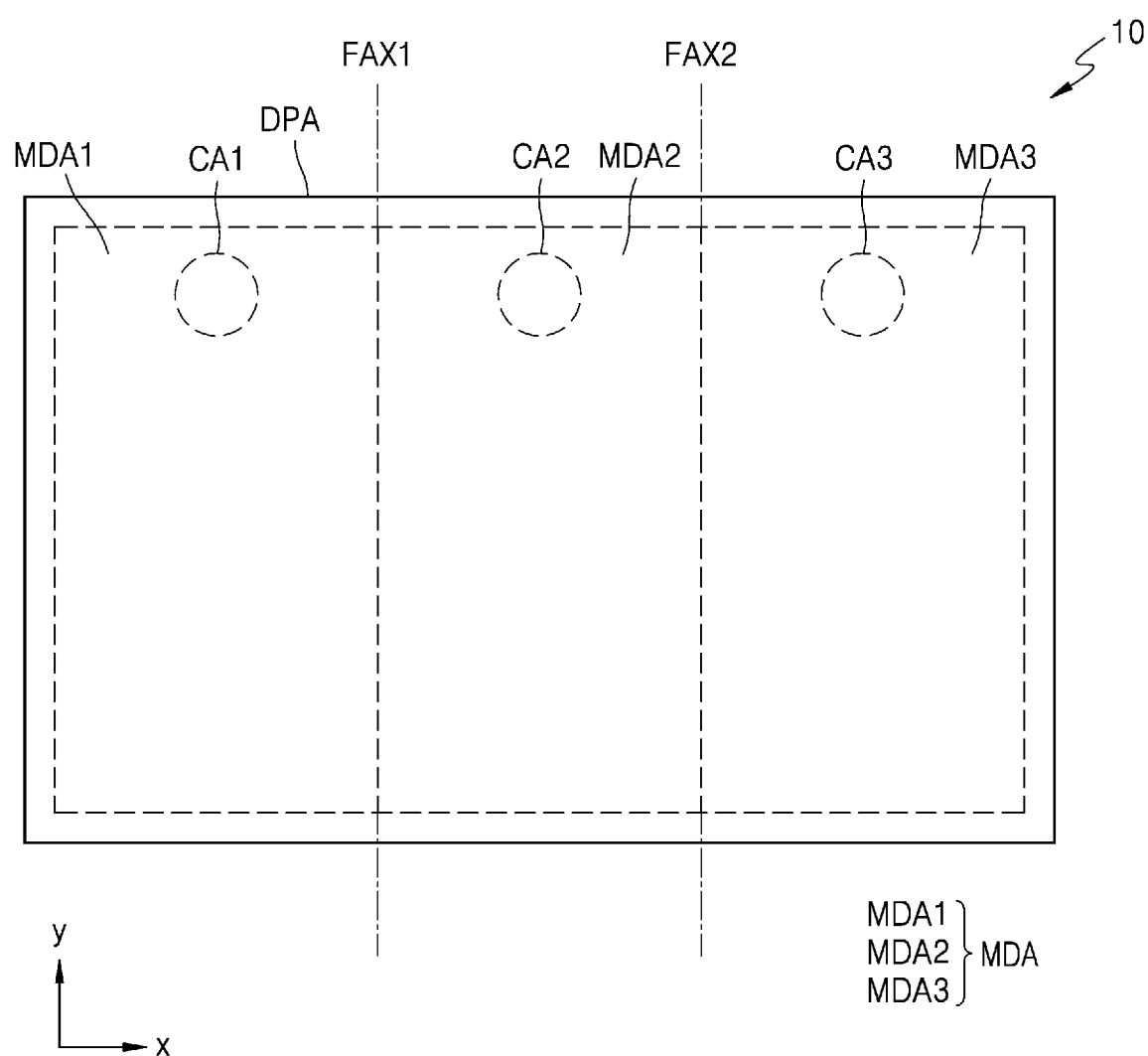
FIG. 13 is a schematic plan view illustrating a display panel of a foldable display device according to an embodiment.
Figure 14:
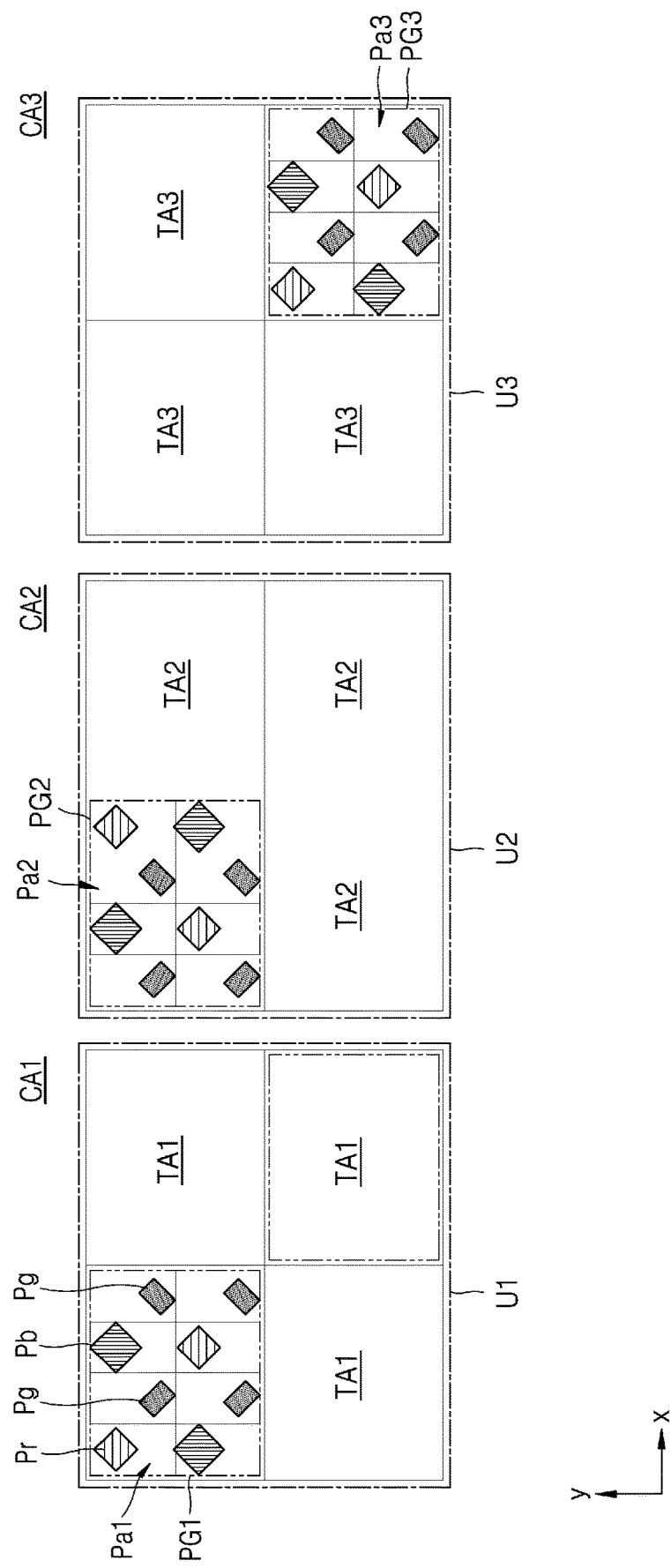
FIG. 14 is a schematic layout diagram illustrating a pixel arrangement structure in component areas according to an embodiment.

FIG. 13 is a schematic plan view illustrating a display panel 10 of a foldable display device according to an embodiment. FIG. 14 is a schematic layout diagram illustrating a pixel arrangement structure in component areas according to an embodiment.

Referring to FIGS. 13 and 14, the display panel 10 may include a first component area CA1, a second component area CA2, and a third component area CA3. In addition, the display panel 10 may include a main display area MDA that at least partially surrounds the first component area CA1, the second component area CA2, and/or the third component area CA3. In this case, the display panel 10 may be folded around or about a first folding axis FAX1 and a second folding axis FAX2. In some embodiments, the main display area MDA may include a first main display area MDA1, a second main display area MDA2, and a third main display area MDA3 that may respectively encircle the first component area CA1, the second component area CA2, and the third component area CA3.

Main sub-pixels may be arranged in the main display area MDA, and the main sub-pixels may be arranged in a pentile structure (e.g., the pentile structure in the embodiment of FIG. 5).

A first transmissive portion TA1 and first auxiliary sub-pixels Pa1 may be arranged in the first component area CA1. The first auxiliary sub-pixels Pa1 may define a first pixel group PG1. The first pixel group PG1 may include eight first auxiliary sub-pixels Pa1 arranged in a pentile structure. That is, one first pixel group PG1 may include two red sub-pixels Pr, four green sub-pixels Pg, and two blue sub-pixels Pb.

In the first component area CA1, a first basic unit U1 in which a certain number of first pixel groups PG1 and a certain number of first transmissive portions TA1 are bundled together may be repeatedly arranged in the x direction and the y direction. For example, a first pixel group PG1 may be arranged on the upper left side of the first basic unit U1, and three first transmissive portions TA1 may be arranged around the first pixel group PG1. In some embodiments, the first pixel group PG1 may be arranged in the upper left quadrant of the first basic unit U1 and three first transmissive portions TA1 may be respectively arranged in the lower left quadrant, the upper right quadrant, and the lower right quadrant of the first basic unit U1 as shown in FIG. 14.

A second transmissive portion TA2 and second auxiliary sub-pixels Pa2 may be arranged in the second component area CA2. The second auxiliary sub-pixels Pa2 may define a second pixel group PG2. The second pixel group PG2 may include eight second auxiliary sub-pixels Pa2 arranged in a pentile structure, similar to the first pixel group PG1.

In an embodiment, in a state in which the display panel 10 is unfolded, the second auxiliary sub-pixels Pa2 may be arranged in a symmetrical shape with respect to the first auxiliary sub-pixels Pa1. For example, the first basic unit U1 and the second basic unit U2 on respective left and right sides of an imaginary line (e.g., an imaginary line corresponding to the first folding axis FAX1) may be symmetrical to each other about the imaginary line. In another embodiment, in a state in which the display panel 10 is unfolded, the second auxiliary sub-pixels Pa2 may be arranged in the same pentile structure as the first auxiliary sub-pixels Pa1. Hereinafter, a case where, in a state in which the display panel 10 is unfolded, the second auxiliary sub-pixels Pa2 are arranged in a symmetrical shape on the left and right with respect to the first auxiliary sub-pixels Pa1 may be described in more detail below.

In the second component area CA2, a second basic unit U2 in which a certain number of second pixel groups PG2 and a certain number of second transmissive portions TA2 are bundled together may be repeatedly arranged in the x direction and the y direction. For example, a second pixel group PG2 may be arranged on the upper left side of the second basic unit U2, and three second transmissive portions TA2 may be arranged around the second pixel group PG2. For example, the second pixel group PG2 may be arranged in the upper left quadrant of the second basic unit U2 and three second transmissive portions TA2 may be respectively arranged in the lower left quadrant, the upper right quadrant, and the lower right quadrant of the second basic unit U2 as shown in FIG. 14.

A third transmissive portion TA3 and third auxiliary sub-pixels Pa3 may be arranged in the third component area CA3. The third auxiliary sub-pixels Pa3 may define a third pixel group PG3. The third pixel group PG3 may include eight third auxiliary sub-pixels Pa3 arranged in a pentile structure, similar to the first pixel group PG1.

In the third component area CA3, a third basic unit U3 in which a certain number of third pixel groups PG3 and a certain number of third transmissive portions TA3 are bundled together may be repeatedly arranged in the x direction and the y direction. For example, a third pixel group PG3 may be arranged on the lower right side of the third basic unit U3, and three third transmissive portions TA3 may be arranged around the third pixel group PG3. For example, the third pixel group PG3 may be arranged in the lower right quadrant of the third basic unit U3 and three third transmissive portions TA3 may be respectively arranged in the lower left quadrant, the upper left quadrant, and the upper right quadrant of the third basic unit U3 as shown in FIG. 14.

Figure 15A:
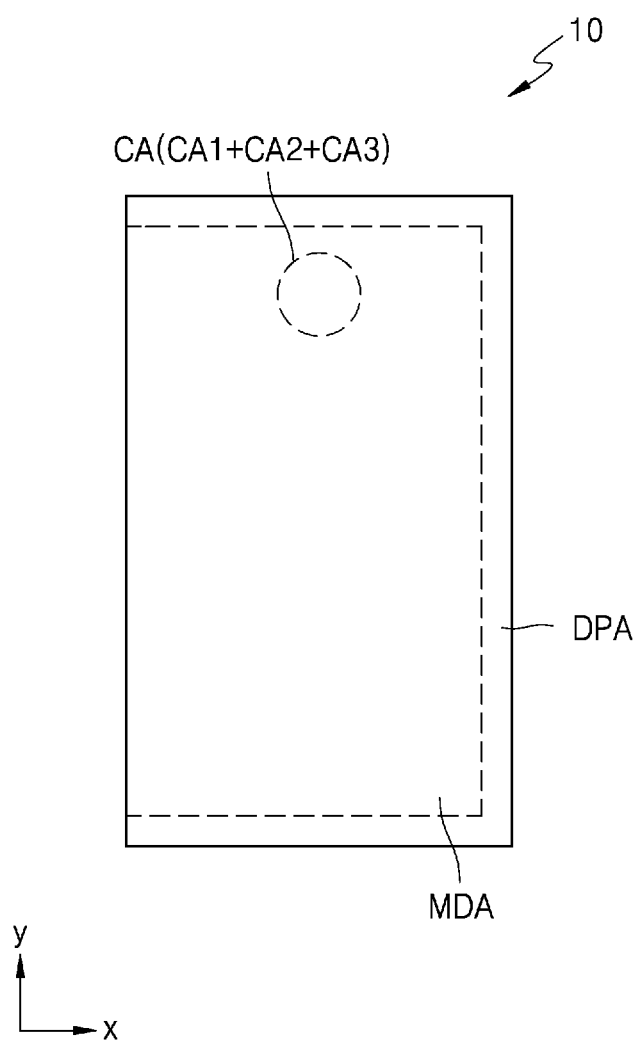
FIG. 15A is a plan view showing a state in which a display panel according to an embodiment is folded.
Figure 15B:
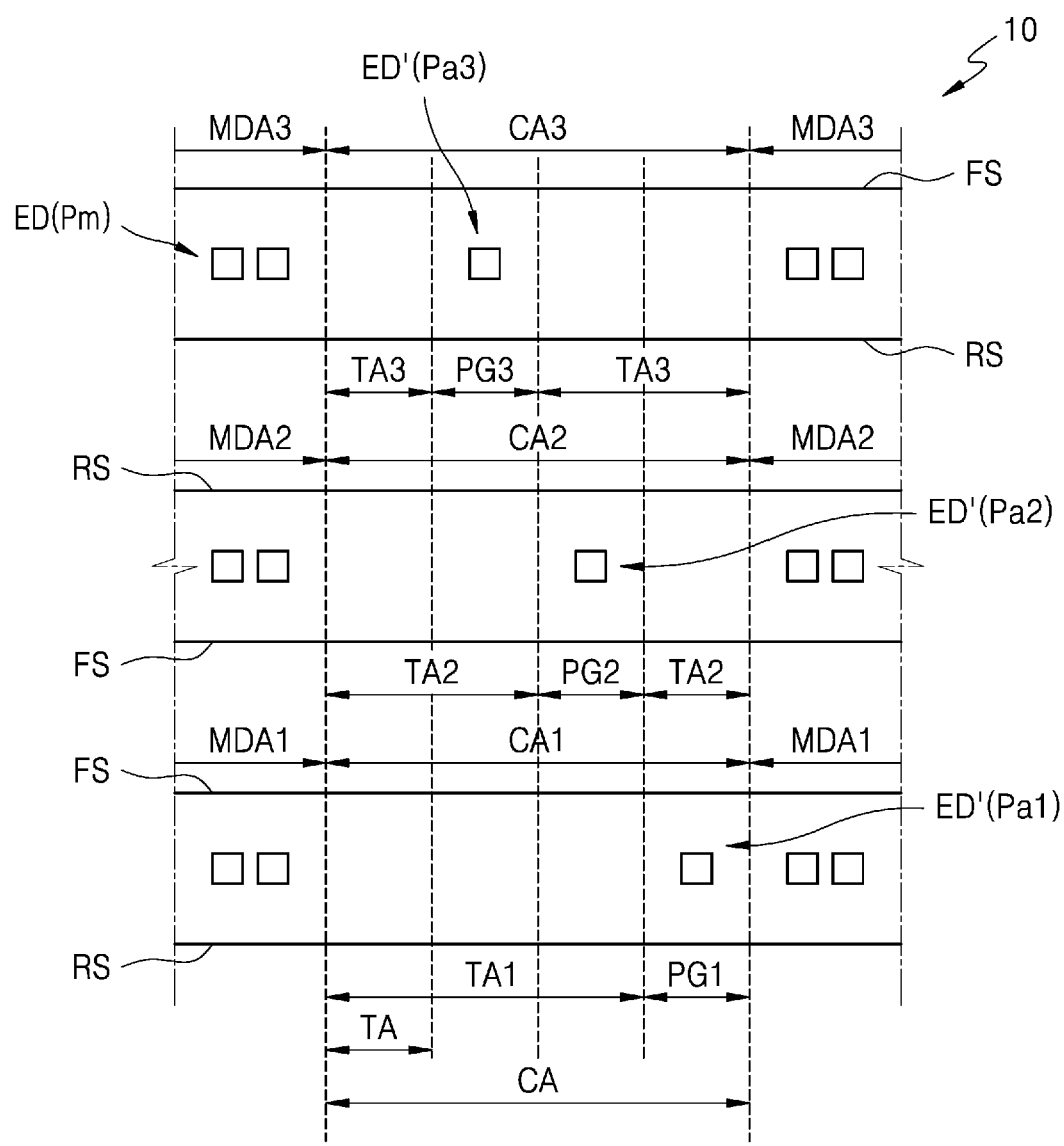
FIG. 15B is a cross-sectional view illustrating a component area in a state in which a display panel according to an embodiment is folded.
Figure 16:
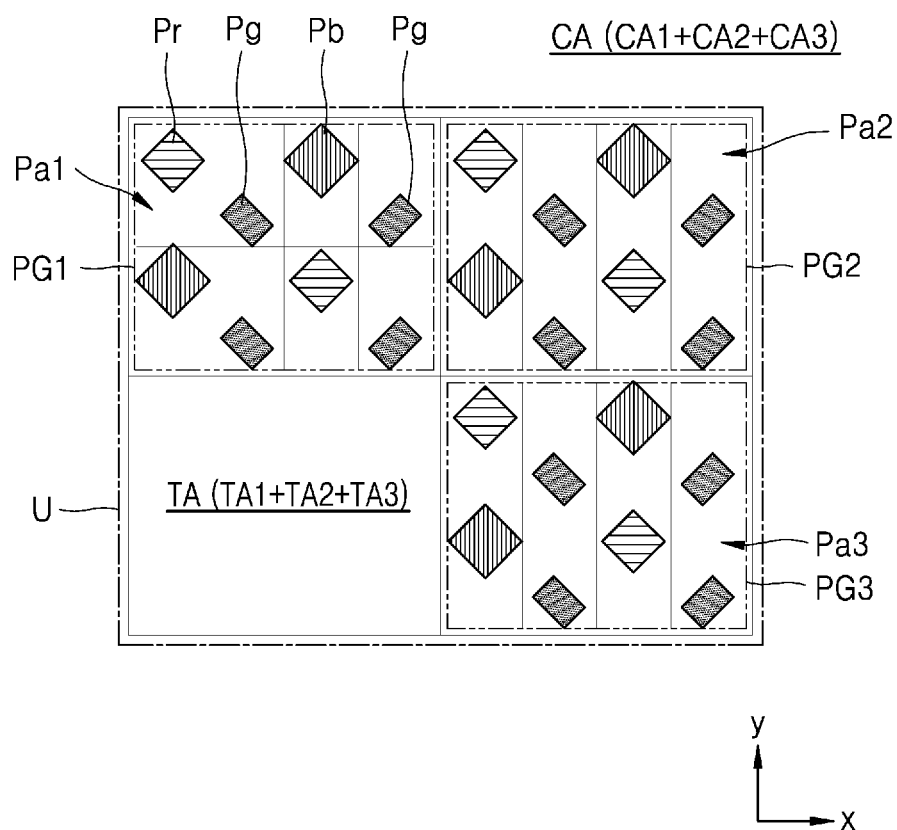
FIG. 16 is a schematic layout diagram illustrating a pixel arrangement structure in a folded state of a display panel according to an embodiment.

FIG. 15A is a plan view showing a state in which a display panel 10 according to an embodiment is folded. FIG. 15B is a cross-sectional view illustrating a component area CA in a state in which the display panel 10 according to an embodiment is folded. FIG. 16 is a schematic layout diagram illustrating a pixel arrangement structure in a folded state of a display panel 10 according to an embodiment.

Referring to FIGS. 15A and 15B, in a state in which the display panel 10 is folded, a first component area CA1, a second component area CA2, and a third component area CA3 may overlap one another on a plane. Therefore, one component area CA may be formed. In other words, when the display panel 10 is folded, the first component area CA1, the second component area CA2, and the third component area CA3 may overlap to form a single component area CA as shown in FIG. 15B. In some embodiments, when the display panel 10 is folded, the size (e.g., area) of the single component area CA may be substantially equal to or equal to the size (e.g., area) of the first component area CA1, the second component area CA2, or the third component area CA3.

In a state in which the display panel 10 is folded, a front surface FS of the display panel 10 corresponding to a first main display area MDA1 may face a front surface FS of the display panel 10 corresponding to a second main display area MDA2. In addition, in a state in which the display panel 10 is folded, a rear surface RS of the display panel 10 corresponding to the second main display area MDA2 may face a rear surface RS of the display panel 10 corresponding to a third main display area MDA3.

In a state in which the display panel 10 is folded, first auxiliary sub-pixels Pa1 may overlap at least one of a second transmissive portion TA2 or a third transmissive portion TA3 on a plane or in a plan view. Second auxiliary sub-pixels Pa2 may overlap at least one of a first transmissive portion TA1 or the third transmissive portion TA3 on a plane or in a plan view. Third auxiliary sub-pixels Pa3 may overlap at least one of the first transmissive portion TA1 or the second transmissive portion TA2 on a plane or in a plan view. Also, in a state in which the display panel 10 is folded, the first transmissive portion TA1, the second transmissive portion TA2, and the third transmissive portion TA3 may overlap one another on a plane or in a plan view to form a transmissive portion TA. In other words, when the display panel 10 is folded, the first transmissive portion TA1, the second transmissive portion TA2, and the third transmissive portion TA3 may overlap to form a single transmissive portion TA as shown in FIG. 15B. In some embodiments, when the display panel 10 is folded, the size (e.g., area) of the single transmissive portion TA may be less than the size (e.g., area) of the first transmissive portion TA1, the second transmissive portion TA2, or the third transmissive portion TA3.

Referring to FIG. 16, a first pixel group PG1 may be arranged on the upper left side of a basic unit U. A second pixel group PG2 may be arranged on the upper right side of the basic unit U. When the display panel 10 is unfolded and the second pixel group PG2 is arranged in a symmetrical shape on the left and right with respect to the first pixel group PG1, the second pixel group PG2 may be arranged in the same pentile structure as the first pixel group PG1 in a folded state of the display panel 10. The third pixel group PG3 may be arranged on the lower right side of the basic unit U. The transmissive portion TA may be arranged on the lower left side of the basic unit U. Therefore, when the display panel 10 is folded, the resolution of the component area CA may be increased.

Figure 17:
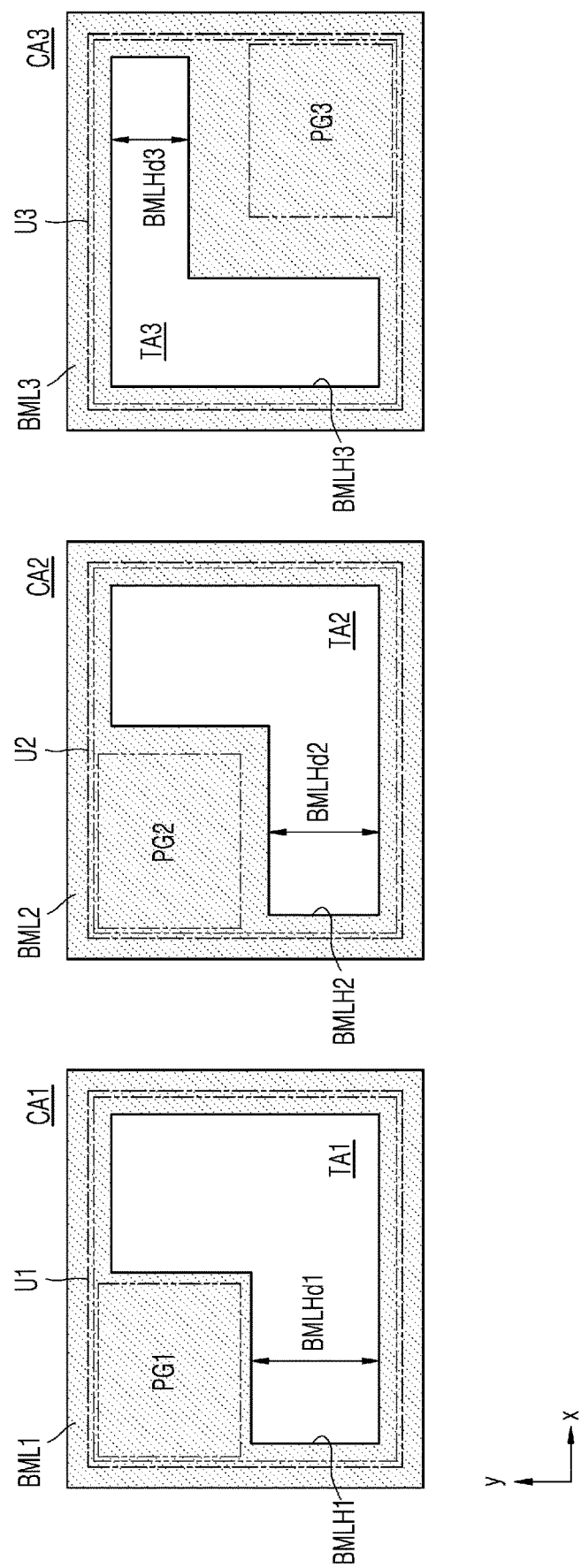
FIG. 17 is a plan view illustrating the shapes of lower metal layers that may be arranged in component areas according to an embodiment.
Figure 18:
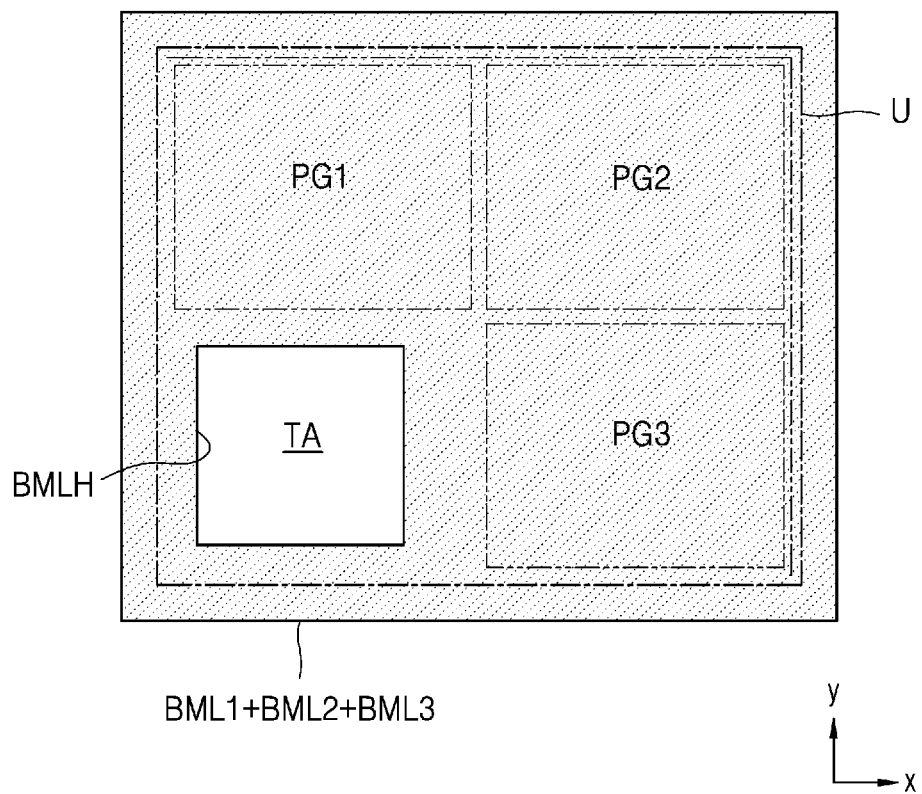
FIG. 18 is a plan view illustrating the shapes of lower metal layers overlapping one another in a component area in a state in which a display panel according to an embodiment is folded.

FIG. 17 is a plan view illustrating the shapes of lower metal layers that may be arranged in component areas according to an embodiment. FIG. 18 is a plan view illustrating the shapes of lower metal layers overlapping one another in a component area CA in a state in which a display panel according to an embodiment is folded.

Referring to FIG. 17, a first lower metal layer BML1 may be arranged to correspond to a first component area CA1 and may include a first lower hole BMLH1. The first lower hole BMLH1 may define a first transmissive portion TA1. A second lower metal layer BML2 may be arranged to correspond to a second component area CA2 and may include a second lower hole BMLH2. The second lower hole BMLH2 may define a second transmissive portion TA2. A third lower metal layer BML3 may be arranged to correspond to a third component area CA3 and may include a third lower hole BMLH3. The third lower hole BMLH3 may define a third transmissive portion TA3.

In the illustrated embodiment, the size of one of the first lower hole BMLH1, the second lower hole BMLH2, and the third lower hole BMLH3 may be different from the size of another one of the first lower hole BMLH1, the second lower hole BMLH2, and the third lower hole BMLH3. In this case, the size of a lower hole may be defined as the shortest distance between the inner surfaces of lower metal layers facing each other to define the lower hole. In some embodiments, the size of a lower hole may be defined as the shortest distance between inner surfaces of lower metal layers facing each other, defining the lower hole, and parallel or substantially parallel to each other. In FIG. 17, the size of a lower hole is shown as the shortest distance between the inner surfaces of lower metal layers facing each other in the y direction.

For example, a size (e.g., a length or a width) BMLHd1 of the first lower hole BMLH1 may be greater than a size (e.g., a length or a width) BMLHd2 of the second lower hole BMLH2. Also, the size (e.g., a length or a width) BMLHd2 of the second lower hole BMLH2 may be greater than a size (e.g., a length or a width) BMLHd3 of the third lower hole BMLH3.

Referring to FIG. 18, in a state in which the display panel is folded, the first lower metal layer BML1, the second lower metal layer BML2, and the third lower metal layer BML3 may overlap one another on a plane or in a plan view. In addition, the first lower hole BMLH1, the second lower hole BMLH2, and the third lower hole BMLH3 may overlap one another to define a lower hole BMLH in the component area CA. In this case, the shape and size of the transmissive portion TA may be defined by the shape and size of the lower hole BMLH.

In the illustrated embodiment, the size of one of the first lower hole BMLH1, the second lower hole BMLH2, and the third lower hole BMLH3 may be different from the size of another one of the first lower hole BMLH1, the second lower hole BMLH2, and the third lower hole BMLH3. Accordingly, when the display panel 10 is folded, external light may be prevented or substantially prevented from reaching an auxiliary thin-film transistor due to alignment deviation (e.g., alignment deviation between the first lower hole BMLH1, the second lower hole BMLH2, and/or the third lower hole BMLH3.

Figure 19:
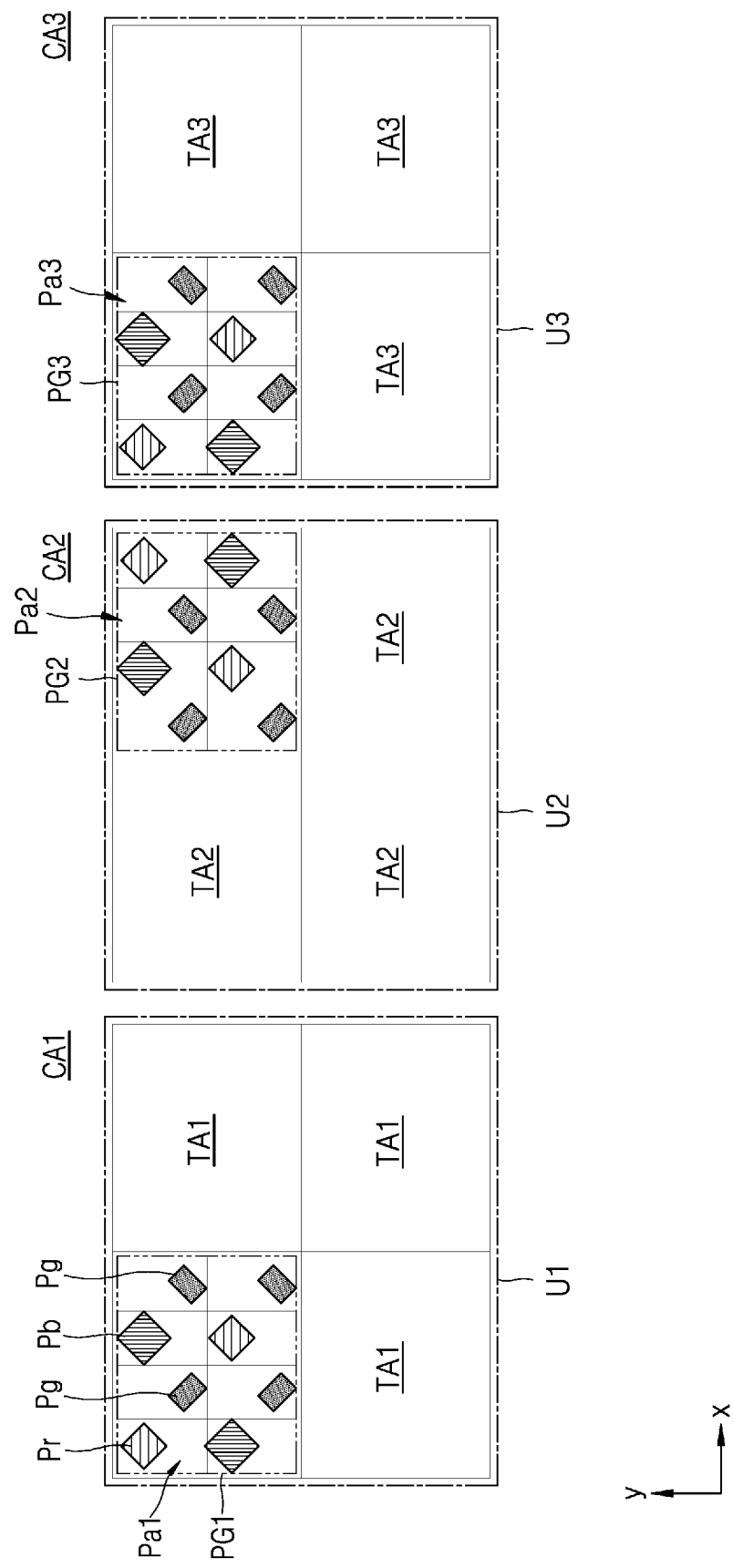
FIG. 19 is a schematic layout diagram illustrating a pixel arrangement structure in component areas according to another embodiment.
Figure 20A:
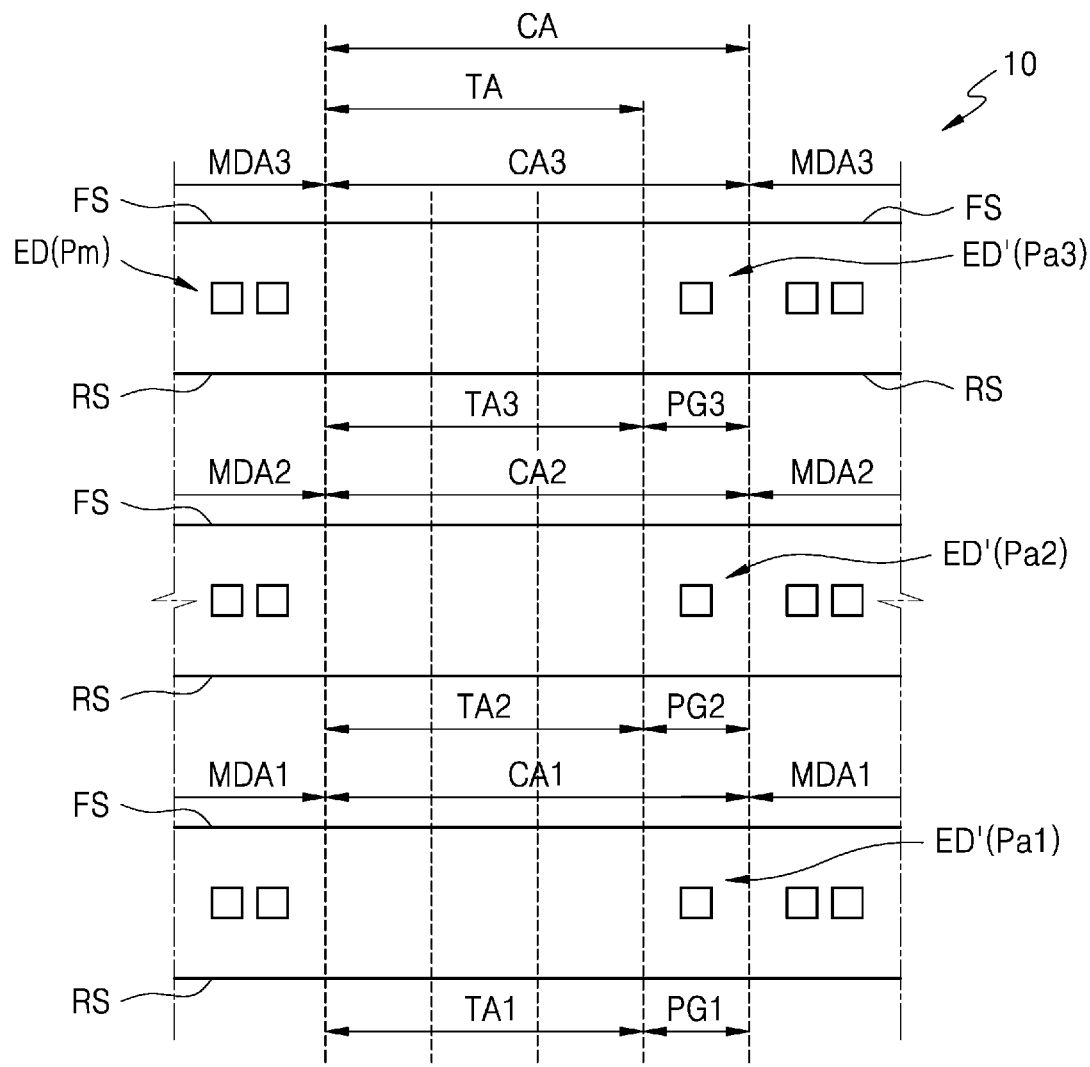
FIG. 20A is a cross-sectional view illustrating a component area in a state in which a display panel according to another embodiment is folded.
Figure 20B:
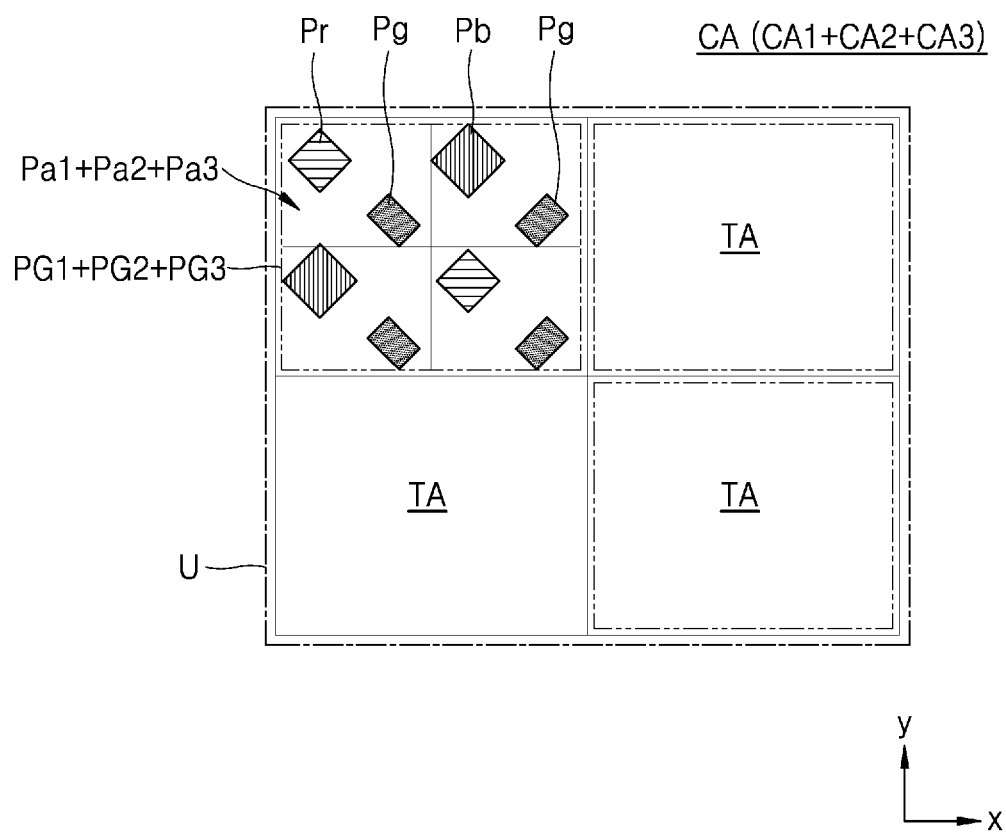
FIG. 20B is a schematic layout diagram illustrating a pixel arrangement structure in a folded state of a display panel according to another embodiment.

FIG. 19 is a schematic layout diagram illustrating a pixel arrangement structure in component areas according to another embodiment. FIG. 20A is a cross-sectional view illustrating a component area CA in a state in which a display panel 10 according to another embodiment is folded. FIG. 20B is a schematic layout diagram illustrating a pixel arrangement structure in a folded state of a display panel according to another embodiment. In FIGS. 19, 20A, and 20B, the same reference numerals as those in FIGS. 14, 15B, and 16 denote the same members, and thus, repeated descriptions thereof may be omitted.

Referring to FIG. 19, a first transmissive portion TA1 and first auxiliary sub-pixels Pa1 may be arranged in a first component area CA1. In the first component area CA1, a first basic unit U1 in which a certain number of first pixel groups PG1 and a certain number of first transmissive portions TA1 are bundled together may be repeatedly arranged in the x direction and the y direction. For example, in the first basic unit U1, a first pixel group PG1 may be arranged on the upper left side and three first transmissive portions TA1 may be arranged around the first pixel group PG1. In some embodiments, the first pixel group PG1 may be arranged in the upper left quadrant of the first basic unit U1 and three first transmissive portions TA1 may be respectively arranged in the lower left quadrant, the upper right quadrant, and the lower right quadrant of the first basic unit U1 as shown in FIG. 19.

In an embodiment, in a state in which the display panel 10 is unfolded, second auxiliary sub-pixels Pa2 may be arranged in a symmetrical shape with respect to the first auxiliary sub-pixels Pa1. For example, the second auxiliary sub-pixels Pa2 of the second pixel group PG2 and the first auxiliary sub-pixels Pa1 of the first pixel group PG1 on respective left and right sides of an imaginary line (e.g., an imaginary line corresponding to the first folding axis FAX1) may be symmetrical to each other about the imaginary line. In another embodiment, in a state in which the display panel 10 is unfolded, the second auxiliary sub-pixels Pa2 may be arranged in the same pentile structure as the first auxiliary sub-pixels Pa1. Hereinafter, a case where, in a state in which the display panel 10 is unfolded, the second auxiliary sub-pixels Pa2 are arranged in a symmetrical shape on the left and right with respect to the first auxiliary sub-pixels Pa1 may be described in more detail below.

In a second component area CA2, a second basic unit U2 in which a certain number of second pixel groups PG2 and a certain number of second transmissive portions TA2 are bundled together may be repeatedly arranged in the x direction and the y direction. For example, in the second basic unit U2, a second pixel group PG2 may be arranged on the upper right side and three second transmissive portions TA2 may be arranged around the second pixel group PG2. For example, the second pixel group PG2 may be arranged in the upper left quadrant of the second basic unit U2 and three second transmissive portions TA2 may be respectively arranged in the lower left quadrant, the upper right quadrant, and the lower right quadrant of the second basic unit U2 as shown in FIG. 19.

A third transmissive portion TA3 and third auxiliary sub-pixels Pa3 may be arranged in a third component area CA3. In the third component area CA3, a third basic unit U3 in which a certain number of third pixel groups PG3 and a certain number of third transmissive portions TA3 are bundled together may be repeatedly arranged in the x direction and the y direction. For example, a third pixel group PG3 may be arranged on the upper left side of the third basic unit U3, and three third transmissive portions TA3 may be arranged around the third pixel group PG3. For example, the third pixel group PG3 may be arranged in the lower right quadrant of the third basic unit U3 and three third transmissive portions TA3 may be respectively arranged in the lower left quadrant, the upper left quadrant, and the upper right quadrant of the third basic unit U3 as shown in FIG. 19.

Referring to FIGS. 20A and 20B, in a state in which the display panel 10 is folded, one of the first auxiliary sub-pixel Pa1, the second auxiliary sub-pixel Pa2, and the third auxiliary sub-pixel Pa3 may overlap another one of the first auxiliary sub-pixel Pa1, the second auxiliary sub-pixel Pa2, and the third auxiliary sub-pixel Pa3 on a plane or in a plan view. For example, the first auxiliary sub-pixel Pa1, the second auxiliary sub-pixel Pa2, and the third auxiliary sub-pixel Pa3 may all overlap one another (i.e., each other) on a plane or in a plan view. Alternatively, the first auxiliary sub-pixel Pa1 and the second auxiliary sub-pixel Pa2 may overlap each other on a plane or in a plan view, and the second auxiliary sub-pixel Pa2 and the third auxiliary sub-pixel Pa3 may overlap each other on a plane or in a plan view.

Also, in a state in which the display panel 10 is folded, the first transmissive portion TA1, the second transmissive portion TA2, and the third transmissive portion TA3 may overlap one another on a plane or in a plan view to form a transmissive portion TA. In other words, when the display panel 10 is folded, the first transmissive portion TA1, the second transmissive portion TA2, and the third transmissive portion TA3 may overlap to form a single transmissive portion TA as shown in FIG. 20A. In some embodiments, when the display panel 10 is folded, the size (e.g., area) of the single transmissive portion TA may be equal to or substantially equal to the size (e.g., area) of the first transmissive portion TA1, the second transmissive portion TA2, or the third transmissive portion TA3.

In this case, the first pixel group PG1, the second pixel group PG2, and the third pixel group PG3 may be arranged on the upper left side or upper left quadrant of the basic unit U. Therefore, even though the display panel is folded, the light transmittance of the component area CA may be maintained.

Figure 21:
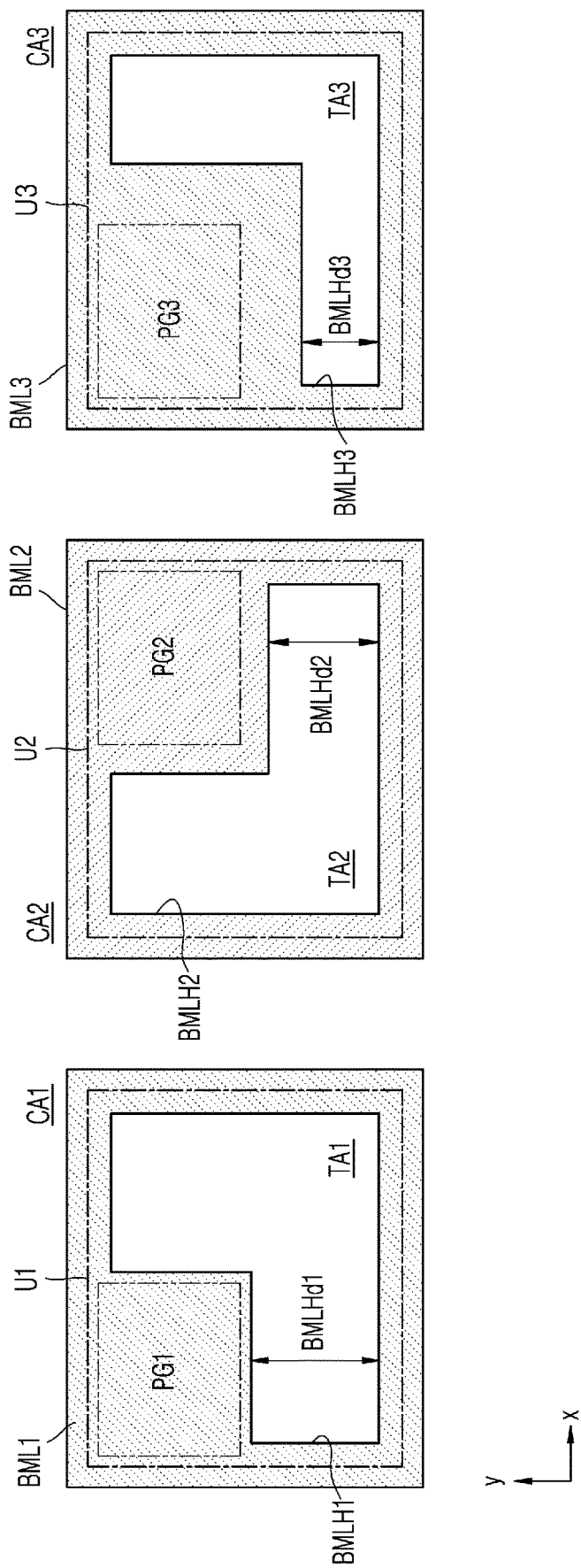
FIG. 21 is a plan view illustrating the shapes of lower metal layers that may be arranged in component areas according to another embodiment.

FIG. 21 is a plan view illustrating the shapes of lower metal layers that may be arranged in component areas according to another embodiment. In FIG. 21, the same reference numerals as those in FIG. 17 refer to the same members, and thus, repeated descriptions thereof may be omitted.

Referring to FIG. 21, a first lower metal layer BML1 may be arranged to correspond to a first component area CA1 and may include a first lower hole BMLH1. A second lower metal layer BML2 may be arranged to correspond to a second component area CA2 and may include a second lower hole BMLH2. A third lower metal layer BML3 may be arranged to correspond to a third component area CA3 and may include a third lower hole BMLH3.

In the illustrated embodiment, the size of one of the first lower hole BMLH1, the second lower hole BMLH2, and the third lower hole BMLH3 may be different from the size of another one of the first lower hole BMLH1, the second lower hole BMLH2, and the third lower hole BMLH3.

For example, a size (e.g., a length or a width) BMLHd1 of the first lower hole BMLH1 may be greater than a size (e.g., a length or a width) BMLHd2 of the second lower hole BMLH2. Also, the size (e.g., a length or a width) BMLHd2 of the second lower hole BMLH2 may be greater than a size (e.g., a length or a width) BMLHd3 of the third lower hole BMLH3.

In the illustrated embodiment, when the display panel is folded, the shapes in which the first, second, and third lower metal layers BML1, BML2, and BML3 overlap each other may be the same as the shape of the third lower metal layer BML3. In this case, the shape and size of a transmissive portion may be defined by the shape and size of the third lower hole BMLH3. Accordingly, when the display panel is folded, external light may be prevented or substantially prevented from reaching at least one of the first pixel group PG1, the second pixel group PG2, or the third pixel group PG3 due to alignment deviation.

Figure 22:
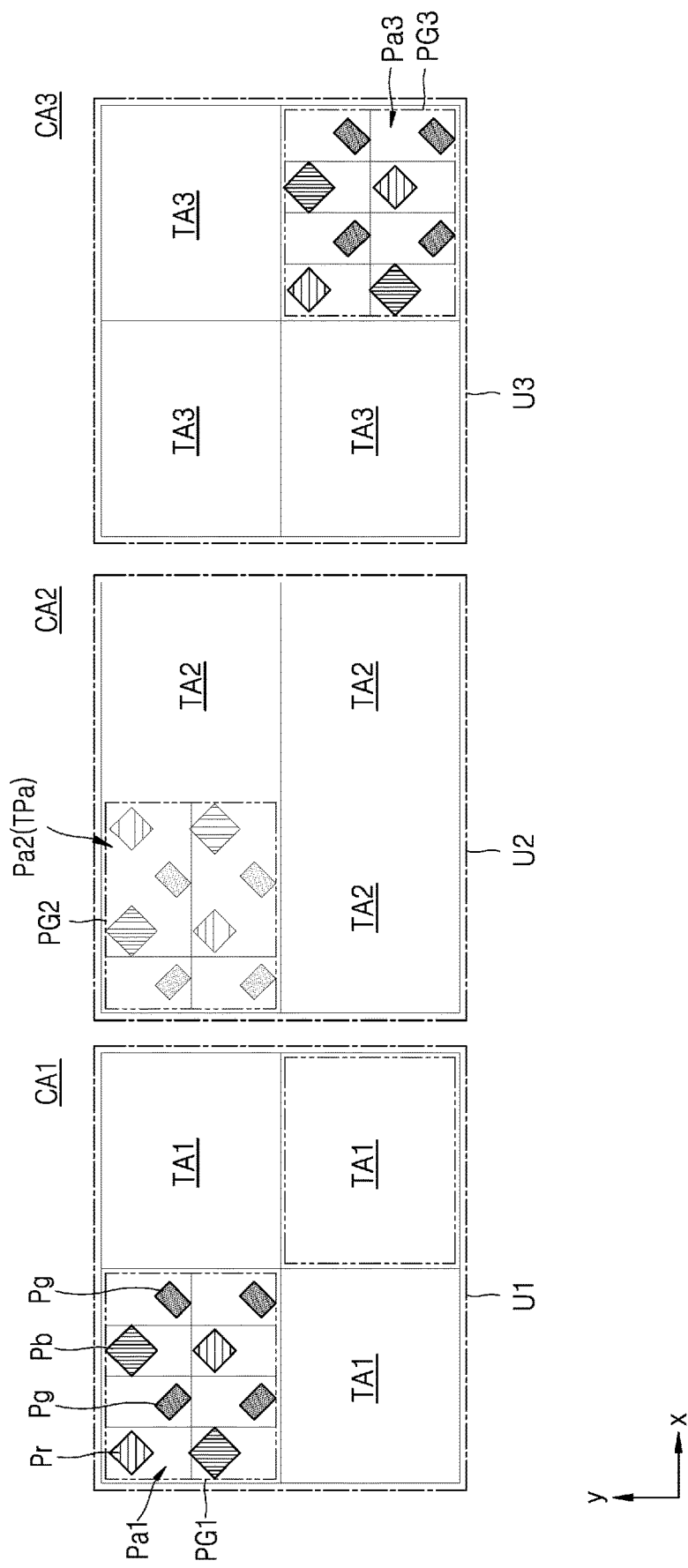
FIG. 22 is a schematic layout diagram illustrating a pixel arrangement structure in component areas according to another embodiment.
Figure 23:
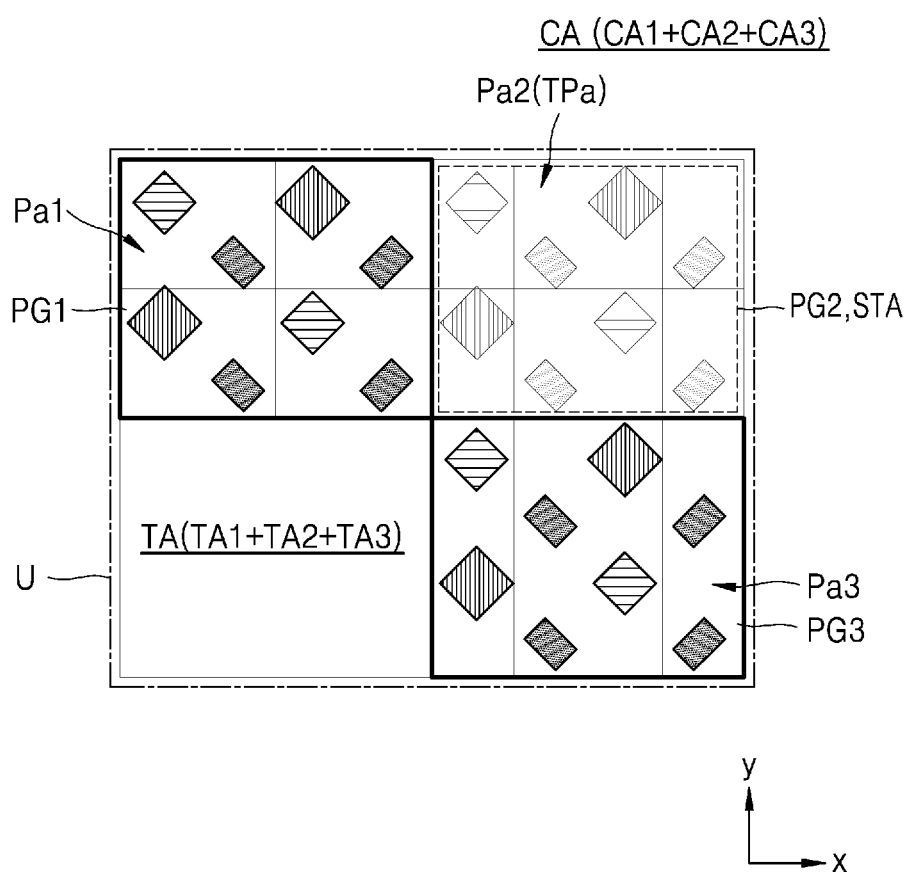
FIG. 23 is a schematic layout diagram illustrating a pixel arrangement structure in a folded state of a display panel according to another embodiment.

FIG. 22 is a schematic layout diagram illustrating a pixel arrangement structure in component areas according to another embodiment. FIG. 23 is a schematic layout diagram illustrating a pixel arrangement structure in a folded state of a display panel according to another embodiment. In FIGS.

22 and 23, the same reference numerals as those in FIGS. 14 and 16 denote the same members, and thus, repeated descriptions thereof may be omitted.

The embodiments of FIGS. 22 and 23 are different from the embodiments of FIGS. 14 and 16 in that second auxiliary sub-pixels Pa2 in FIGS. 22 and 23 are transparent auxiliary sub-pixels TPa (e.g., see FIG. 9).

Referring to FIG. 22, the second auxiliary sub-pixels Pa2 arranged in a second component area CA2 may be transparent auxiliary sub-pixels TPa. Accordingly, the transmittance of display elements implementing the second auxiliary sub-pixels Pa2 arranged in the second component area CA2 may be different from the transmittance of display elements of first auxiliary sub-pixels Pa1 arranged in a first component area CA1 or third auxiliary sub-pixels Pa3 arranged in a third component area CA3. Alternatively, the transmittance of the display elements implementing the second auxiliary sub-pixels Pa2 may be different from the transmittance of a display element of a main sub-pixel in a main display area MDA.

For example, pixel electrodes of the display elements implementing the second auxiliary sub-pixels Pa2 may be provided as transparent electrodes, and a pixel electrode of the display element implementing the main sub-pixel in the main display area MDA may include a reflective layer.

Referring to FIG. 23, in a state in which the display panel is folded, an area where a second pixel group PG2 including second sub-pixels Pa2 is arranged may be a semi-transmission area STA through which light partially transmits. The semi-transmission area STA may be an area having a higher light transmittance than an area where a first pixel group PG1 or a third pixel group PG3 is arranged and a lower light transmittance compared to a transmissive portion TA. Therefore, while the display panel is folded, it is possible to increase the resolution while securing or increasing the light transmittance of the component area CA.

Figure 24:
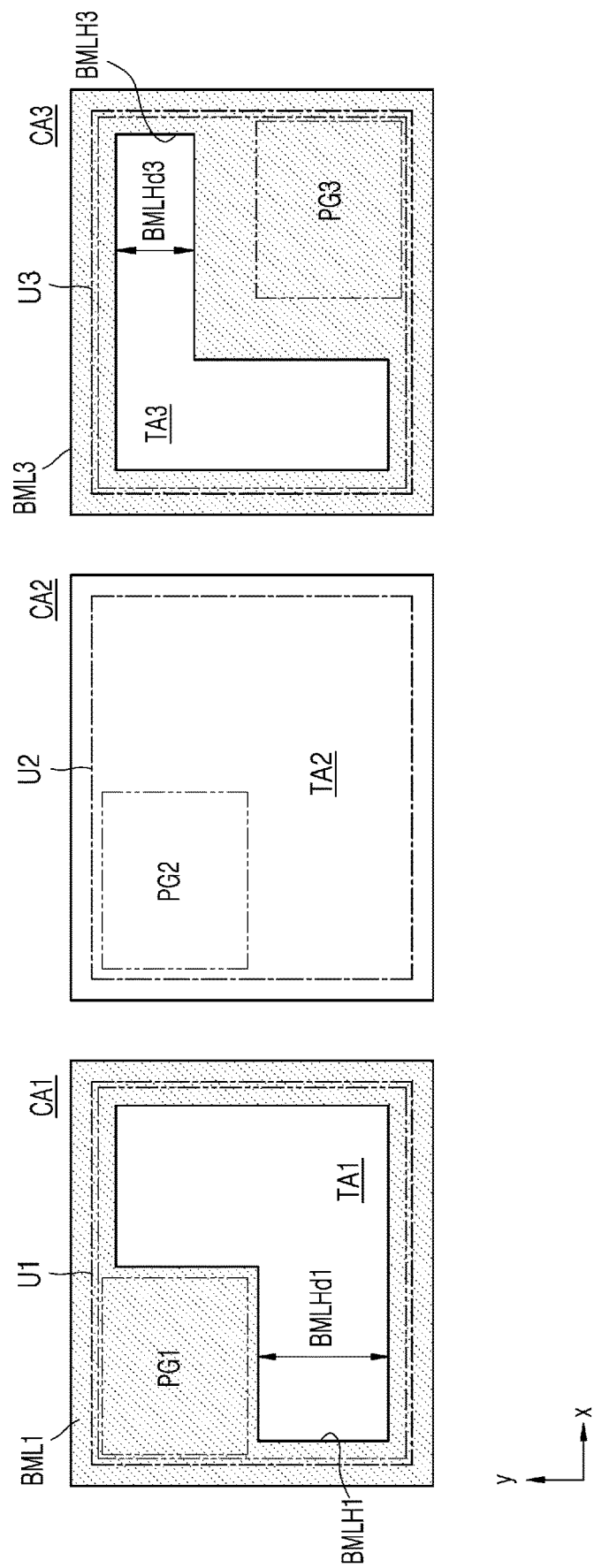
FIG. 24 is a plan view illustrating the shapes of lower metal layers that may be arranged in component areas according to another embodiment.

FIG. 24 is a plan view illustrating the shapes of lower metal layers that may be arranged in component areas according to another embodiment. The embodiment of FIG. 24 is different from the embodiment of FIG. 17 in that a second lower metal layer is omitted.

Referring to FIG. 24, a first lower metal layer BML1 may be arranged to correspond to a first component area CA1 and may include a first lower hole BMLH1. Also, a third lower metal layer BML3 may be arranged to correspond to a third component area CA3 and may include a third lower hole BMLH3.

In the illustrated embodiment, the second lower metal layer may be omitted. Alternatively, a second lower hole of the second lower metal layer may be arranged corresponding to a second component area CA2. For example, the second lower hole of the second lower metal layer may correspond to a second basic unit U2.

Figure 25:
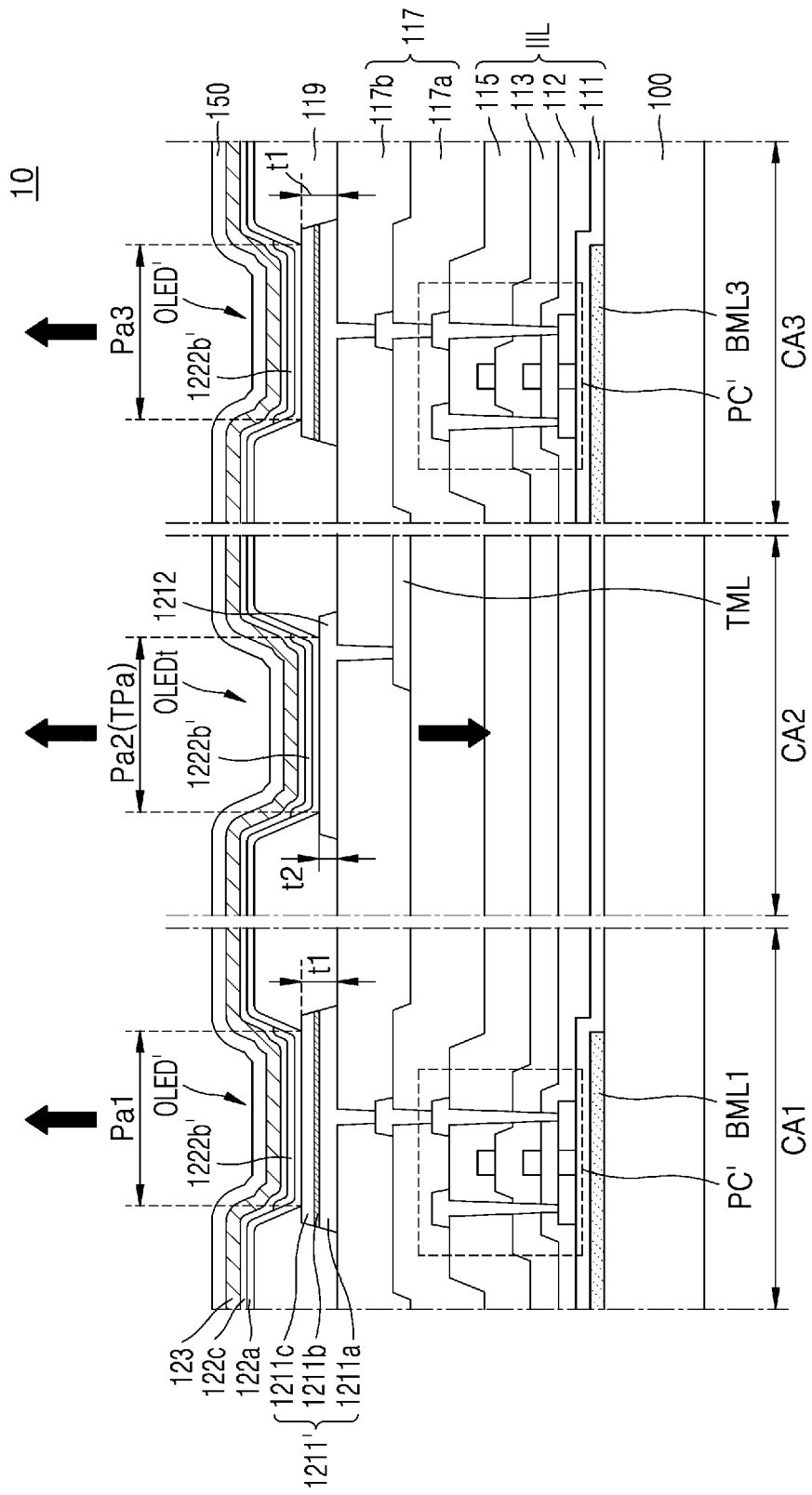
FIG. 25 is a schematic cross-sectional view illustrating component areas according to an embodiment.

FIG. 25 is a schematic cross-sectional view illustrating component areas according to an embodiment. In FIG. 25, the same reference numerals as those in FIG. 10 denote the same members, and thus, repeated descriptions thereof may be omitted.

Referring to FIG. 25, a display panel 10 may include a first component area CA1, a second component area CA2, and a third component area CA3.

A first auxiliary sub-pixel Pa1 may be arranged in the first component area CA1. An auxiliary organic light-emitting diode OLED' may be connected to an auxiliary pixel circuit PC' to implement the first auxiliary sub-pixel Pa1. In this case, the auxiliary organic light-emitting diode OLED' may be provided by sequentially stacking a second pixel electrode 1211', a first functional layer 122a, a second emission layer 1222b', a second functional layer 122c, and an opposite electrode 123.

A third auxiliary sub-pixel Pa3 may be arranged in the third component area CA3. In this case, similar to the first auxiliary sub-pixel Pa1, the auxiliary organic light-emitting diode OLED' may be connected to an auxiliary pixel circuit PC' to implement the third auxiliary sub-pixel Pa3.

The second pixel electrode 1211' may include a reflective layer 1211b. As the reflective layer 1211b is included in the second pixel electrode 1211', light generated by the second emission layer 1222b' may be reflected by the reflective layer 1211b and emitted in an upper direction (+z direction or thickness direction) of a substrate 100. That is, the emission light efficiency in the upper direction of the substrate 100 may be increased. In some embodiments, the second pixel electrode 1211' may be provided by sequentially stacking a first transparent electrode layer 1211a, a reflective layer 1211b, and a second transparent electrode layer 1211c.

A second auxiliary sub-pixel Pa2 may be arranged in the second component area CA2. In this case, the second auxiliary sub-pixel Pa2 may be a transparent auxiliary sub-pixel TPa (e.g., see FIG. 10). The second auxiliary sub-pixel Pa2 may be implemented by a transparent organic light-emitting diode OLEDt. The transparent organic light-emitting diode OLEDt may be provided by sequentially stacking a transparent pixel electrode 1212, the first functional layer 122a, the second emission layer 1222b', the second functional layer 122c, and the opposite electrode 123.

The transparent pixel electrode 1212 of the transparent organic light-emitting diode OLEDt may not include a reflective layer and may include a transparent conductive material. The transparent pixel electrode 1212 may include a transparent conductive oxide such as ITO, IZO, ZnO, $In_2O_3$, IGO, or AZO.

Because the transparent pixel electrode 1212 does not include a reflective layer and includes a transparent conductive material, external light may be at least partially transmitted through the transparent pixel electrode 1212. That is, light and/or a signal emitted from the component 40 (e.g., see FIG. 2) or light and/or a signal incident on the component 40 may pass through the transparent organic light-emitting diode OLEDt.

The transparent pixel electrode 1212 may be formed at the same time (e.g., concurrently or simultaneously) when the first transparent electrode layer 1211a of the first pixel electrode 1211 is formed. Alternatively, a portion of the transparent pixel electrode 1212 may be formed when the first transparent electrode layer 1211a of the second pixel electrode 1211' is formed, and the remaining portion of the transparent pixel electrode 1212 may be formed when the second transparent electrode layer 1211c of the second pixel electrode 1211' is formed. Accordingly, a thickness t2 of the transparent pixel electrode 1212 may be less than a thickness t1 of the second pixel electrode 1211'.

In the illustrated embodiment, the second auxiliary sub-pixel Pa2 as described above may be connected to a dummy pixel circuit having a dummy thin-film transistor spaced from the second component area CA2, similar to the embodiment of FIG. 10. In this case, the transparent organic light-emitting diode OLEDt may be connected to the dummy thin-film transistor by a transparent wiring line TML.

The transparent wiring line TML may include a transparent conductive material. The transparent wiring line TML may include a transparent conductive oxide such as ITO, IZO, ZnO, $In_2O_3$, IGO, or AZO. Accordingly, light generated in the second emission layer 1222b' of the transparent organic light-emitting diode OLEDt may pass through the transparent wiring line TML and be emitted towards the lower side of the substrate 100.

In an embodiment, the display panel 10 may be folded as shown in FIG. 11B. In this case, when the second auxiliary sub-pixel Pa2 emits light towards the lower side of the substrate 100, a user may sense the light. In the illustrated embodiment, when the second auxiliary sub-pixel Pa2 is a transparent auxiliary sub-pixel TPa, light may be emitted towards the upper and lower sides of the substrate 100. Accordingly, the user may sense the light emitted from the second sub-pixel Pa2 while the display panel 10 is folded.

In addition, a first lower metal layer BML1 may be arranged corresponding to the first component area CA1, and a third lower metal layer BML3 may be arranged corresponding to the third component area CA3. A second lower metal layer may not be arranged in correspondence with the second component area CA2. Therefore, the second auxiliary sub-pixel Pa2 may emit light towards the lower side of the substrate 100.

Figure 26:
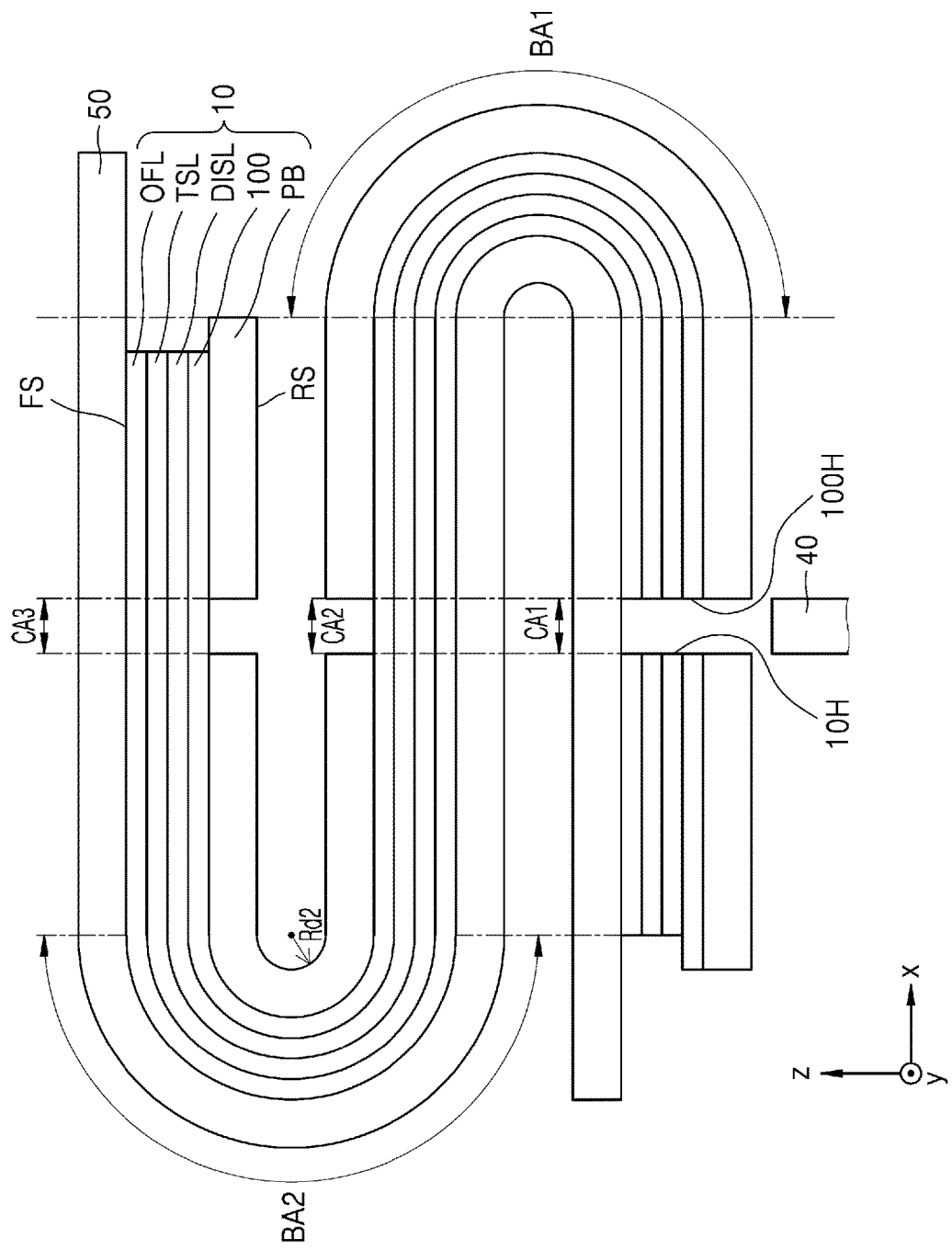
FIG. 26 is a schematic cross-sectional view illustrating a portion of a foldable display device according to an embodiment.

FIG. 26 is a schematic cross-sectional view illustrating a portion of a foldable display device according to an embodiment. FIG. 26 is a cross-sectional view showing a state in which a portion of the foldable display device is folded.

The embodiment of FIG. 26 is different from the embodiment of FIG. 11C in that a through hole 100H is provided in a substrate 100 to correspond to a first component area CA1.

Referring to FIG. 26, a display panel 10 may include the substrate 100. In this case, the substrate 100 may include the through hole 100H corresponding to the first component area CA1 or a third component area CA3. For example, in a state where the display panel 10 is unfolded, when a component 40 overlaps the first component area CA1, the through hole 100H may correspond to the first component area CA1. As another example, in a state in which the display panel 10 is unfolded, when the component 40 overlaps the third component area CA3, the through hole 100H may correspond to the third component area CA3. Hereinafter, for convenience of description, a case where the through hole 100H corresponds to the first component area CA1 in a state in which the display panel 10 is unfolded may be described in more detail below.

In some embodiments, the display panel 10 may include a panel through hole 10H corresponding to the first component area CA1. The panel through hole 10H may be formed by overlapping holes respectively provided in the substrate 100, a display layer DISL, a touch screen layer TSL, and an optical functional layer OFL. In some embodiments, the panel through hole 10H includes the through hole 100H of the substrate 100.

In the illustrated embodiment, the through hole 100H of the substrate 100 may be provided corresponding to the first component area CA1, and a display element may not be arranged in the first component area CA1. That is, most of the first component area CA1 may be a transmissive portion. Therefore, the light transmittance of the first component area CA1 may be improved.

In addition, the embodiment described with reference to FIG. 4A-4E or 8 may be applied to portions of the display panel 10 corresponding to the second component area CA2 and the third component area CA3. Therefore, the light transmittance of the second component area CA2 and the third component area CA3 may be remarkably improved.

Figure 27:
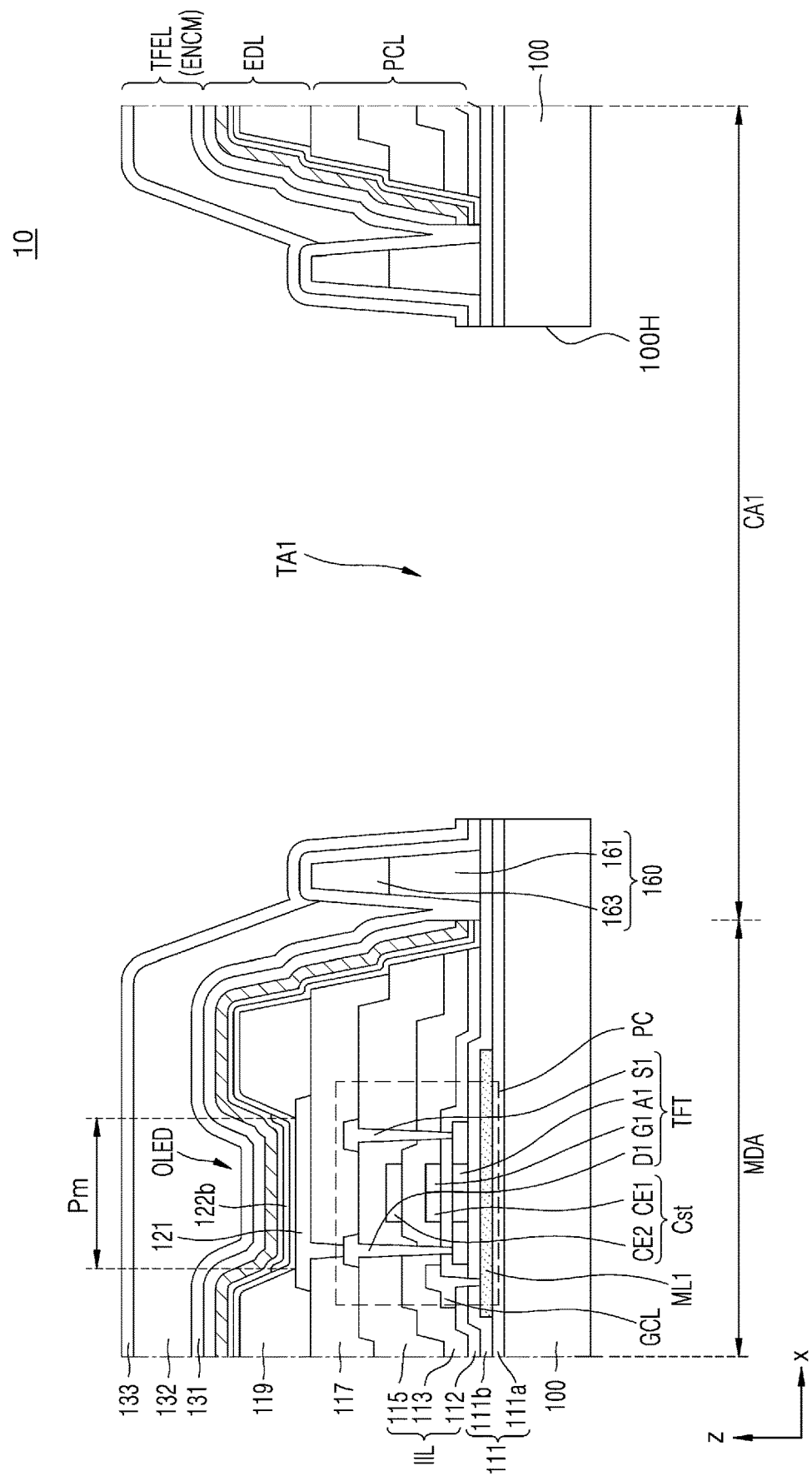
FIG. 27 is a schematic cross-sectional view illustrating a portion of a display panel according to an embodiment.

FIG. 27 is a schematic cross-sectional view illustrating a portion of a display panel 10 according to an embodiment. Specifically, in the embodiment of FIG. 27, a case where the substrate 100 included in the display panel 10 of FIG. 26 has a through hole 100H corresponding to a first component area CA1 may be described in more detail below. The embodiment of FIG. 27 is different from the embodiment of FIG. 8 in that an auxiliary sub-pixel is not arranged in a first component area CA1 of the display panel 10 and a through hole 100H is provided in a substrate 100 to correspond to a first component area CA1.

The display panel 10 may include a main display area MDA and a first component area CA1. A main sub-pixel Pm is arranged in the main display area MDA, and a first transmissive portion TA1 is arranged in the first component area CA1. A main pixel circuit PC, which includes a main thin-film transistor TFT and a main storage capacitor Cst, and a main organic light-emitting diode OLED, which is a display element connected to the main pixel circuit PC, may be arranged in the main display area MDA.

In the display panel 10, a substrate 100, a buffer layer 111, a circuit layer PCL, and a display element layer EDL may be sequentially stacked. The buffer layer 111 may include a first buffer layer 111a and a second buffer layer 111b, which are stacked with each other. The circuit layer PCL may include an inorganic insulating layer IIL and a planarization layer 117. In some embodiments, the connection electrodes of FIG. 8 may be omitted. A thin-film encapsulation layer TFEL may be arranged on the display element layer EDL as a sealing member ENCM. The thin-film encapsulation layer TFEL may be provided by sequentially stacking a first inorganic encapsulation layer 131, an organic encapsulation layer 132, and a second inorganic encapsulation layer 133.

In the illustrated embodiment, the substrate 100 may have a through hole 100H corresponding to the first component area CA1. A dam portion 160 protruding in the +z direction from the upper surface of the substrate 100 may be arranged around the through hole 100H of the substrate 100.

The dam portion 160 may be provided to prevent or substantially prevent the organic encapsulation layer 132 of the thin-film encapsulation layer TFEL from flowing toward the through hole 100H. The organic encapsulation layer 132 may be formed by applying a monomer and then curing the monomer, and the flow of the monomer may be controlled by the dam portion 160. Accordingly, an end of the organic encapsulation layer 132 may be located on one side of the dam portion 160 that is spaced from (e.g., spaced far from) the through hole 100H. The dam portion 160 may be arranged to surround or at least partially surround the through hole 100H. In some embodiments, the dam portion 160 may encircle the through hole 100H The dam portion 160 may have a multi-layer structure. For example, the dam portion 160 may have a structure in which a first layer 161 and a second layer 163 are stacked. The first layer 161 may include the same material as the inorganic insulating layer IIL, and the second layer 163 may include the same material as the planarization layer 117.

The first inorganic encapsulation layer 131 and the second inorganic encapsulation layer 133 may contact each other at one side of the dam portion 160 adjacent to the through hole 100H. Accordingly, external air and moisture that may be introduced through the through hole 100H may be prevented or substantially prevented from penetrating into the display element layer EDL.

In the illustrated embodiment, a case where, when the through hole 100H is provided in the substrate 100 of the display panel 10, a thin-film encapsulation layer TFEL is used as a sealing member has been described as an example. However, a sealing substrate may be used as a sealing member. When a sealing substrate is used as a sealing member, a sealing material for bonding the substrate 100 to the sealing substrate may be introduced around the through hole 100H.

Figure 28A:
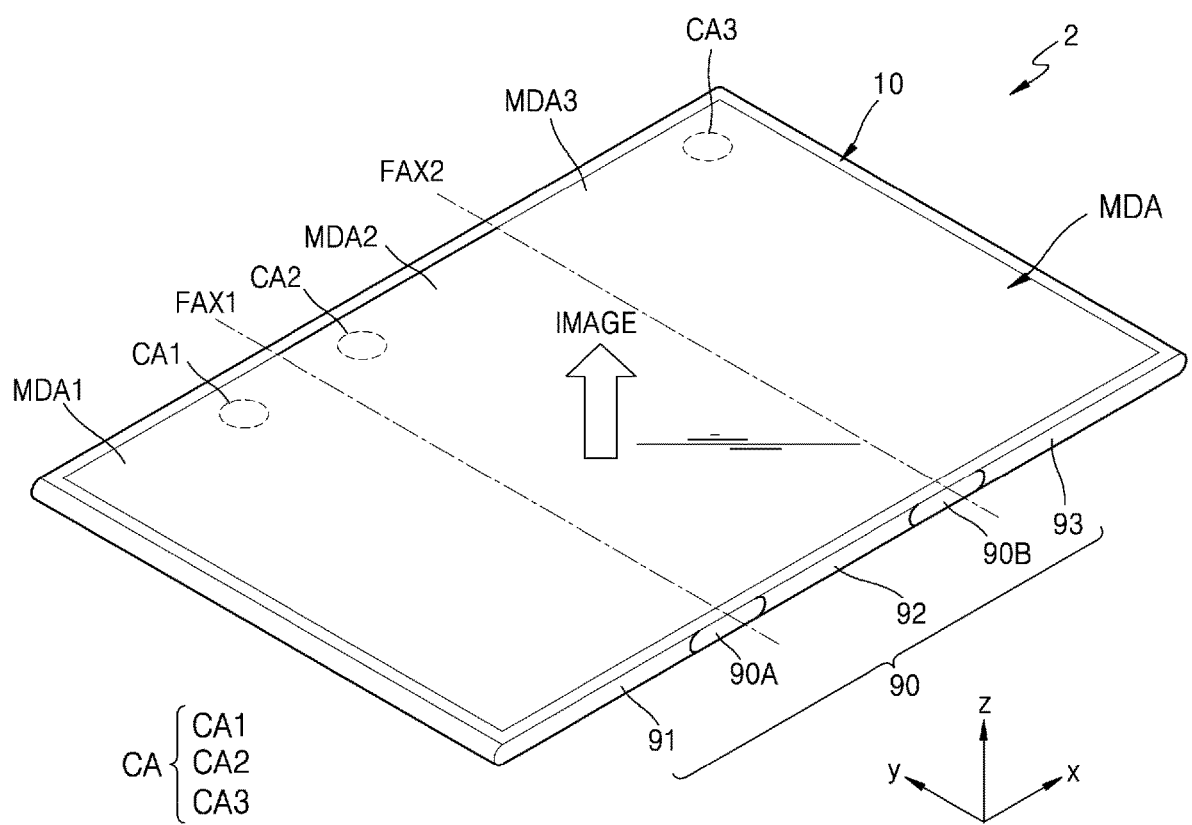
FIGS. 28A and 28B are schematic perspective views illustrating a foldable display device according to another embodiment.
Figure 28B:
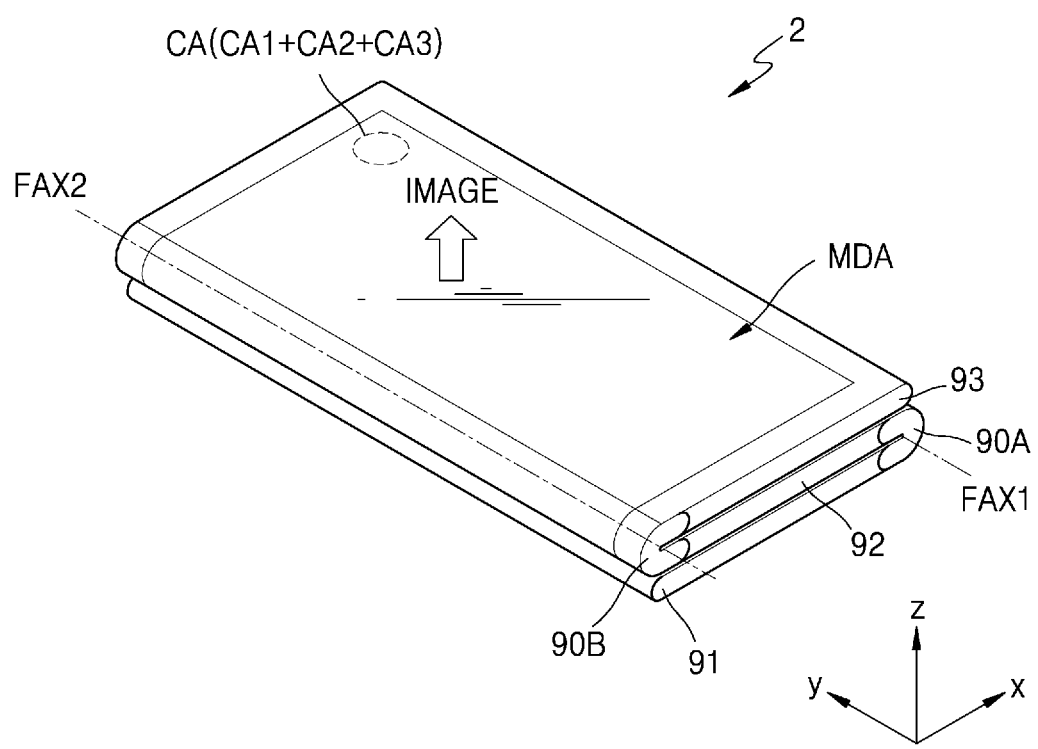
Figure 28C:
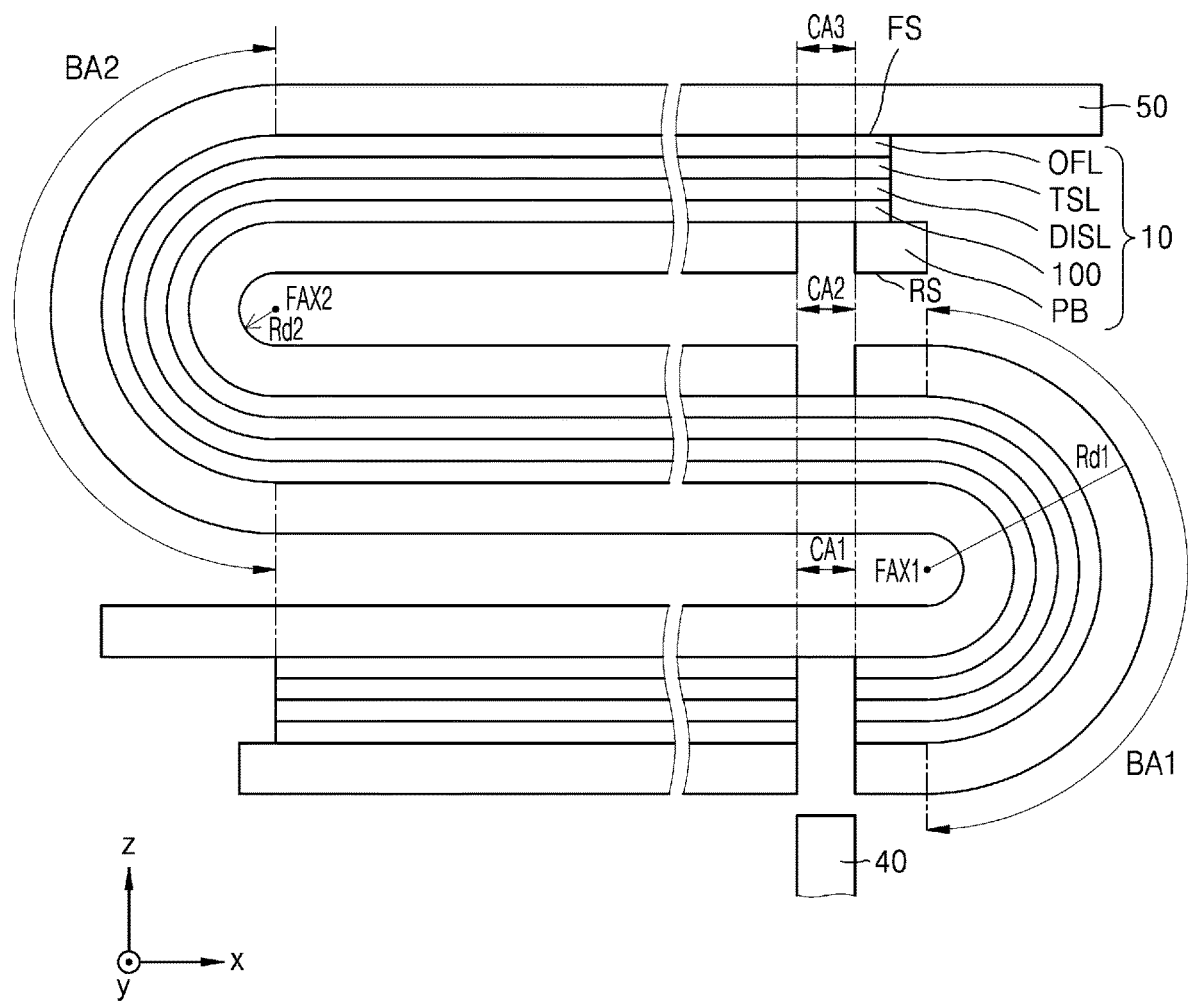
FIG. 28C is a schematic cross-sectional view illustrating a portion of a foldable display device according to another embodiment.

FIGS. 28A and 28B are schematic perspective views illustrating a foldable display device 2 according to another embodiment. FIG. 28C is a schematic cross-sectional view illustrating a portion of a foldable display device according to another embodiment. FIG. 28A is a perspective view showing a state in which the foldable display device 2 is unfolded, and FIG. 28B is a perspective view showing a state in which the foldable display device 2 is folded. FIG. 28C is a cross-sectional view illustrating a foldable display device in a folded state.

The embodiments of FIGS. 28A, 28B, and 28C are different from the embodiments of FIGS. 11A, 11B, and 11C in that a first component area CA1 is arranged on the upper right side of a first main display area MDA1, a second component area CA2 is arranged on the upper left side of a second main display area MDA2, and a third component area CA3 is arranged on the upper right side of a third main display area MDA3.

Referring to FIG. 28A, a display panel 10 may include a main display area MDA and a component area CA. The main display area MDA and the component area CA may display images. In this case, the display panel 10 may be folded around or about a first folding axis FAX1 and a second folding axis FAX2, which cross the main display area MDA.

In the illustrated embodiment, the first component area CA1 may be arranged on the upper right side of the first main display area MDA1, the second component area CA2 may be arranged on the upper left side of the second main display area MDA2, and the third component area CA3 may be arranged on the upper right side of the third main display area MDA3.

In this case, the first component area CA1 and the second component area CA2 may be symmetrically arranged based on or about the first folding axis FAX1, and the second component area CA2 and the third component area CA3 may be symmetrically arranged based on or about the second folding axis FAX2.

Referring to FIGS. 28B and 28C, the first main display area MDA1 and the second main display area MDA2 may be folded to face each other based on the first folding axis FAX1, and a second portion 92 and a third portion 93 may be folded to face each other based on the second folding axis FAX2.

In this case, in a state in which the foldable display device 2 is folded around or about the first folding axis FAX1 and the second folding axis FAX2, the first component area CA1, the second component area CA2, and the third component area CA3 may overlap one another on a plane or in a plan view. In other words, the first component area CA1, the second component area CA2, and the third component area CA3 may overlap one another in a plan view when the foldable display device 2 is folded around or about the first folding axis FAX1 and the second folding axis FAX2.

Figure 29A:
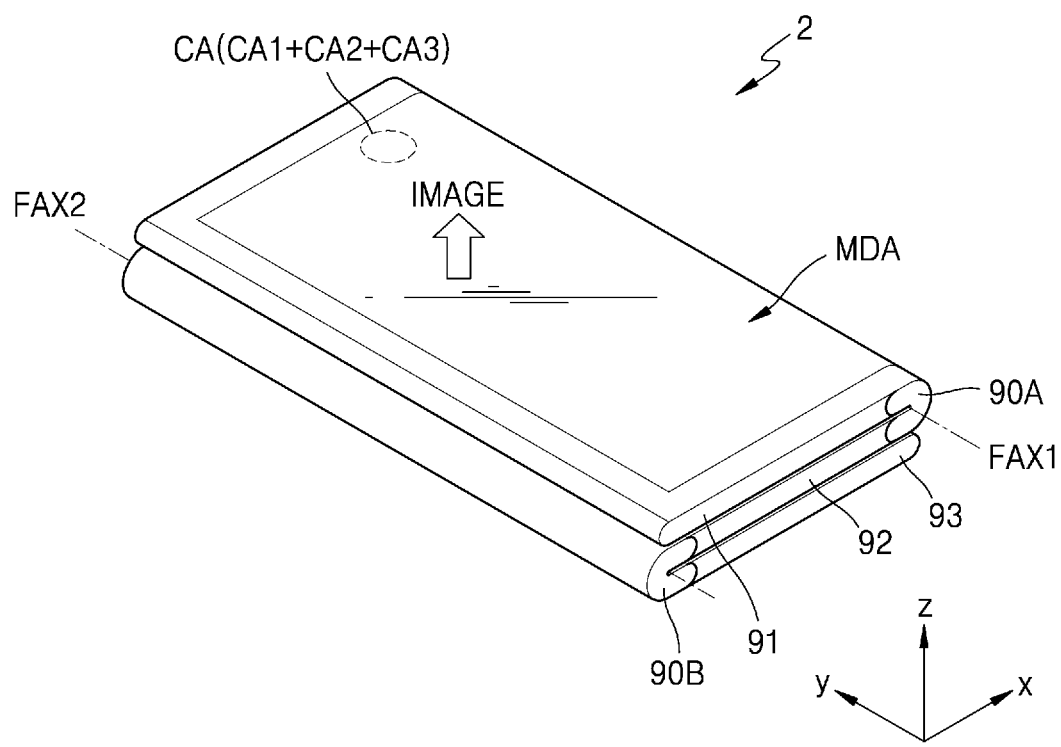
FIG. 29A is a schematic perspective view illustrating a foldable display device according to another embodiment.
Figure 29B:
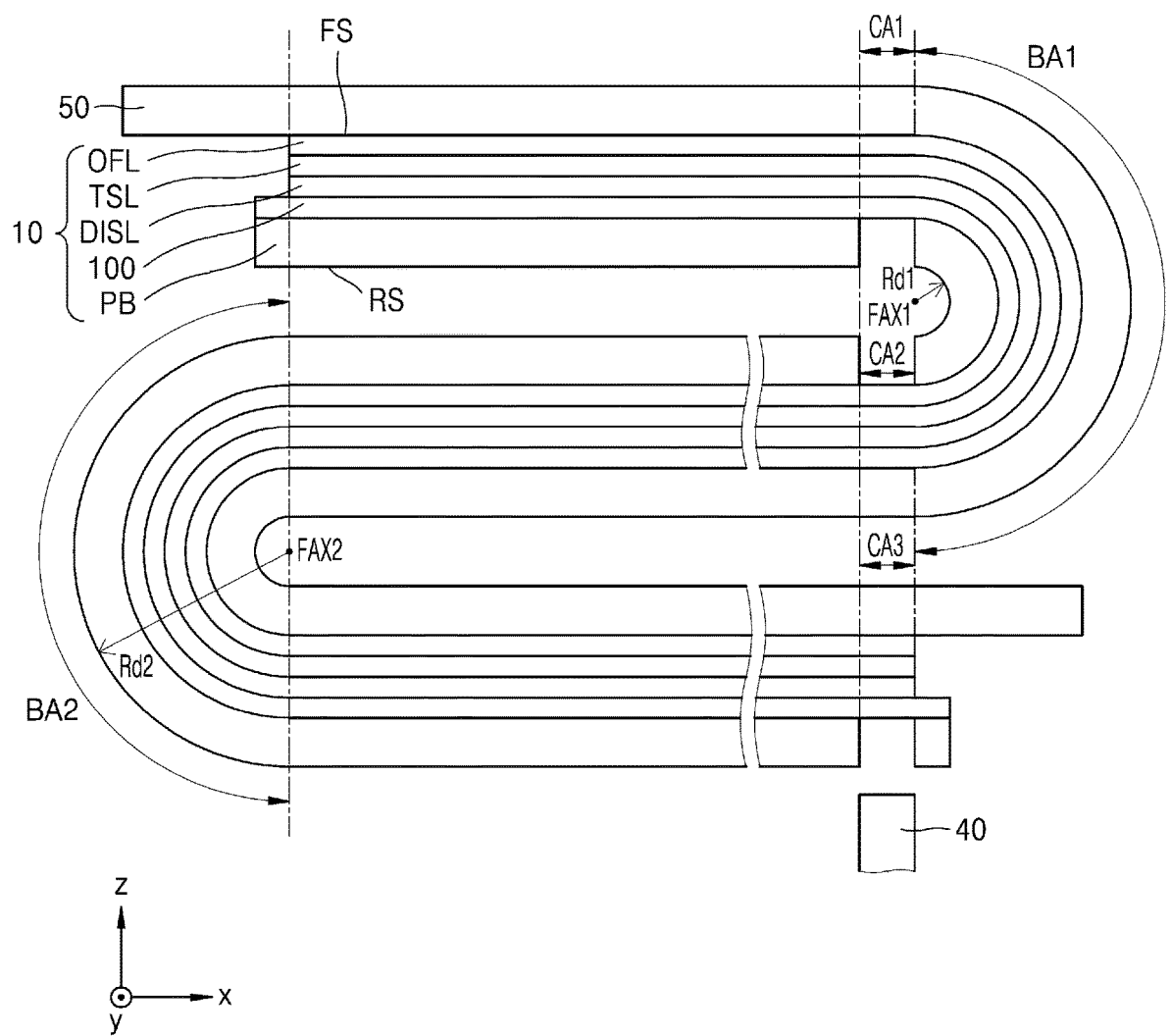
FIG. 29B is a schematic cross-sectional view illustrating a portion of a foldable display device according to another embodiment.

FIG. 29A is a schematic perspective view illustrating a foldable display device 2 according to another embodiment. FIG. 29B is a schematic cross-sectional view illustrating a portion of a foldable display device according to another embodiment.

Referring to FIGS. 29A and 29B, a second main display area and a third main display area may be folded to face each other based on a second folding axis FAX2. That is, a second portion 92 and a third portion 93 may be folded so as not to face each other (e.g., face away from each other) based on the second folding axis FAX2.

In the illustrated embodiment, a first portion 91 and the second portion 92 may be folded to face each other based on a first folding axis FAX1. That is, a first main display area and the second main display area may be folded so as not to face each other (e.g., face away from each other) based on the first folding axis FAX1.

In the illustrated embodiment, the foldable display device 2 may be folded such that two areas of the front surface FS of the display panel 10 face each other with respect to one of the first folding axis FAX1 and the second folding axis FAX2. In addition, the foldable display device 2 may be folded such that two areas of the rear surface RS of the display panel 10 face each other with respect to the other of the first folding axis FAX1 and the second folding axis FAX2. For example, the display panel 10 may be arranged such that two areas of the rear surface RS of the display panel 10 face each other with respect to the first folding axis FAX1, and the display panel 10 may be arranged such that two areas of the front surface FS of the display panel 10 face each other with respect to the second folding axis FAX2. In this case, the radius of curvature Rd1 of a first bending area BA1 may be less than the radius of curvature Rd2 of a second bending area BA2.

Furthermore, in the illustrated embodiment, a first component area CA1 may be arranged on the upper right side of a first main display area MDA1, a second component area CA2 may be arranged on the upper left side of a second main display area MDA2, and a third component area CA3 may be arranged on the upper right side of a third main display area MDA3.

In this case, the first component area CA1 and the second component area CA2 may be symmetrically arranged based on or about the first folding axis FAX1, and the second component area CA2 and the third component area CA3 may be symmetrically arranged based on or about the second folding axis FAX2.

In the illustrated embodiment, in a state in which the display panel 10 is unfolded, a component 40 may overlap the third component area CA3.

Figure 30A:
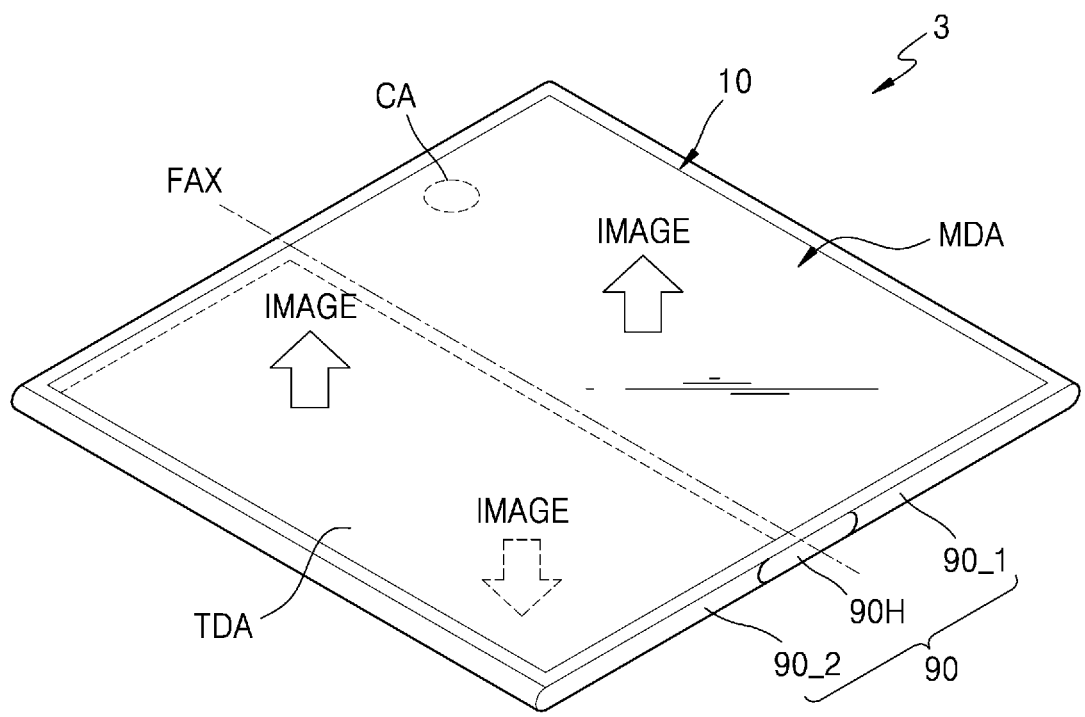
FIGS. 30A and 30B are schematic perspective views illustrating a foldable display device according to another embodiment.
Figure 30B:
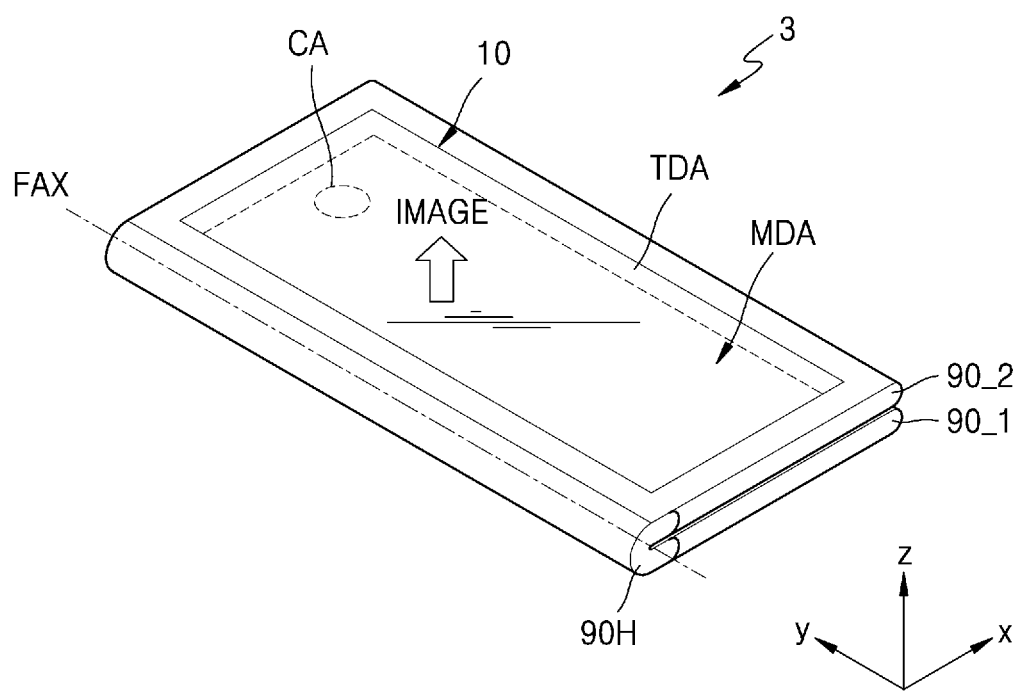
Figure 30C:
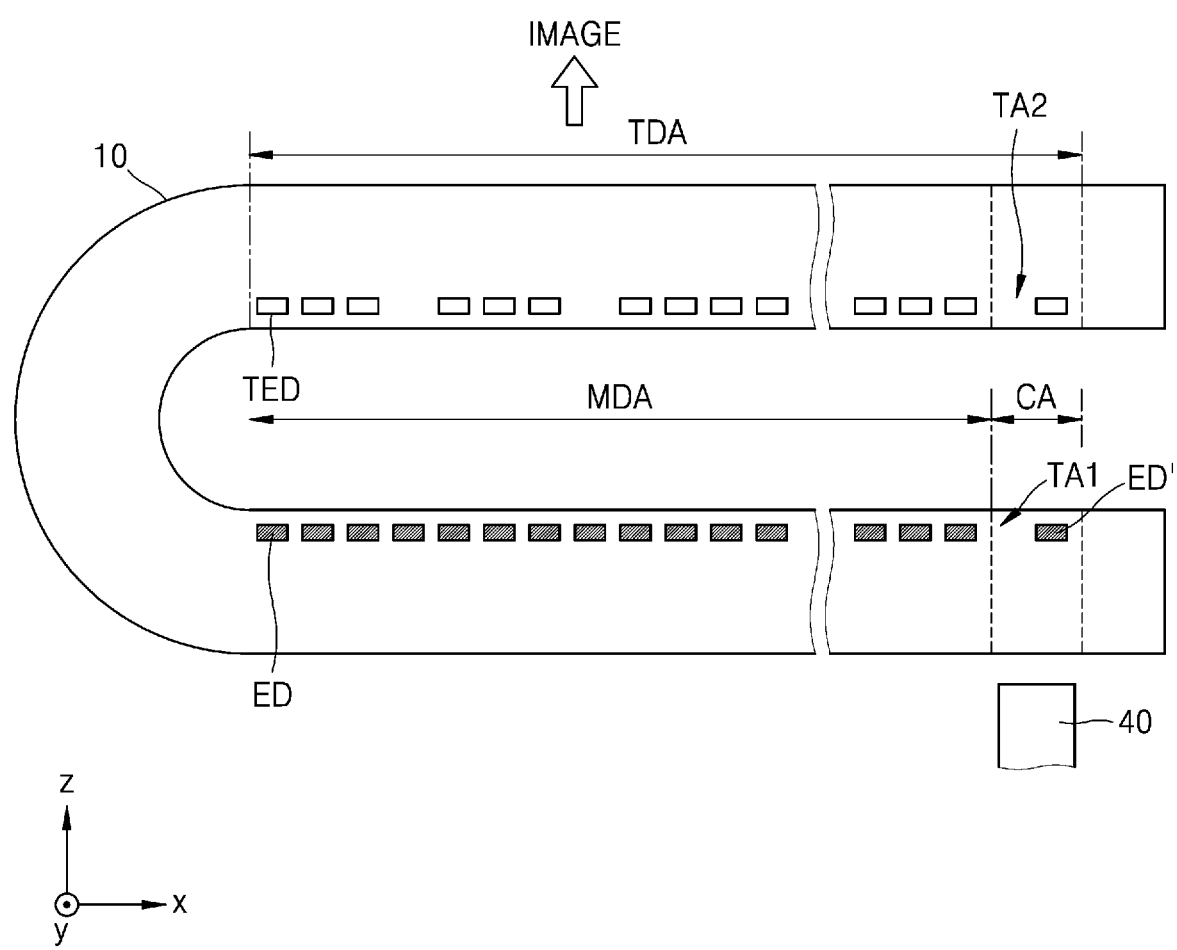
FIG. 30C is a schematic cross-sectional view illustrating a display panel according to another embodiment.

FIGS. 30A and 30B are schematic perspective views illustrating a foldable display device 3 according to another embodiment. FIG. 30C is a schematic cross-sectional view illustrating a display panel 10 according to another embodiment. FIG. 30A is a perspective view showing a state in which the foldable display device 3 is unfolded, and FIG. 30B is a perspective view showing a state in which the foldable display device 3 is folded. FIG. 30C is a cross-sectional view showing a state in which the display panel 10 is folded.

Referring to FIG. 30A, the foldable display device 3 may include a display panel 10 and a lower cover 90. The lower cover 90 may include a first portion 90_1 and a second portion 90_2, which support the display panel 10. The lower cover 90 may be folded around or about a folding axis FAX between the first portion 90_1 and the second portion 90_2. In an embodiment, a hinge portion 90H may be included between the first portion 90_1 and the second portion 90_2. In addition, in an embodiment, the second portion 90_2 may include a light transmissive material, or may be arranged on the edge of a transparent display area TDA that may be described in more detail below.

The display panel 10 may include a main display area MDA, a component area CA, and the transparent display area TDA. The main display area MDA may surround or at least partially surround at least a portion of the component area CA, and the transparent display area TDA may be connected to the main display area MDA.

The main display area MDA, the component area CA, and the transparent display area TDA may display images. In the transparent display area TDA, objects or backgrounds arranged on or at a side of the lower surface of the second portion 90_2 may be viewed on or from the upper surface of the transparent display area TDA.

In the illustrated embodiment, the component area CA and the transparent display area TDA may each include a transmissive portion. For example, the component area CA may include a first transmissive portion, and the transparent display area TDA may include a second transmissive portion. In this case, the light transmittance of the component area CA and the transparent display area TDA may be greater than that of the main display area MDA. In an embodiment, the transparent display area TDA may include a transparent auxiliary sub-pixel. In this case, the main display area MDA displays an image in the +z direction, but the transparent display area TDA may emit light in the +z direction and/or the −z direction and may display an image in the +z direction and/or the −z direction.

The display panel 10 may be folded around or about a folding axis FAX. Accordingly, the transparent display area TDA may be symmetrically arranged with respect to the main display area MDA and the component area CA based on the folding axis FAX.

In an embodiment, the transparent display area TDA may be folded to face the main display area MDA and the component area CA. In another embodiment, the transparent display area TDA may be folded so as not to face (e.g., face away from) the main display area MDA and the component area CA. That is, the first portion 90_1 and the second portion 90_2 may be folded to face each other based on the folding axis FAX. Hereinafter, a case where the transparent display area TDA is folded to face the main display area MDA and the component area CA may be described in more detail below.

Referring to FIGS. 30B and 30C, the foldable display device 3 may include a main display area MDA, a component area CA, and a transparent display area TDA. In this case, the component area CA may include a first transmissive portion TA1, and the transparent display area TDA may include a second transmissive portion TA2.

In the illustrated embodiment, in a state in which the foldable display device 3 is folded, the transparent display area TDA may overlap the component area CA and the main display area MDA on a plane or in a plan view. In other words, the transparent display area TDA may overlap the component area CA when the foldable display device 3 is folded around or about the folding axis FAX. In this case, images of the main display area MDA and the component area CA, which are displayed on the lower surface of the second portion 90_2, may be viewed on or from the upper surface of the transparent display area TDA.

In the illustrated embodiment, the main display area MDA may include a main light-emitting element ED. The component area CA may include an auxiliary light-emitting element ED'. The transparent display area TDA may include a transparent light-emitting element TED. In this case, a pixel electrode of the transparent light-emitting element TED may not include a reflective layer. Therefore, the transparent light-emitting element TED may emit light from both sides thereof, and a user may see the light emitted by the transparent light-emitting element TED above and/or below the transparent display area TDA.

A component 40 may overlap the component area CA. Specifically, the component 40 may be arranged to overlap the component area CA and the transparent display area TDA, which have high light transmittance.

Figure 31:
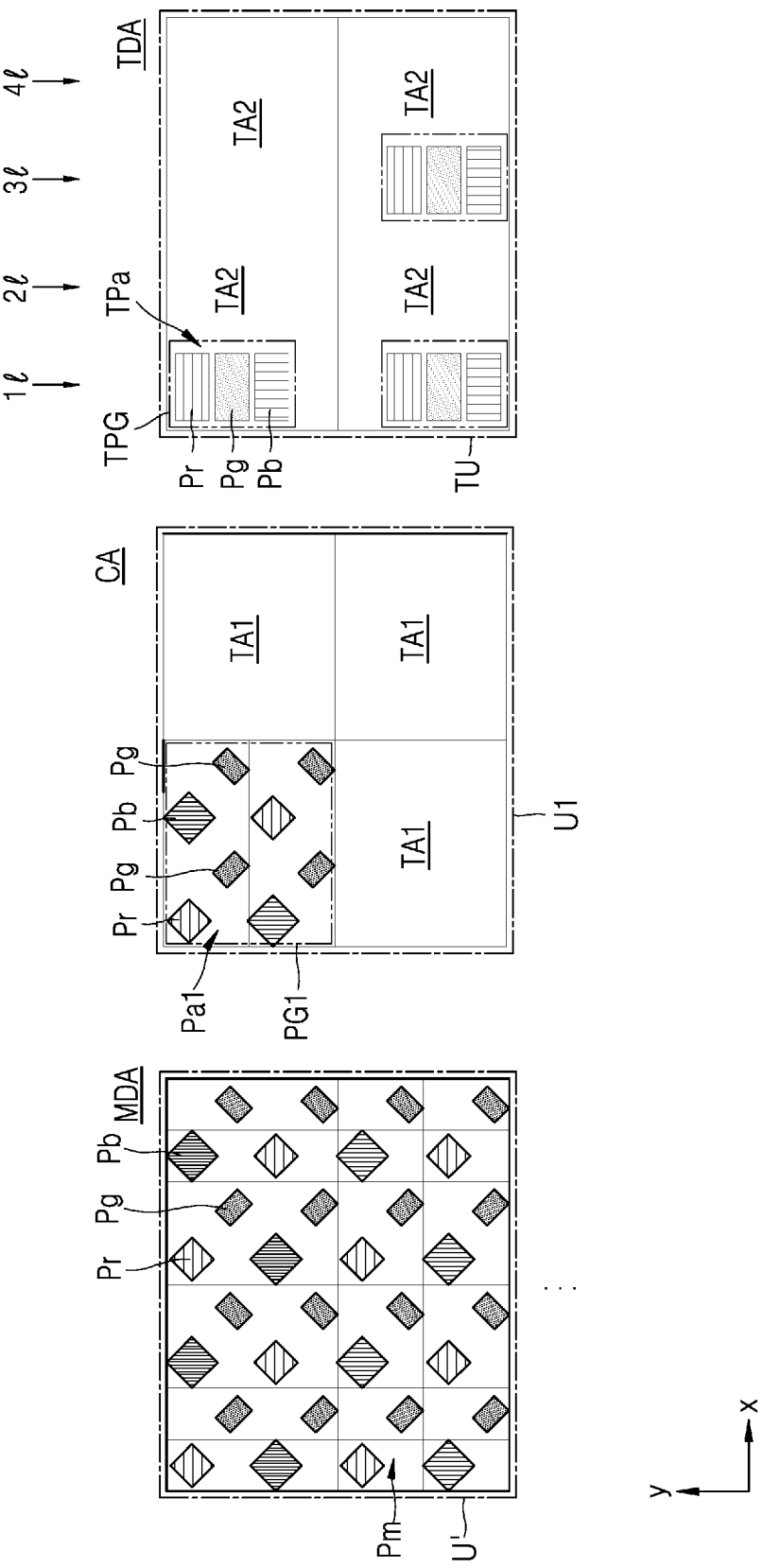
FIG. 31 is a schematic layout diagram illustrating pixel arrangement structures in a main display area, a transparent display area, and a component area according to an embodiment.
Figure 32:
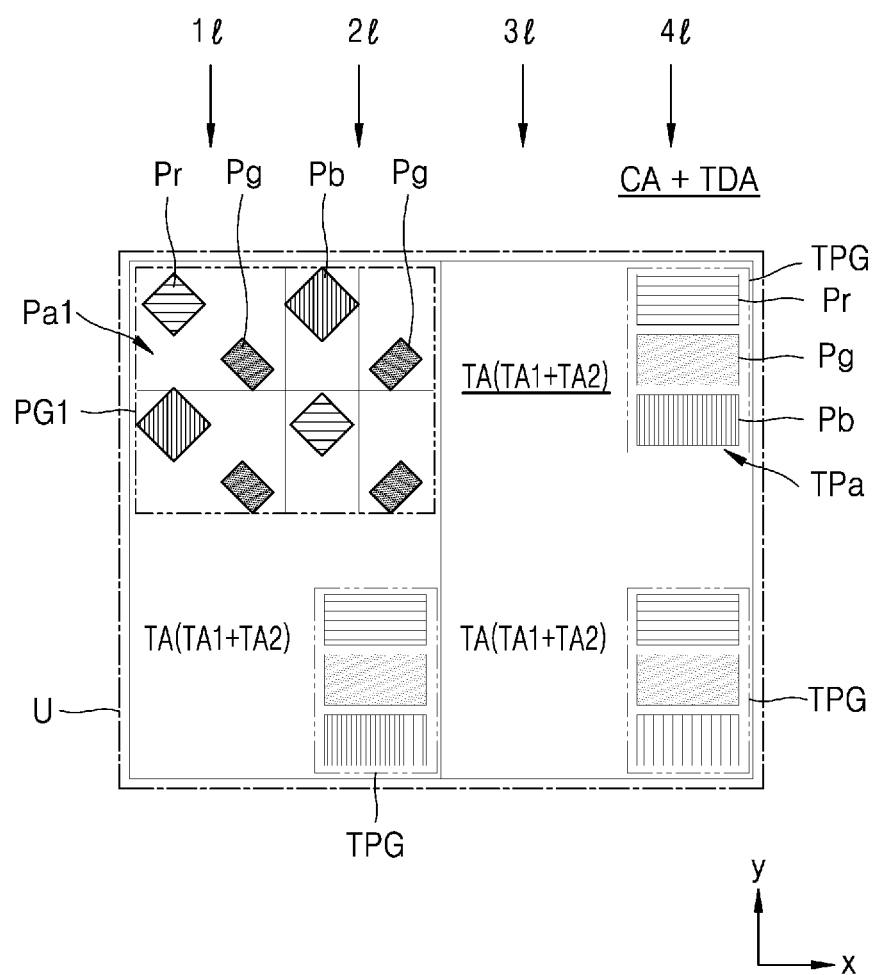
FIG. 32 is a schematic layout diagram illustrating a pixel arrangement structure in a state in which a display panel is folded according to an embodiment.

FIG. 31 is a schematic layout diagram illustrating pixel arrangement structures in a main display area MDA, a transparent display area TDA, and a component area CA according to an embodiment. FIG. 31 schematically illustrates pixel arrangement structures in the main display area MDA, the transparent display area TDA, and the component area CA in a state in which a display panel is unfolded. FIG. 32 is a schematic layout diagram illustrating a pixel arrangement structure in a state in which a display panel is folded according to an embodiment. In FIGS. 31 and 32, the same reference numerals as those in FIGS. 5, 6B, and 6D denote the same members, and thus, repeated descriptions thereof may be omitted.

Referring to FIG. 31, a plurality of main sub-pixels Pm may be arranged in the main display area MDA. The main sub-pixels Pm arranged in the main display area MDA may be arranged in a pentile structure. A plurality of transparent auxiliary sub-pixels TPa may be arranged in the transparent display area TDA. A plurality of first auxiliary sub-pixels Pa1 may be arranged in the component area CA.

In the illustrated embodiment, the first auxiliary sub-pixels Pa1 in the component area CA may have a first pixel arrangement structure, and the transparent auxiliary sub-pixels TPa in the transparent display area TDA may have a second pixel arrangement structure. The first pixel arrangement structure may be different from the second pixel arrangement structure.

For example, the pixel arrangement structure in the component area CA may have a resolution that is one fourth that of the main display area MDA, which may be referred to as a 1/4 pentile structure. Eight first auxiliary sub-pixels Pa1 are arranged, in the pen-tile structure, in a first pixel group PG1, but only one first pixel group PG1 may be included in a first basic unit U1. The remaining area of the first basic unit U1 may be provided as a first transmissive portion TA1. Accordingly, the number of first auxiliary sub-pixels Pa1 and the number of main sub-pixels Pm arranged per equal area may be provided in a ratio of 1:4. In this case, the first pixel group PG1 may be arranged on the upper left side of the first basic unit U1. For example, a first pixel group PG1 may be arranged on the upper left side of the first basic unit U1, and three first transmissive portions TA1 may be arranged around the first pixel group PG1. In some embodiments, the first pixel group PG1 may be arranged in the upper left quadrant of the first basic unit U1 and three first transmissive portions TA1 may be respectively arranged in the lower left quadrant, the upper right quadrant, and the lower right quadrant of the first basic unit U1 as shown in FIG. 31.

The pixel arrangement structure of the transparent display area TDA may be provided as a stripe structure. That is, one transparent pixel group TPG may include three transparent auxiliary sub-pixels TPa, that is, a red sub-pixel Pr, a green sub-pixel Pg, and a blue sub-pixel Pb. In addition, the red sub-pixel Pr, the green sub-pixel Pg, and the blue sub-pixel Pb may be arranged in a line in the y direction. In this case, the red sub-pixel Pr, the green sub-pixel Pg, and the blue sub-pixel Pb may each have a long side in the x direction and a short side in the y direction.

In the illustrated embodiment, two transparent pixel groups TPG may be arranged in a line in a first column 1I, and a second transmissive portion TA2 may be arranged in a second column 2I adjacent to the first column 1I. In addition, a second transmissive portion TA2 and one transparent pixel group TPG may be arranged in a third column 3I adjacent to the second column 2I, and a second transmissive portion TA2 may be arranged in a fourth column 4I adjacent to the third column 3I. Therefore, nine transparent auxiliary sub-pixels TPa may be arranged in a transparent basic unit TU. In this case, the transparent pixel groups TPG may be arranged on the upper left, lower left, and lower right sides of the transparent basic unit TU. In some embodiments, the transparent pixel groups TPG may be arranged in the upper left quadrant, the lower left quadrant, and the lower right quadrant of the transparent basic unit TU and second transmissive portions TA2 may be arranged around the transparent pixel groups TPG as shown in FIG. 31.

Referring to FIGS. 31 and 32, in a state in which the display panel or the foldable display device is folded, the first auxiliary sub-pixels Pa1 may overlap the second transmissive portion TA2 on a plane or in a plan view, and the transparent auxiliary sub-pixels TPa may overlap the first transmissive portion TA1 on a plane or in a plan view.

Also, in a state in which the display panel or the foldable display device is folded, the first transmissive portion TA1 and the second transmissive portion TA2 may overlap each other on a plane or in a plan view to form a transmissive portion TA.

In this case, in an embodiment, the first pixel group PG1 may be arranged on the upper left side of a basic unit U. The transparent pixel groups TPG may be arranged on the upper right side, the lower right side, and the lower left side of the basic unit U. Specifically, in the basic unit U, one transparent pixel group TPG may be arranged in the second column 2I, and two transparent pixel groups TPG may be arranged in the fourth column 4I. Therefore, when the foldable display device is folded, the component area CA and the transparent display area TDA may overlap each other and thus resolution may be increased. In addition, because the transparent display area TDA includes the transparent auxiliary sub-pixels TPa, light transmittance may not be significantly lowered even when the foldable display device is folded.

Figure 33A:
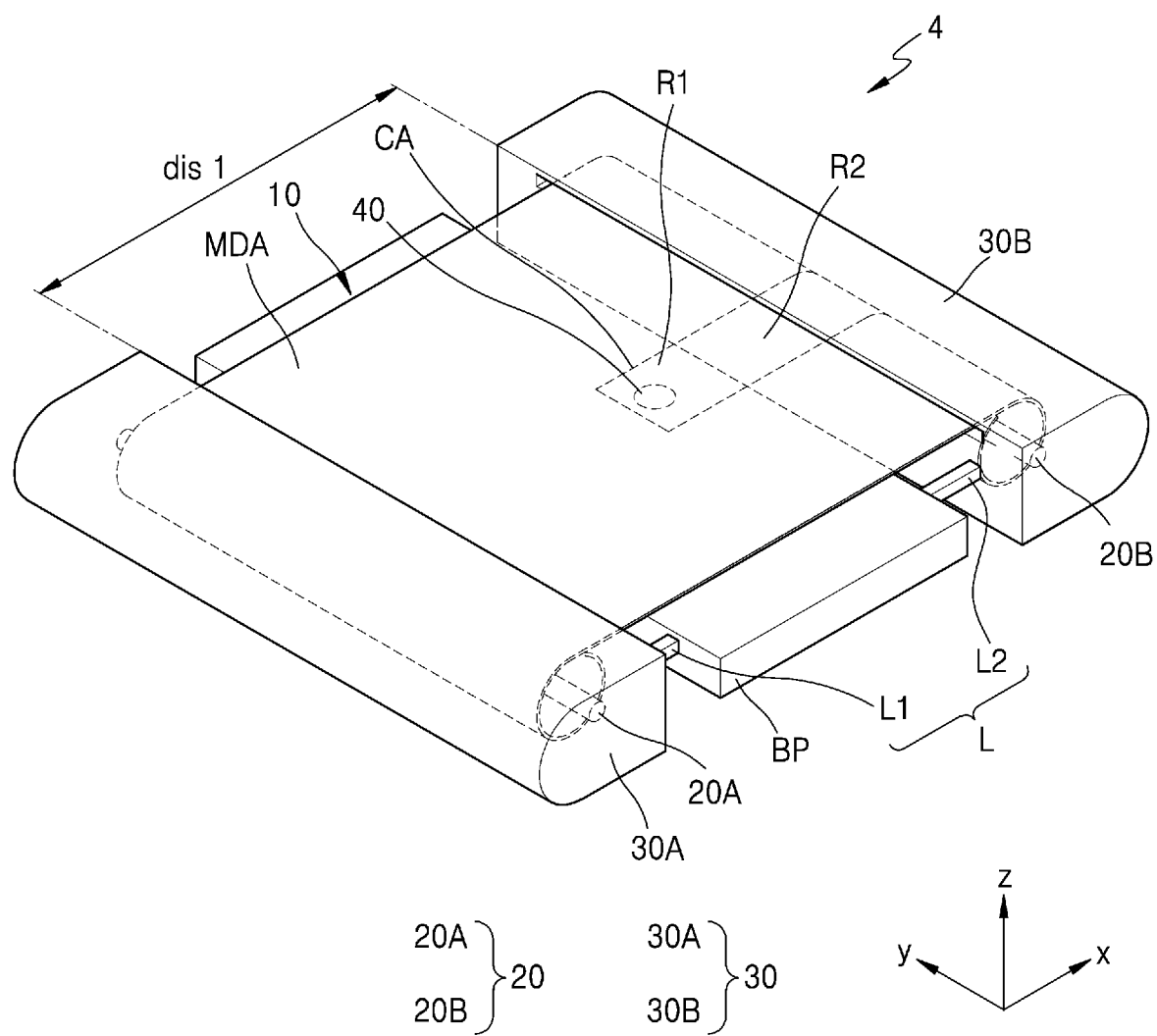
FIGS. 33A and 33B are schematic perspective views illustrating a rollable display device according to an embodiment.
Figure 33B:
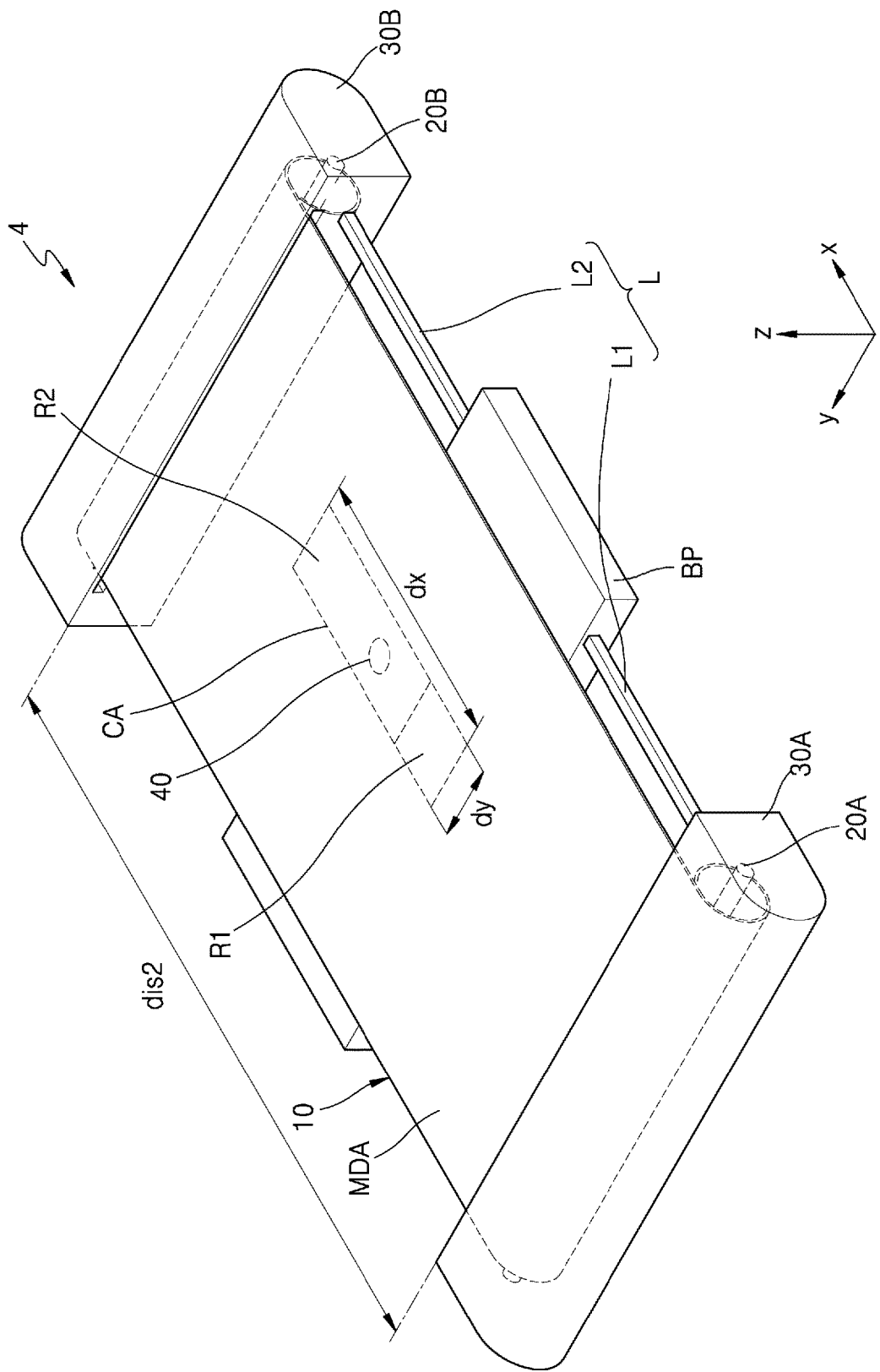
Figure 34:
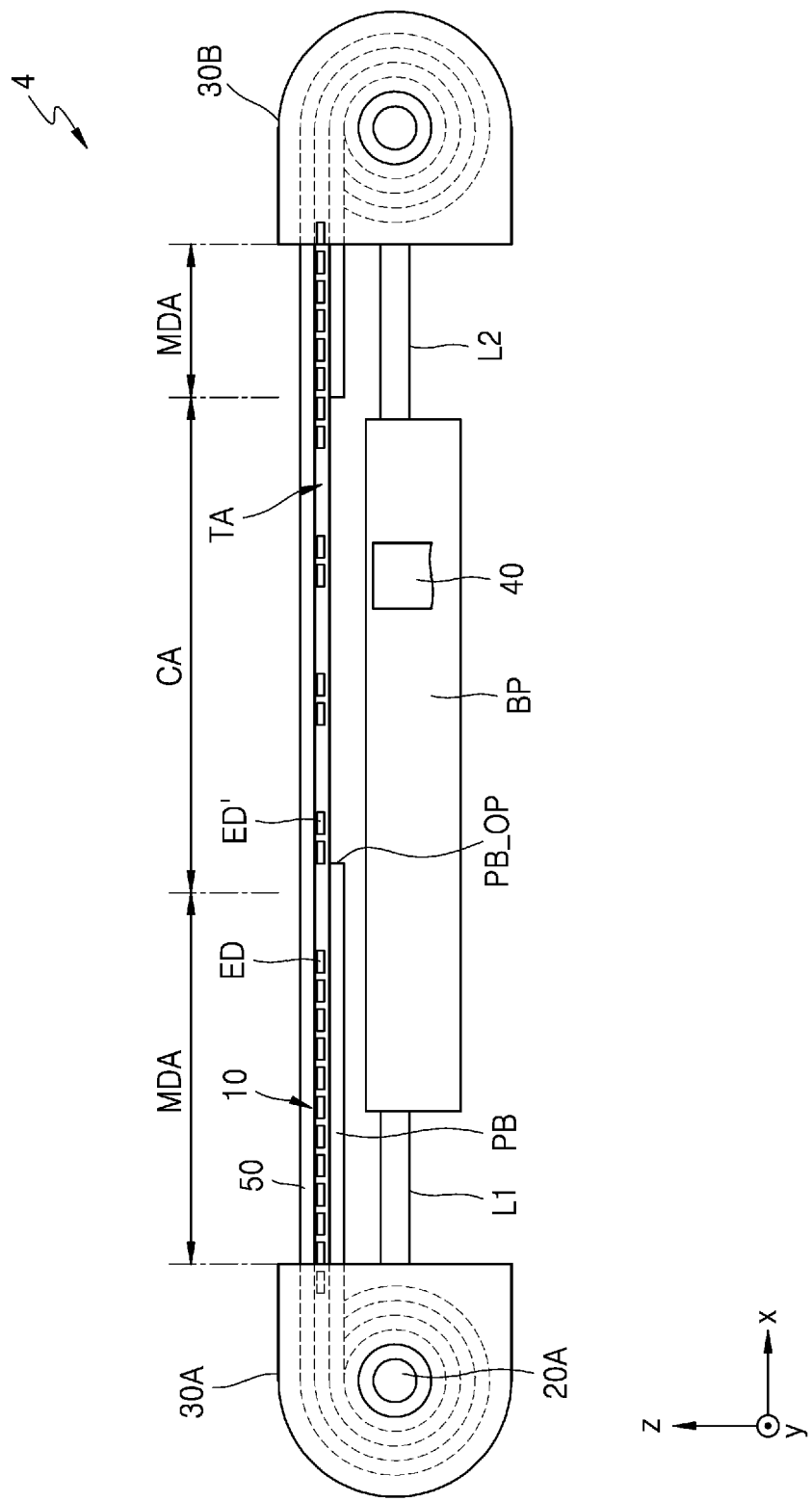
FIG. 34 is a schematic cross-sectional view illustrating a rollable display device according to an embodiment.

FIGS. 33A and 33B are schematic perspective views illustrating a rollable display device 4 according to an embodiment. FIG. 34 is a schematic cross-sectional view illustrating a rollable display device 4 according to an embodiment. FIG. 33A is a perspective view showing a state in which the rollable display device 4 is rolled, and FIG. 33B is a perspective view showing a state in which the rollable display device 4 is unrolled.

Referring to FIGS. 33A, 33B, and 34, the rollable display device 4 may include a display panel 10, a roller 20, a housing portion 30, a component 40, a module portion BP, and an interval adjuster L.

The display panel 10 may be a flexible display panel that is flexible and may be easily bent, folded, or rolled. Specifically, the display panel 10 may be a rollable display panel that may be rolled or unrolled.

The display panel 10 may be rolled or unrolled by the roller 20. For example, when the display panel 10 is rolled by the roller 20, the display panel 10 may be exposed by the housing portion 30 by a first interval dis1 in a first direction (e.g., an x direction or a −x direction) of the display panel 10. When the display panel 10 is unrolled by the roller 20, the display panel 10 may be exposed by the housing portion 30 by a second interval dis2 in the first direction (e.g., the x direction or the −x direction) of the display panel 10. In this case, the first interval dis1 may be less than the second interval dis2. Accordingly, the size of the display panel 10 which is exposed by the housing portion 30 and recognized by or visible to a user may be changed (e.g., changed by rolling and unrolling via the roller 20).

The display panel 10 may include a component area CA including a transmissive portion TA, and a main display area MDA surrounding or at least partially surrounding at least a portion of the component area CA. In this case, the main display area MDA may include a main light-emitting element ED, and the component area CA may include an auxiliary light-emitting element ED'.

The component area CA may extend in the first direction (e.g., the x direction or the −x direction) and a second direction (e.g., a y direction or a −y direction). In an embodiment, a first length dx of the component area CA in the first direction may be greater than a second length dy of the component area CA in the second direction. In this case, the component area CA may have a rectangular shape having a long side in a direction (e.g., the first direction) in which the display panel 10 is rolled or unrolled and a short side in a direction (e.g., the second direction) crossing the direction in which the display panel 10 is rolled or unrolled.

In an embodiment, a cover window 50 may be arranged on the upper surface of the display panel 10, and a panel protection member PB may be arranged on the lower surface of the display panel 10. The panel protection member PB may have an opening PB_OP corresponding to the component area CA.

The roller 20 may roll the display panel 10. Alternatively, the roller 20 may unroll the display panel 10. In some embodiments, the roller 20 may be connected to a driver. The driver may include a motor or the like and may rotate the roller 20. Alternatively, the roller 20 may manually roll or unroll the display panel 10. For example, the display panel 10 may be manually rolled or unrolled by a user.

In an embodiment, the roller 20 may include a first roller 20A and a second roller 20B. The first roller 20A and the second roller 20B may be spaced from each other in the first direction (e.g., the x direction or the −x direction). In some embodiments, one of the first roller 20A and the second roller 20B may be omitted.

The housing portion 30 may accommodate the roller 20. Accordingly, a portion of the display panel 10 may be accommodated in the housing portion 30. A portion of the display panel 10 may be carried into the housing portion 30 or may be taken out of the housing portion 30.

The housing portion 30 may include a curvature portion. Therefore, a user may easily grip the housing portion 30.

In an embodiment, the housing portion 30 may include a first housing portion 30A and a second housing portion 30B. The first housing portion 30A and the second housing portion 30B may be spaced from each other in the first direction (e.g., the x direction or the −x direction). In some embodiments, one of the first housing portion 30A and the second housing portion 30B may be omitted. The first housing portion 30A may accommodate the first roller 20A. The second housing portion 30B may accommodate the second roller 20B.

The first housing portion 30A and the second housing portion 30B may expose a portion of the display panel 10. For example, the first housing portion 30A and the second housing portion 30B may be spaced from each other in the first direction (e.g., the x direction or the −x direction). In this case, the display panel 10 may be exposed by a separation distance between the first housing portion 30A and the second housing portion 30B.

Referring to FIG. 33A, the first housing portion 30A and the second housing portion 30B may be spaced from each other by the first interval dis1 in the first direction (e.g., the x direction or the −x direction). In this case, the display panel 10 may be exposed in the first direction (e.g., the x direction or the −x direction) by the first interval dis1. Referring to FIG. 33B, the first housing portion 30A and the second housing portion 30B may be spaced from each other by the second interval dis2 in the first direction (e.g., the x direction or the −x direction). In this case, the display panel 10 may be exposed in the first direction (e.g., the x direction or the −x direction) by the second interval dis2.

The component 40 may be an electronic element using light and/or sound. The component 40 may overlap the component area CA of the display panel 10. Also, the component 40 may be arranged under the display panel 10. In this case, the component 40 may be arranged in the module portion BP.

The module portion BP may be arranged under the display panel 10. In this case, the module portion BP may support the display panel 10. In an embodiment, the module portion BP may guide the display panel 10. For example, when the display panel 10 is a flexible display panel, the display panel 10 may be bent by its own weight. In this case, because the module portion BP supports the display panel 10, the display panel 10 may be prevented or substantially prevented from being bent by its own weight.

In an embodiment, the module portion BP may include a high modulus material. For example, the module portion BP may include at least one selected from the group consisting of Invar, Nobinite, Stainless, and an alloy thereof.

In an embodiment, the component 40 may be arranged in the module portion BP. In this case, the module portion BP may include a control circuit connected (e.g., electrically connected) to the component 40. Also, the module portion BP may generate and output signals and voltages for driving the display panel 10.

The interval adjuster L may adjust an interval between the module portion BP and the housing portion 30. The interval adjuster L may be arranged between the module portion BP and the housing portion 30. The interval adjuster L may be extended or reduced (e.g., retracted) in the first direction (e.g., the x direction or the −x direction). Accordingly, the interval adjuster L may adjust the interval between the module portion BP and the housing portion 30.

For example, when the interval adjuster L is extended, the interval between the module portion BP and the housing portion 30 may be increased. In this case, the display panel 10 may be unrolled from the roller 20. As another example, when the interval adjuster L is reduced (e.g., retracted), the interval between the module portion BP and the housing portion 30 may be decreased. In this case, the display panel 10 may be rolled around the roller 20.

The interval adjuster L may include a cylinder. Alternatively, the interval adjuster L may include a rack and pinion structure.

In an embodiment, the interval adjuster L may include a first interval adjuster L1 and a second interval adjuster L2. The first interval adjuster L1 may be arranged between the module portion BP and the first housing portion 30A. The second interval adjuster L2 may be arranged between the module portion BP and the second housing portion 30B.

In an embodiment, the first interval adjuster L1 and the second interval adjuster L2 may be extended or reduced (e.g., retracted) at the same time. In another embodiment, the first interval adjuster L1 and the second interval adjuster L2 may be independently extended or reduced (e.g., retracted).

In the illustrated embodiment, when the display panel 10 is unrolled, a position where the component 40 overlaps the component area CA on a plane or in a plan view may be changed. The component area CA may include a first region R1 and a second region R2 connected in a line in the first direction (e.g., the x direction or the −x direction). Referring to FIG. 33A, the display panel 10 may be exposed by the first interval dis1 in the first direction (e.g., the x direction or the −x direction). In this case, the component 40 may be arranged, on a plane or in a plan view, to overlap the first region R1 of the component area CA.

Then, the display panel 10 may be unrolled from the roller 20. In this case, the interval adjuster L is extended, and thus, the distance between the module portion BP and the housing portion 30 may be increased. Accordingly, referring to FIG. 33B, the display panel 10 may be exposed by the second interval dis2 in the first direction (e.g., the x direction or the −x direction). In this case, the component 40 may be arranged, on a plane or in a plan view, to overlap the second region R2 of the component area CA.

In the illustrated embodiment, the display panel 10 of the rollable display device 4 may include a main display area MDA, and a component area CA overlapping the component 40. In this case, regardless of whether the display panel 10 is unrolled or rolled, the component 40 may overlap the component area CA. Therefore, even though the display panel 10 is unrolled or rolled, the component 40 may receive light passing through the component area CA.

Figure 35A:
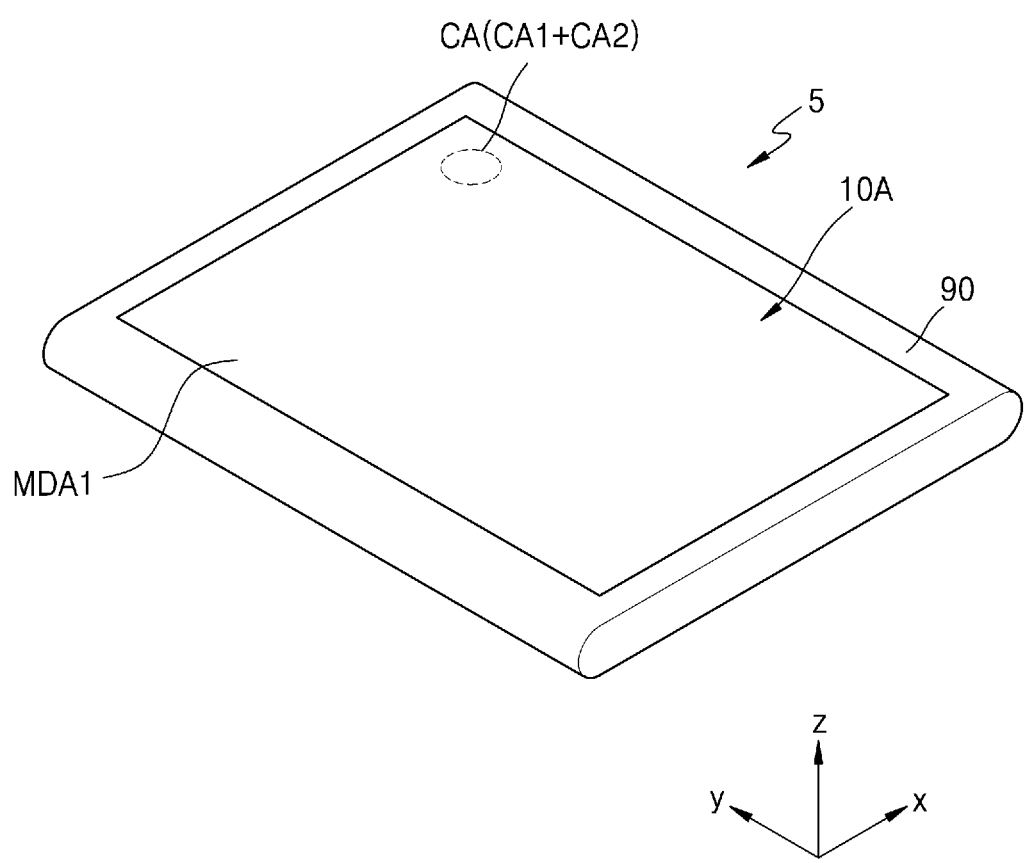
FIGS. 35A and 35B are schematic perspective views illustrating a display device according to an embodiment.
Figure 35B:
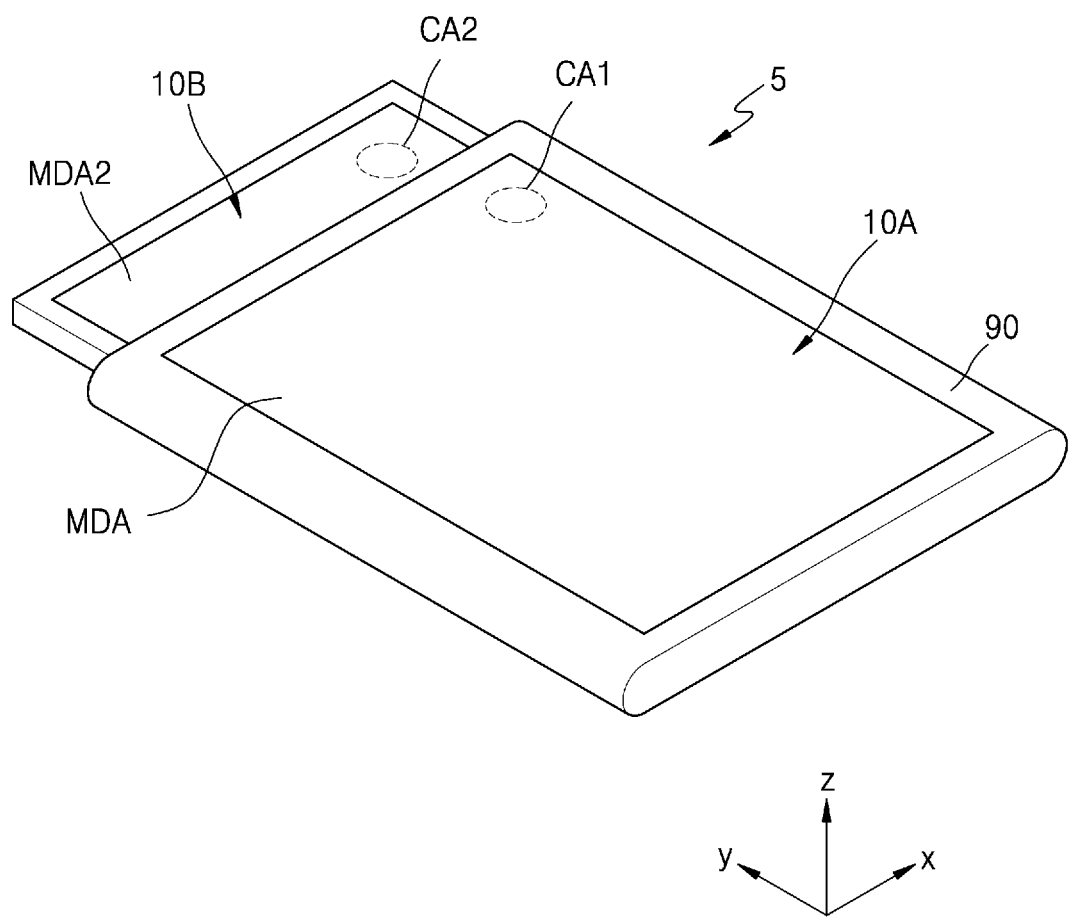

FIGS. 35A and 35B are schematic perspective views illustrating a display device 5 according to an embodiment. FIG. 35A is a perspective view showing a first state in which a first component area CA1 and a second component area CA2 of the display device 5 overlap each other on a plane or in a plan view, and FIG. 35B is a perspective view showing a second state in which the first component area CA1 and the second component area CA2 are spaced from each other on a plane or in a plan view.

Referring to FIGS. 35A and 35B, the display device 5 may include a first display panel 10A, a second display panel 10B, and a lower cover 90. In this case, the lower cover 90 may form a lower surface appearance of the display device 5. Also, the first display panel 10A and the second display panel 10B may be stored by the lower cover 90.

The first display panel 10A may include a first main display area MDA1 and a first component area CA1. In this case, the first main display area MDA1 may surround or at least partially surround at least a portion of the first component area CA1. The first display panel 10A, the first main display area MDA1, and the first component area CA1 may respectively correspond to the display panel 10, the main display area MDA, and the component area CA described with reference to FIGS. 1-10.

In the illustrated embodiment, the second display panel 10B may be arranged on the rear surface of the first display panel 10A. In this case, the rear surface of the first display panel 10A may be a surface opposite to the upper surface of the first display panel 10A on which the first main display area MDA1 and the first component area CA1 are arranged. The second display panel 10B, the second main display area MDA2, and the second component area CA2 may respectively correspond to the display panel 10, the main display area MDA, and the component area CA described with reference to FIGS. 1-10.

In the illustrated embodiment, the second display panel 10B may be movable relative to the first display panel 10A. Specifically, the second display panel 10B may be movable relative to the first display panel 10A on a plane (e.g., on an x-y plane) or in a plan view. For example, the second display panel 10B may be movable in the second direction (e.g., the y direction or the −y direction) with respect to the first display panel 10A. Alternatively, the second display panel 10B may be movable in the first direction (e.g., the x direction or the −x direction) with respect to the first display panel 10A. Hereinafter, a case where the second display panel 10B is movable in the y direction or the −y direction with respect to the first display panel 10A may be described in more detail below.

The second display panel 10B may include a second main display area MDA2 and a second component area CA2. In this case, the second main display area MDA2 may at least partially surround the second component area CA2. In some embodiments, the second display panel 10B may not display an image. For example, in this case, the second display panel 10B may include a second component area CA2 having only a second transmissive portion.

In the illustrated embodiment, the second display panel 10B may be arranged on, facing, or opposite to the rear surface of the first display panel 10A, and the second display panel 10B may be movable relative to the first display panel 10A. Referring to FIG. 35A, in the first state, the second display panel 10B may completely overlap the first display panel 10A on a plane or in a plan view. In other words, the second display panel 10B may be aligned with the first display panel 10A. In this case, the second display panel 10B may be arranged inside the lower cover 90 and may not be exposed to the outside. Referring to FIG. 35B, in the second state, the second display panel 10B may be exposed at least partially to the outside. The second display panel 10B may be moved relative to the first display panel 10A to be exposed at least partially to the outside. Therefore, in the second state, the second display panel 10B may only partially overlap the first display panel 10A on a plane or in a plan view.

In the first state as shown in FIG. 35A, the first component area CA1 and the second component area CA2 may overlap each other on a plane or in a plan view. In this case, the first component area CA1 and the second component area CA2 may form the component area CA.

In addition, in the second state as shown in FIG. 35B, the first component area CA1 and the second component area CA2 may be spaced from each other on a plane or in a plan view. In an embodiment, the first display panel 10A may provide a first image. The second display panel 10B may provide a second image. The first image and the second image may be parts of any one image provided through the display device 5. For example, the first image and the second image may be combined to form a single image. Alternatively, the first image and the second image may be images independent of each other.

Figure 36A:
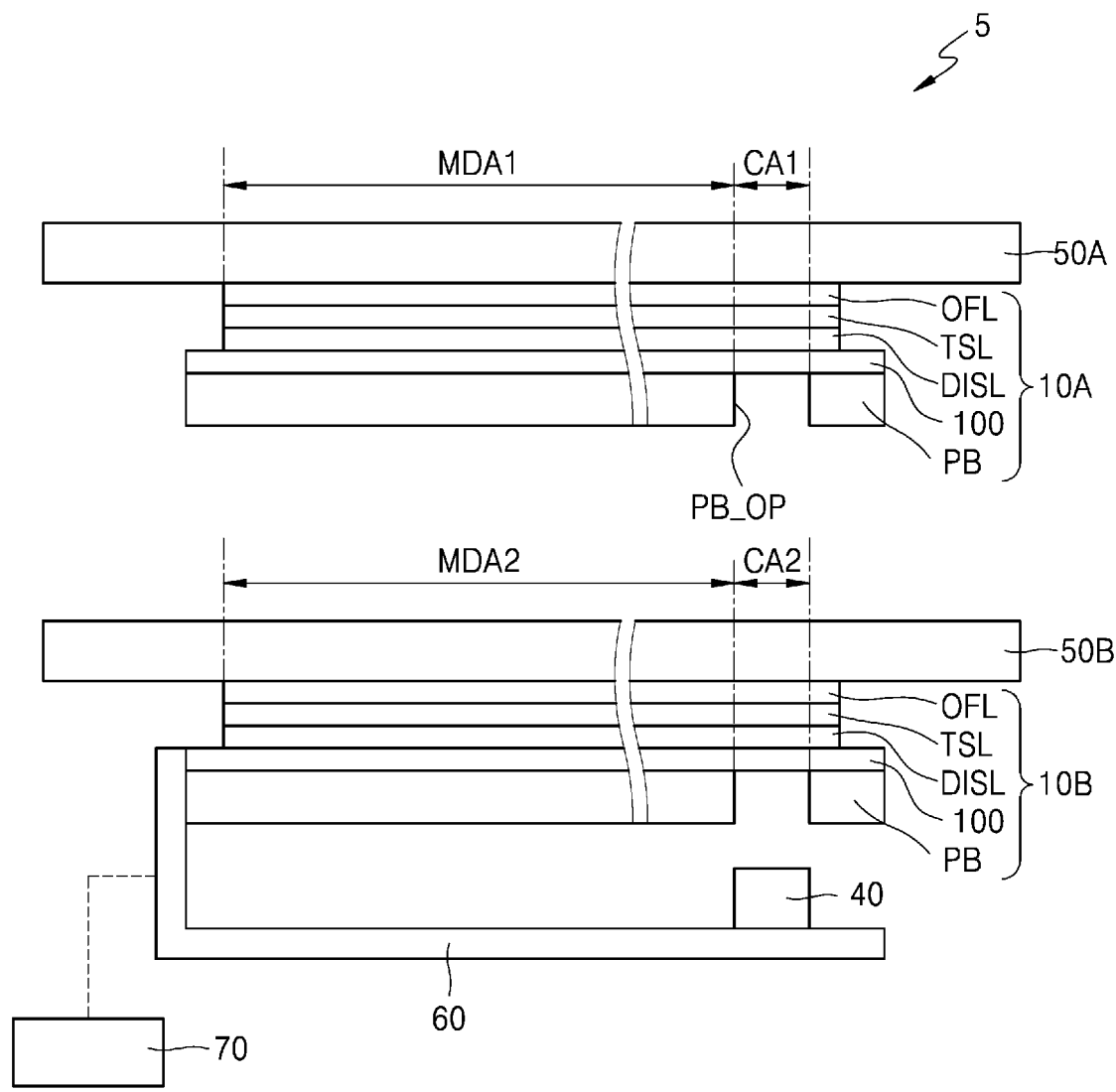
FIGS. 36A and 36B are schematic cross-sectional views illustrating a portion of a display device according to an embodiment.
Figure 36B:
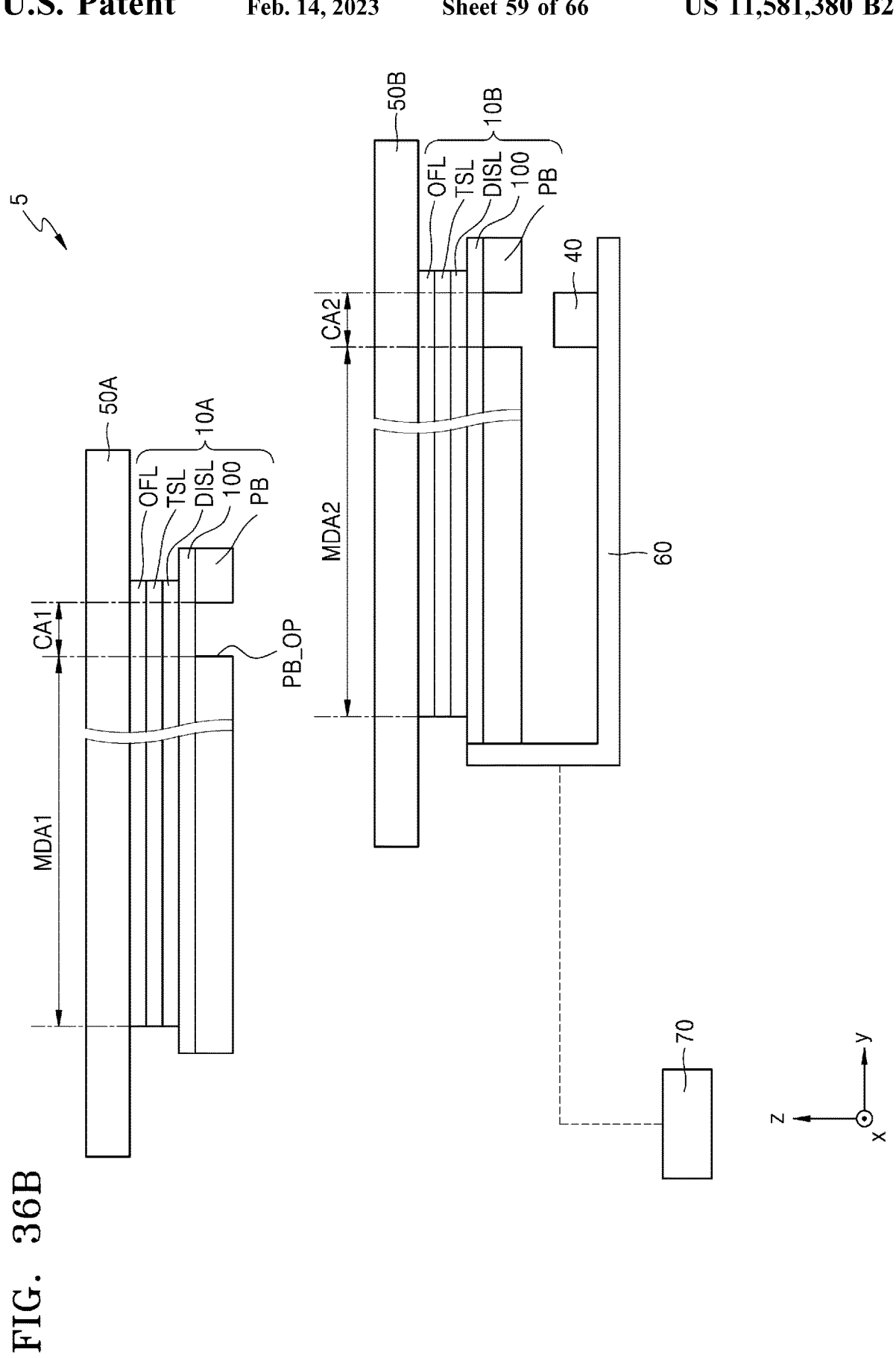

FIGS. 36A and 36B are schematic cross-sectional views illustrating a portion of a display device 5 according to an embodiment. FIG. 36A is a schematic cross-sectional view showing a first state in which a first component area CA1 and a second component area CA2 overlap each other in a z direction. FIG. 36B is a schematic cross-sectional view showing a second state in which a first component area CA1 and a second component area CA2 are spaced from each other in the z direction.

Referring to FIGS. 36A and 36B, the display device 5 may include a first display panel 10A, a second display panel 10B, a component 40, a movement driver 60, and a controller 70. The first display panel 10A and the second display panel 10B may each include a substrate 100, a display layer DISL, a touch screen layer TSL, an optical functional layer OFL, and a panel protection member PB. In addition, a first cover window 50A and a second cover window 50B may be provided on the upper surface of the first display panel 10A and the upper surface of the second display panel 10B, respectively. The first cover window 50A and the second cover window 50B may correspond to the cover window 50 described with reference to FIGS. 1 and 10. In an embodiment, the first cover window 50A and the second cover window 50B may each include, for example, glass, ultra thin glass (UTG), or colorless polyimide (CPI).

The component 40 may be arranged to overlap the second component area CA2. The component 40 may be, for example, a camera, an image sensor, an infrared sensor, an iris sensor, or an ultrasonic sensor. In an embodiment, the component 40 may be spaced from the second display panel 10B. For example, the component 40 may be spaced from the second display panel 10B in the z direction. In another embodiment, the component 40 may be attached to the second display panel 10B.

The second display panel 10B may be moved by the movement driver 60 connected to the second display panel 10B. Therefore, the second display panel 10B may move relative to the first display panel 10A at regular intervals (e.g., intervals of distance). That is, the second display panel 10B may be moved on an x-y plane while maintaining a constant distance from the first display panel 10A.

The movement driver 60 may have various suitable forms. For example, the movement driver 60 may include a linear motor connected to the second display panel 10B. As another example, the movement driver 60 may include a cylinder connected to the second display panel 10B. In this case, the movement driver 60 may be spaced from the second display panel 10B, and a shaft of the movement driver 60 may be connected to the second display panel 10B. As another example, the movement driver 60 may include a moving block connected to the second display panel 10B, a ball screw connected to the moving block, and a motor connected to the ball screw to rotate the ball screw. In this way, the movement driver 60 may be connected to the second display panel 10B and include various devices and structures for moving the second display panel 10B.

The controller 70 may control the movement driver 60. The controller 70 may control the movement driver 60 such that the first component area CA1 and the second component area CA2 overlap each other. Also, the controller 70 may control the movement driver 60 such that the first component area CA1 and the second component area CA2 are spaced from each other in a plan view.

Also, in some embodiments, the second display panel 10B may be connected to a guide portion. In this case, the guide portion may guide the movement of the second display panel 10B. The guide portion may have various suitable forms. For example, the guide portion may include a linear motion guide. In this case, the guide portion may include a block connected to the second display panel 10B and a rail through which the block slides. Alternatively, the guide portion may have a groove shape.

The guide portion may be arranged in various suitable positions. For example, the guide portion may be arranged on the lower surface or side surface of the second display panel 10B in FIGS. 36A and 36B.

In the illustrated embodiment, referring to FIG. 36A, the first component area CA1 and the second component area CA2 in the first state may overlap each other on a plane or in a plan view. That is, the first component area CA1 and the second component area CA2 may overlap each other in the z direction. Therefore, light and/or a signal emitted from the component 40 or light and/or a signal incident on the component 40 may be transmitted through the first component area CA1 and the second component area CA2. Accordingly, the component 40 may be used even in the first state in which the second display panel 10B is not exposed to the outside.

In addition, the second display panel 10B may be moved relative to the first display panel 10A by the movement driver 60. In this case, referring to FIG. 36B, in the second state, the first component area CA1 and the second component area CA2 may be spaced from each other on a plane or in a plan view. That is, the first component area CA1 and the second component area CA2 may be spaced from each other in the z direction. In one or more embodiments, in the second state, the first component area CA1 and the second component area CA2 may be spaced from each other in a plan view. In other words, in the second state, the first component area CA1 and the second component area CA2 may be spaced from each other when in the y-direction.

Figure 37:
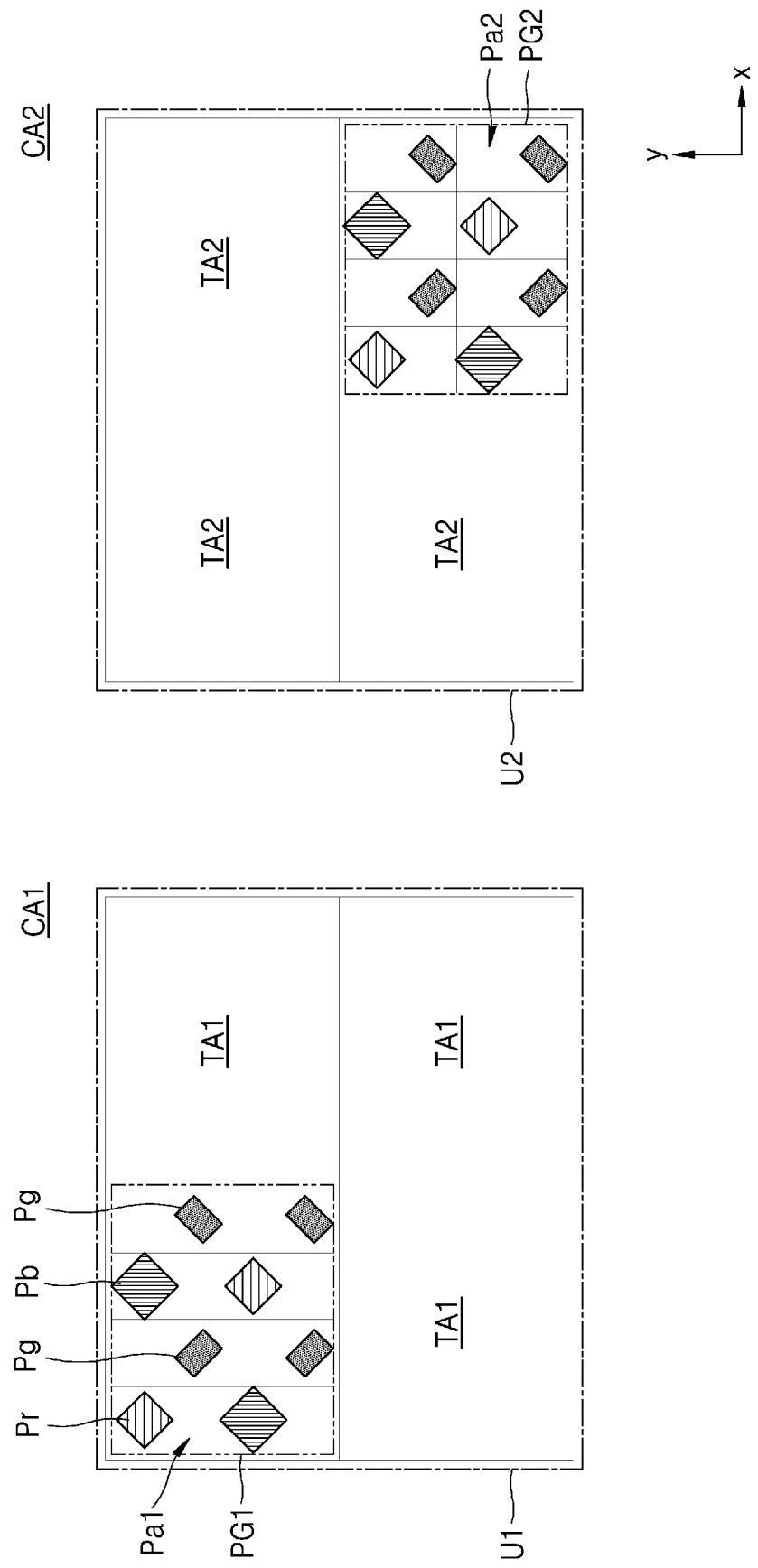
FIG. 37 is a schematic layout diagram illustrating a pixel arrangement structure in a first component area and a second component area according to an embodiment.

FIG. 37 is a schematic layout diagram illustrating a pixel arrangement structure in a first component area CA1 and a second component area CA2 according to an embodiment.

Referring to FIG. 37, a first transmissive portion TA1 and first auxiliary sub-pixels Pa1 may be arranged in the first component area CA1. The first auxiliary sub-pixels Pa1 may define a first pixel group PG1. The first pixel group PG1 may include eight first auxiliary sub-pixels Pa1 arranged in a pentile structure. That is, one first pixel group PG1 may include two red sub-pixels Pr, four green sub-pixels Pg, and two blue sub-pixels Pb. In some embodiments, the first pixel group PG1 may be arranged in a stripe structure (e.g., see FIG. 6D) or an S-stripe structure (e.g., see FIG. 6C).

In the first component area CA1, a first basic unit U1 in which a certain number of first pixel groups PG1 and a certain number of first transmissive portions TA1 are bundled together may be repeatedly arranged in the x direction and the y direction. For example, a first pixel group PG1 may be arranged on the upper left side of the first basic unit U1, and three first transmissive portions TA1 may be arranged around the first pixel group PG1. In some embodiments, the first pixel group PG1 may be arranged in the upper left quadrant of the first basic unit U1 and three first transmissive portions TA1 may be respectively arranged in the lower left quadrant, the upper right quadrant, and the lower right quadrant of the first basic unit U1 as shown in FIG. 37.

A second transmissive portion TA2 and second auxiliary sub-pixels Pa2 may be arranged in the second component area CA2. The second auxiliary sub-pixels Pa2 may define a second pixel group PG2. The second pixel group PG2 may include eight second auxiliary sub-pixels Pa2 arranged in a pentile structure, similar to the first pixel group PG1. The second pixel group PG2 may also be arranged in a stripe structure (e.g., see FIG. 6D) or an S-stripe structure (e.g., see FIG. 6C).

In the second component area CA2, a second basic unit U2 in which a certain number of second pixel groups PG2 and a certain number of second transmissive portions TA2 are bundled together may be repeatedly arranged in the x direction and the y direction. For example, a second pixel group PG2 may be arranged on the lower right side of the second basic unit U2, and three second transmissive portions TA2 may be arranged around the second pixel group PG2. For example, the second pixel group PG2 may be arranged in the lower right quadrant of the second basic unit U2 and three second transmissive portions TA2 may be respectively arranged in the upper left quadrant, the upper right quadrant, and the lower left quadrant of the second basic unit U2 as shown in FIG. 37.

Figure 38A:
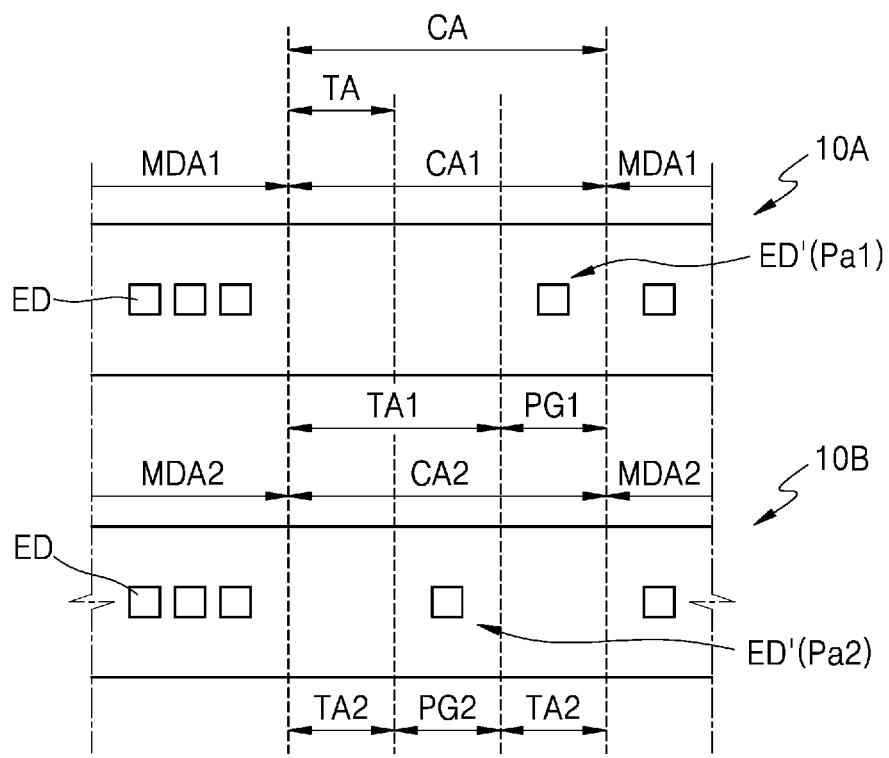
FIG. 38A is a cross-sectional view showing a first state in which a first component area and a second component area overlap each other.
Figure 38B:
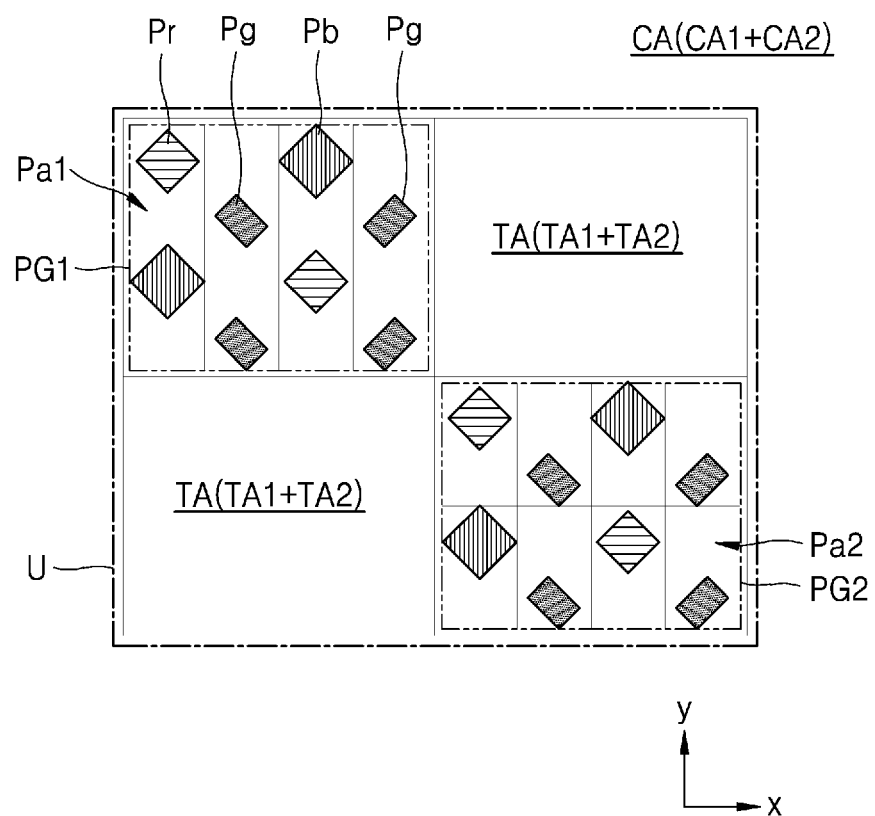
FIG. 38B is a plan view showing the first state in which the first component area and the second component area overlap each other.

FIG. 38A is a cross-sectional view showing a first state in which a first component area CA1 and a second component area CA2 overlap each other. FIG. 38B is a plan view showing the first state in which the first component area CA1 and the second component area CA2 overlap each other.

Referring to FIGS. 38A and 38B, the first component area CA1 and the second component area CA2 may overlap each other on a plane or in a plan view. Therefore, one component area CA may be formed.

In the first state in which the first component area CA1 and the second component area CA2 overlap each other, first auxiliary sub-pixels Pa1 may overlap a second transmissive portion TA2 on a plane or in a plan view. Also, second auxiliary sub-pixels Pa2 may overlap a first transmissive portion TA1 on a plane or in a plan view.

In addition, in the first state in which the first component area CA1 and the second component area CA2 overlap each other, the first transmissive portion TA1 and the second transmissive portion TA2 overlap each other on a plane or in a plan view to form a transmissive portion TA.

In this case, in an embodiment, the first pixel group PG1 may be arranged on the upper left side of a basic unit U. The second pixel group PG2 may be arranged on the lower right side of the basic unit U. The transmissive portion TA may be arranged on the upper right and lower left sides of the basic unit U. Accordingly, in the first state in which the first component area CA1 and the second component area CA2 overlap each other, the resolution of the component area CA may be increased. Further, even in the first state in which the first component area CA1 and the second component area CA2 overlap each other, light and/or a signal emitted from a component or light and/or a signal incident on the component may be transmitted through the transmissive portion TA because the basic unit U is provided with the transmissive portion TA.

Figure 39:
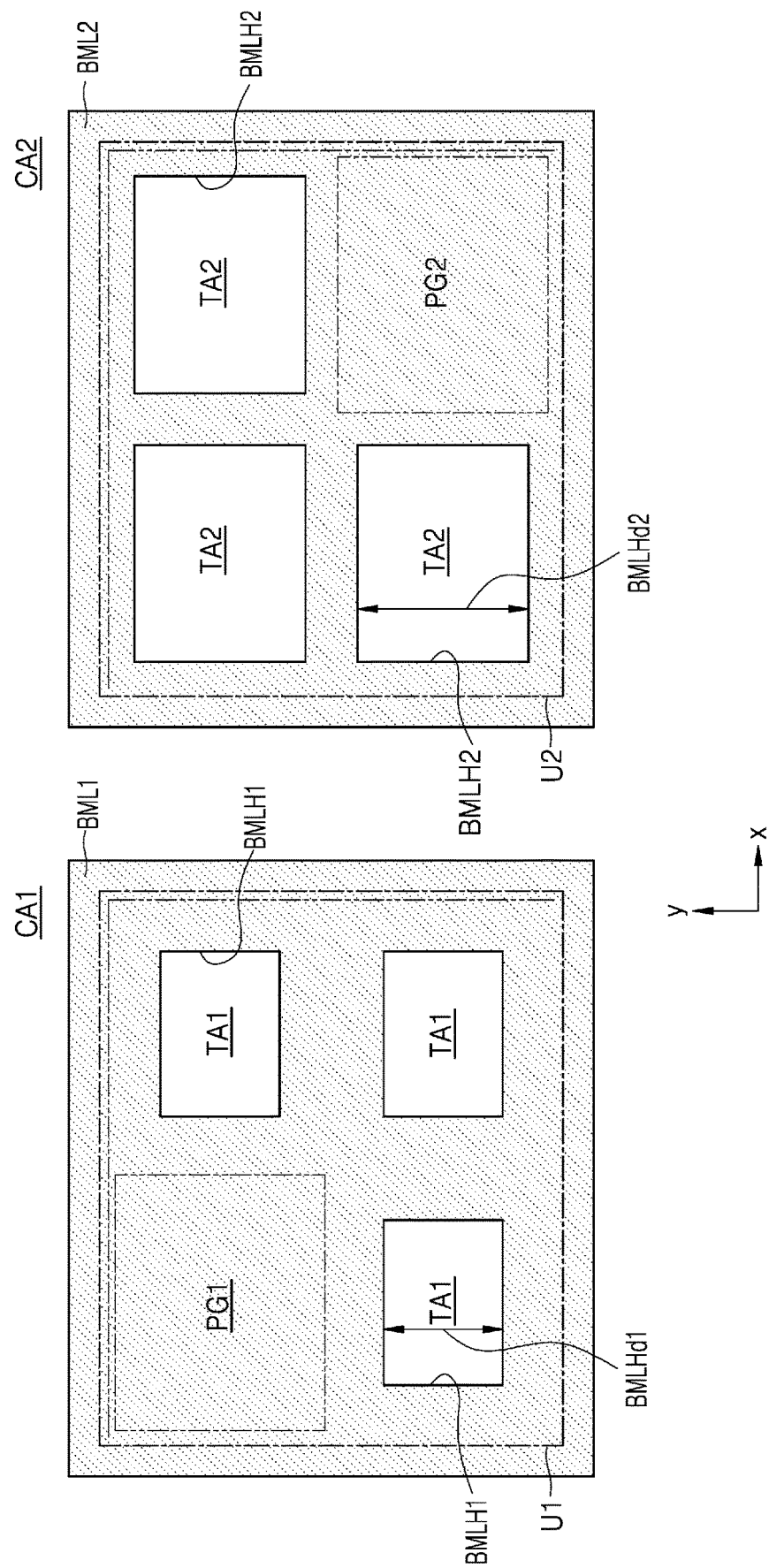
FIG. 39 is a plan view illustrating the shapes of a first lower metal layer and a second lower metal layer, which may be arranged in a first component area and a second component area according to an embodiment.

FIG. 39 is a plan view illustrating the shapes of a first lower metal layer BML1 and a second lower metal layer BML2, which may be arranged in a first component area CA1 and a second component area CA2 according to an embodiment.

Referring to FIG. 39, the first lower metal layer BML1 may be arranged to correspond to the first component area CA1 and may include a first lower hole BMLH1. The first lower hole BMLH1 may define a first transmissive portion TA1. In an embodiment, the first lower metal layer BML1 may include a plurality of first lower holes BMLH1. For example, the first lower metal layer BML1 may include three first lower holes BMLH1. Alternatively, in another embodiment, the first lower metal layer BML1 may include one first lower hole BMLH1 corresponding to first transmissive portions TA1.

The second lower metal layer BML2 may be arranged to correspond to the second component area CA2 and may include a second lower hole BMLH2. The second lower hole BMLH2 may define a second transmissive portion TA2. In an embodiment, the second lower metal layer BML2 may include a plurality of second lower holes BMLH2. For example, the second lower metal layer BML2 may include three second lower holes BMLH2. Alternatively, in another embodiment, the second lower metal layer BML2 may include one second lower hole BMLH2 corresponding to second transmissive portions TA2.

In the illustrated embodiment, a size (e.g., a length or a width) BMLHd1 of the first lower hole BMLH1 may be different from a size (e.g., a length or a width) BMLHd2 of the second lower hole BMLH2. For example, the size (e.g., a length or a width) BMLHd1 of the first lower hole BMLH1 may be less than the size (e.g., a length or a width) BMLHd2 of the second lower hole BMLH2. Therefore, when the first component area CA1 and the second component area CA2 overlap each other, external light may be prevented or substantially prevented from reaching an auxiliary thin-film transistor due to alignment deviation (e.g., alignment deviation between the first lower hole BMLH1 and the second lower hole BMLH2). Alternatively, as another example, the size (e.g., a length or a width) BMLHd1 of the first lower hole BMLH1 may be greater than the size (e.g., a length or a width) BMLHd2 of the second lower hole BMLH2.

Figure 40:
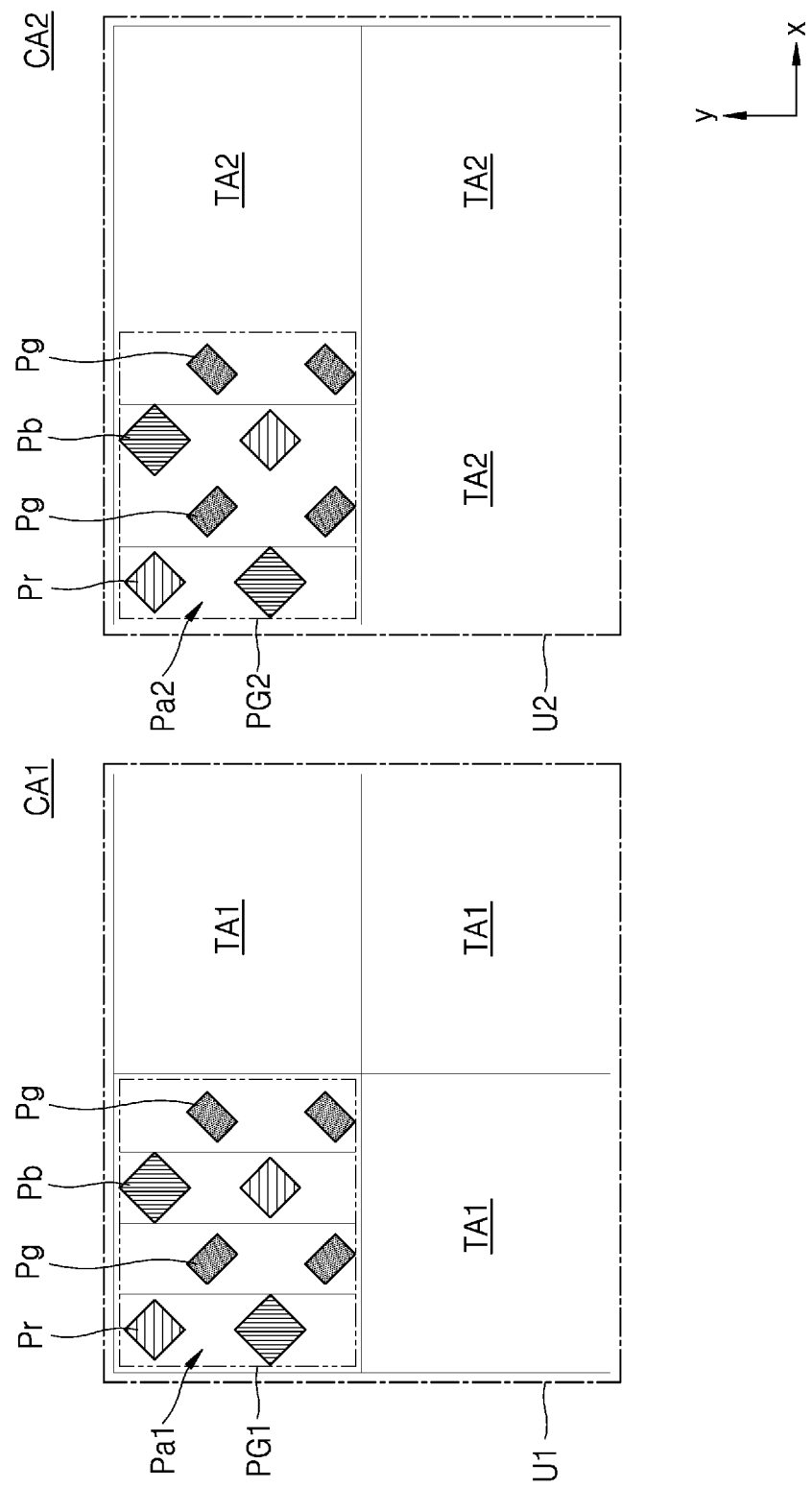
FIG. 40 is a schematic layout diagram illustrating a pixel arrangement structure in a first component area and a second component area according to another embodiment.

FIG. 40 is a schematic layout diagram illustrating a pixel arrangement structure in a first component area CA1 and a second component area CA2 according to another embodiment. In FIG. 40, the same reference numerals as those in FIG. 37 denote the same members, and thus, repeated descriptions thereof may be omitted.

Referring to FIG. 40, a first transmissive portion TA1 and first auxiliary sub-pixels Pa1 may be arranged in the first component area CA1. In the first component area CA1, a first basic unit U1 in which a certain number of first pixel groups PG1 and a certain number of first transmissive portions TA1 are bundled together may be repeatedly arranged in the x direction and the y direction. For example, in the first basic unit U1, a first pixel group PG1 may be arranged on the upper left side and three first transmissive portions TA1 may be arranged around the first pixel group PG1. In some embodiments, the first pixel group PG1 may be arranged in the upper left quadrant of the first basic unit U1 and three first transmissive portions TA1 may be respectively arranged in the lower left quadrant, the upper right quadrant, and the lower right quadrant of the first basic unit U1 as shown in FIG. 40.

A second transmissive portion TA2 and second auxiliary sub-pixels Pa2 may be arranged in the second component area CA2. The second auxiliary sub-pixels Pa2 may define a second pixel group PG2. The second pixel group PG2 may include eight second auxiliary sub-pixels Pa2 arranged in a pentile structure, similar to the first pixel group PG1. In this case, the second pixel group PG2 may be arranged on the upper left side of the second basic unit U2. In some embodiments, the second pixel group PG2 may be arranged in the upper left quadrant of the second basic unit U2 and three second transmissive portions TA2 may be respectively arranged in the lower left quadrant, the upper right quadrant, and the lower right quadrant of the second basic unit U2 as shown in FIG. 40.

Figure 41:
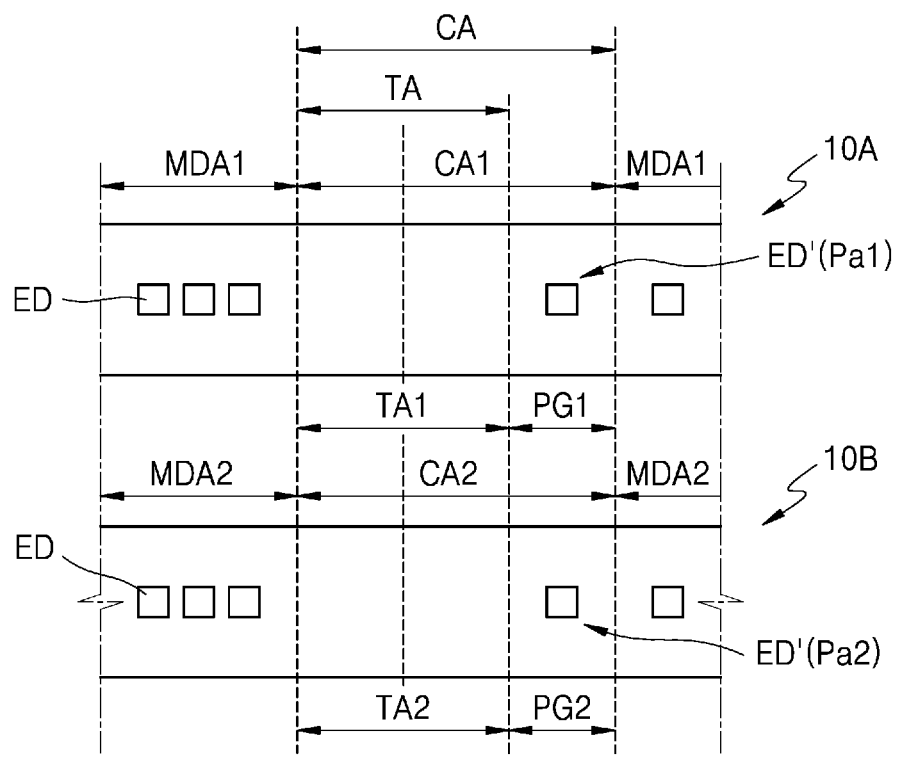
FIG. 41 is a schematic cross-sectional view showing a first state in which a first component area and a second component area overlap each other according to another embodiment.

FIG. 41 is a schematic cross-sectional view showing a first state in which a first component area CA1 and a second component area CA2 overlap each other according to another embodiment.

Referring to FIG. 41, in the first state in which the first component area CA1 and the second component area CA2 overlap each other, a first auxiliary sub-pixel Pa1 and a second auxiliary sub-pixel Pa2 may overlap each other on a plane or in a plan view. Also, a first transmissive portion TA1 and a second transmissive portion TA2 may overlap each other on a plane or in a plan view.

In this case, even though the first component area CA1 and the second component area CA2 overlap each other on a plane or in a plan view, the light transmittance of the component area may be maintained.

Figure 42:
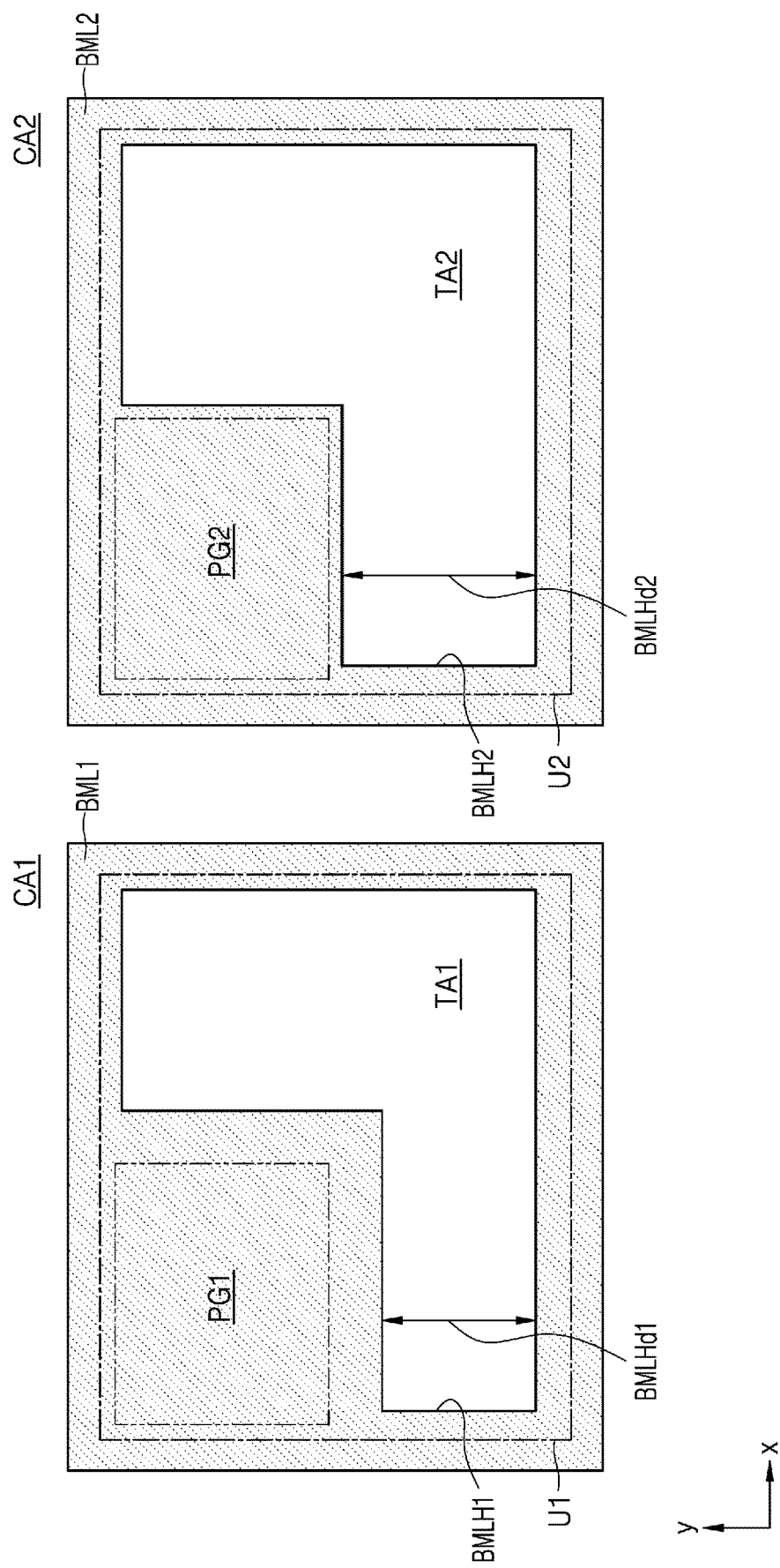
FIG. 42 is a plan view illustrating the shapes of a first lower metal layer and a second lower metal layer, which may be arranged in a first component area and a second component area according to another embodiment.

FIG. 42 is a plan view illustrating the shapes of a first lower metal layer BML1 and a second lower metal layer BML2, which may be arranged in a first component area CA1 and a second component area CA2 according to another embodiment. In FIG. 42, the same reference numerals as those in FIG. 39 denote the same members, and thus, repeated descriptions thereof may be omitted.

Referring to FIG. 42, the first lower metal layer BML1 may be arranged to correspond to the first component area CA1 and may include a first lower hole BMLH1. The second lower metal layer BML2 may be arranged to correspond to the second component area CA2 and may include a second lower hole BMLH2.

In the illustrated embodiment, a size (e.g., a length or a width) BMLHd1 of the first lower hole BMLH1 may be different from a size (e.g., a length or a width) BMLHd2 of the second lower hole BMLH2. For example, the size (e.g., a length or a width) BMLHd1 of the first lower hole BMLH1 may be less than the size (e.g., a length or a width) BMLHd2 of the second lower hole BMLH2. Therefore, when the first component area CA1 and the second component area CA2 overlap each other, external light may be prevented or substantially prevented from reaching an auxiliary thin-film transistor due to alignment deviation (e.g., alignment deviation between the first lower hole BMLH1 and the second lower hole BMLH2). Alternatively, as another example, the size (e.g., a length or a width) BMLHd1 of the first lower hole BMLH1 may be greater than the size (e.g., a length or a width) BMLHd2 of the second lower hole BMLH2. Hereinafter, a case in which the size (e.g., a length or a width) BMLHd1 of the first lower hole BMLH1 is less than the size (e.g., a length or a width) BMLHd2 of the second lower hole BMLH2 may be described in more detail below.

In the illustrated embodiment, in a first state in which the first component area CA1 and the second component area CA2 overlap each other, the shape in which the first and second lower metal layers BML1 and BML2 overlap each other may be the same as the shape of the first lower metal layer BML1. Accordingly, the shape and size of a transmissive portion may be defined by the shape and size of the first lower hole BMLH1.

As described above, according to various embodiments, a foldable display device, a rollable display device, and a display device, each of which has an expanded display area to display an image even in an area where a component, which is an electronic element, is arranged, may be implemented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:
1. A foldable display device comprising:
 a display panel comprising a front surface and a rear surface opposite the front surface, the front surface comprising a first component area comprising a first transmissive portion,
 a second component area comprising a second transmissive portion, and
 a main display area at least partially surrounding the first component area and the second component area,
 wherein, in a state in which the foldable display device is folded about a first folding axis that crosses the main display area such that two areas of the front surface or two areas of the rear surface face each other, the first component area and the second component area overlap each other on a plane.

2. The foldable display device of claim 1, wherein the display panel comprises:
main sub-pixels arranged in the main display area; and
first auxiliary sub-pixels and second auxiliary sub-pixels respectively arranged in the first component area and the second component area.

3. The foldable display device of claim 2, wherein, in the state in which the foldable display device is folded about the first folding axis that crosses the main display area such that two areas of the front surface or two areas of the rear surface face each other, the first auxiliary sub-pixels overlap the second transmissive portion on a plane and the second auxiliary sub-pixels overlap the first transmissive portion on a plane.

4. The foldable display device of claim 2, wherein a main display element implementing one of the main sub-pixels comprises a first pixel electrode,
wherein an auxiliary display element implementing one of the second auxiliary sub-pixels comprises a transparent pixel electrode,
wherein the first pixel electrode is greater in thickness than the transparent pixel electrode, and
wherein the first pixel electrode comprises a reflective layer.

5. The foldable display device of claim 2, further comprising:
a dummy pixel circuit connected to an auxiliary display element to implement one of the second auxiliary sub-pixels, the dummy pixel circuit comprising a dummy thin-film transistor; and
a transparent wiring line connecting the auxiliary display element to the dummy thin-film transistor,
wherein the dummy thin-film transistor is spaced from the second component area.

6. The foldable display device of claim 1, wherein the front surface further comprises a third component area at least partially surrounded by the main display area, the third component area comprising a third transmissive portion, and
wherein, in a state in which the foldable display device is folded about the first folding axis and a second folding axis that crosses the main display area, the first component area, the second component area, and the third component area overlap one another on a plane.

7. The foldable display device of claim 6, wherein the display panel further comprises:
main sub-pixels arranged in the main display area; and
first auxiliary sub-pixels, second auxiliary sub-pixels, and third auxiliary sub-pixels respectively arranged in the first component area, the second component area, and the third component area,
wherein, in the state in which the foldable display device is folded about the first folding axis and the second folding axis, the first auxiliary sub-pixels overlap the second transmissive portion on a plane, the second auxiliary sub-pixels overlap the third transmissive portion on a plane, and the third auxiliary sub-pixels overlap the first transmissive portion on a plane.

8. The foldable display device of claim 6, wherein the display panel comprises:
main sub-pixels arranged in the main display area; and
first auxiliary sub-pixels, second auxiliary sub-pixels, and third auxiliary sub-pixels respectively arranged in the first component area, the second component area, and the third component area, wherein, in the state in which the foldable display device is folded about the first folding axis and the second folding axis, one of the first auxiliary sub-pixels, the second auxiliary sub-pixels, and the third auxiliary sub-pixels overlaps another one of the first auxiliary sub-pixels, the second auxiliary sub-pixels, and the third auxiliary sub-pixels on a plane.

9. The foldable display device of claim 6, wherein the display panel further comprises a lower metal layer,
wherein the lower metal layer comprises:
a first lower hole that defines the first transmissive portion;
a second lower hole that defines the second transmissive portion; and
a third lower hole that defines the third transmissive portion, and
wherein one of the first lower hole, the second lower hole, and the third lower hole is different in size from another one of the first lower hole, the second lower hole, and the third lower hole.

10. The foldable display device of claim 6, wherein the foldable display device is to be folded about one of the first folding axis and the second folding axis such that two areas of the front surface face each other, and
wherein the foldable display device is to be folded about the other one of the first folding axis and the second folding axis such that two areas of the rear surface face each other.

11. The foldable display device of claim 1, wherein the display panel further comprises a substrate and a display layer arranged on a first surface of the substrate, and
wherein the foldable display device further comprises a component arranged on a second surface of the substrate opposite the first surface of the substrate.

12. The foldable display device of claim 11, wherein the substrate comprises a through hole overlapping the first component area.

13. The foldable display device of claim 11, wherein the display panel further comprises a panel protection member arranged on the second surface of the substrate, and
wherein the foldable display device further comprises:
a lower package arranged under the panel protection member,
wherein the component is attached to the lower package.

14. The foldable display device of claim 11, wherein the component is attached to the display panel.

15. A foldable display device comprising:
a display panel comprising a component area comprising a first transmissive portion,
a main display area at least partially surrounding the component area, and
a transparent display area in which a second transmissive portion is arranged, the transparent display area being connected to the main display area,
wherein, in a state in which the foldable display device is folded, the transparent display area overlaps the component area and the main display area on a plane.

16. The foldable display device of claim 15, wherein the display panel further comprises:
first auxiliary sub-pixels arranged in the component area, and
transparent auxiliary sub-pixels arranged in the transparent display area,
wherein the first auxiliary sub-pixels in the component area include a first pixel arrangement structure, wherein the transparent auxiliary sub-pixels in the transparent display area include a second pixel arrangement structure, and wherein the first pixel arrangement structure is different from the second pixel arrangement structure.

17. The foldable display device of claim 16, wherein, in the state in which the foldable display device is folded, the first auxiliary sub-pixels overlap the second transmissive portion on a plane and the transparent auxiliary sub-pixels overlap the first transmissive portion on a plane.

18. A rollable display device comprising:
a display panel comprising a component area comprising a transmissive portion and a main display area at least partially surrounding the component area;
a roller to roll the display panel; and
a component overlapping the component area,
wherein a position where the component overlaps the component area on a plane changes in accordance with unrolling the display panel.

19. The rollable display device of claim 18, further comprising:
a module portion under the display panel, the module portion supporting the display panel,
wherein the component is arranged in the module portion.

20. The rollable display device of claim 19, further comprising:
a housing portion accommodating the roller; and
an interval adjuster between the module portion and the housing portion, the interval adjuster being configured to adjust an interval between the module portion and the housing portion.

21. The rollable display device of claim 18, wherein the component area extends in a first direction in which the display panel is to be unrolled and a second direction perpendicular to the first direction, and
wherein the component area in the first direction is greater in length than the component area in the second direction.

22. A display device comprising:
a first display panel comprising a first component area comprising a first transmissive portion and a first main display area at least partially surrounding the first component area;
a second display panel arranged on a rear surface of the first display panel and being movable relative to the first display panel, the second display panel comprising a second component area comprising a second transmissive portion;
a component overlapping the second component area;
a first state in which the first component area and the second component area overlap each other on a plane; and
a second state in which the first component area and the second component area are spaced from each other on a plane.

23. The display device of claim 22, wherein the first display panel comprises first auxiliary sub-pixels arranged in the first component area, and
wherein the second display panel comprises second auxiliary sub-pixels arranged in the second component area.

24. The display device of claim 23, wherein, in the first state, the first auxiliary sub-pixels overlap the second transmissive portion on a plane and the second auxiliary sub-pixels overlap the first transmissive portion on a plane.

25. The display device of claim 23, wherein, in the first state, the first auxiliary sub-pixels overlap the second auxiliary sub-pixels on a plane.

26. The display device of claim 22, wherein the first display panel comprises a first lower metal layer including a first lower hole defining the first transmissive portion,
wherein the second display panel comprises a second lower metal layer including a second lower hole defining the second transmissive portion, and
wherein the first lower hole is smaller in size than the second lower hole.

* * * * *